(12) United States Patent
Kano et al.

(10) Patent No.: US 6,388,300 B1
(45) Date of Patent: May 14, 2002

(54) SEMICONDUCTOR PHYSICAL QUANTITY SENSOR AND METHOD OF MANUFACTURING THE SAME

(75) Inventors: Kazuhiko Kano, Toyoake; Junji Ohara, Toyota; Nobuyuki Ohya, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/490,372

(22) Filed: Jan. 24, 2000

(30) Foreign Application Priority Data

Jan. 25, 1999 (JP) .......................... 11-015573
Oct. 26, 1999 (JP) .......................... 11-304323

(51) Int. Cl.$^7$ ............................. H01L 29/94
(52) U.S. Cl. ................. 257/419; 257/417; 257/600; 73/514.36
(58) Field of Search ................. 257/419, 417, 257/534, 600, 622; 73/514.36

(56) References Cited

U.S. PATENT DOCUMENTS

| | | | |
|---|---|---|---|
| 4,483,194 A | 11/1984 | Rudolf | |
| 4,507,705 A | 3/1985 | Hoshino et al. | |
| 4,574,327 A | 3/1986 | Wilner | |
| 4,598,585 A | 7/1986 | Boxenhorn | |
| 4,653,326 A | 3/1987 | Danel et al. | |
| 4,679,434 A | 7/1987 | Stewart | |
| 4,711,128 A | 12/1987 | Boura | |
| 4,783,237 A | 11/1988 | Aine et al. | |
| 4,891,984 A | 1/1990 | Fujii et al. | |
| 4,951,510 A | 8/1990 | Holm-Kennedy et al. | |
| 5,006,487 A | 4/1991 | Stokes | |
| 5,008,774 A | 4/1991 | Bullis et al. | |
| 5,115,291 A | 5/1992 | Stokes | |

(List continued on next page.)

FOREIGN PATENT DOCUMENTS

| | | |
|---|---|---|
| GB | 2240178 | 12/1990 |
| JP | 50-19154 | 6/1975 |
| JP | 55-68679 | 5/1980 |
| JP | 58-62425 | 4/1983 |
| JP | 60-244864 | 12/1985 |
| JP | 61-73071 | 4/1986 |
| JP | 61-084537 | 4/1986 |
| JP | 61-220596 | 9/1986 |
| JP | 62-27666 | 2/1987 |
| JP | 62-67880 | 3/1987 |
| JP | 62-174978 | 7/1987 |

(List continued on next page.)

OTHER PUBLICATIONS

Payne, et al., "Surface Micromachined Accelerometer: A Technology Update", Int'l Congress & Exposition, Detroit, MI, 02/25 –Mar. 1, 1991.
Hase et al., Abstract, Manufacture of Semiconductor Acceleration Sensor, JP404076956A, Mar. 1992.

Primary Examiner—Jerome Jackson, Jr.
(74) Attorney, Agent, or Firm—Pillsbury Winthrop LLP

(57) ABSTRACT

A semiconductor physical quantity sensor, in which a beam-structure having a movable electrode and a fixed electrode confronted with the movable electrode are integrally formed in one substrate, having a new electric isolation structure. A semiconductor physical quantity sensor such as an acceleration sensor includes a silicon substrate; a laterally extending hollow formed in the silicon substrate; and a base plate portion defined below the hollow in the silicon substrate. A rectangular frame portion, a beam-structure having a movable electrode, and a fixed electrode is defined by the hollow and trenches. The fixed electrode confronts with the movable electrodes of the beam-structure. Trenches, in which electrical insulating material is buried, are formed between the movable electrode and the rectangular frame portion and between the fixed electrodes and the rectangular frame portion.

18 Claims, 46 Drawing Sheets

U.S. PATENT DOCUMENTS

| | | |
|---|---|---|
| 5,151,763 A | 9/1992 | Marek et al. |
| 5,163,329 A | 11/1992 | Shimaoka et al. |
| 5,198,390 A | 3/1993 | MacDonald et al. |
| 5,241,864 A | 9/1993 | Addie et al. |
| 5,242,533 A | 9/1993 | Trah et al. |
| 5,243,861 A | 9/1993 | Kloeck et al. |
| 5,284,057 A | 2/1994 | Staller et al. |
| 5,296,730 A | 3/1994 | Takano et al. |
| 5,313,836 A | 5/1994 | Fujii et al. |
| 5,314,572 A | 5/1994 | Core et al. |
| 5,335,550 A | 8/1994 | Satou |
| 5,337,606 A | 8/1994 | Bennett et al. |
| 5,345,824 A | 9/1994 | Sherman et al. |
| 5,396,223 A | 3/1995 | Iwabuchi et al. |
| 5,417,111 A | 5/1995 | Sherman et al. |
| 5,487,305 A | 1/1996 | Ristic et al. |
| 5,495,761 A | 3/1996 | Diem et al. |
| 5,511,420 A | 4/1996 | Zhao et al. |
| 5,520,051 A | 5/1996 | Fujii et al. |
| 5,525,549 A | 6/1996 | Fukada et al. |
| 5,528,937 A | 6/1996 | Dufour |
| 5,542,295 A | 8/1996 | Howe et al. |
| 5,546,227 A | 8/1996 | Yasugaki et al. |
| 5,561,248 A | 10/1996 | Negoro |
| 5,563,343 A | 10/1996 | Shaw |
| 5,569,852 A | 10/1996 | Marek et al. |
| 5,576,250 A * | 11/1996 | Diem .................. 257/417 |
| 5,610,335 A | 3/1997 | Shaw et al. |
| 5,616,523 A | 4/1997 | Benz et al. |
| 5,719,073 A | 2/1998 | Shaw et al. |
| 5,798,460 A | 8/1998 | Nakagawa et al. |
| 5,801,313 A | 9/1998 | Horibata et al. |
| 5,824,901 A | 10/1998 | Van Seeters |
| 5,864,064 A | 1/1999 | Kano et al. |
| 5,932,921 A | 8/1999 | Sakai et al. |
| 5,987,989 A | 11/1999 | Yamamoto et al. |
| 6,060,336 A * | 5/2000 | Wan ...................... 257/417 |
| 6,117,701 A * | 9/2000 | Buchan ............ 73/514.36 |
| 6,201,284 B1 * | 3/2001 | Hirata .................. 257/417 |

FOREIGN PATENT DOCUMENTS

| | | |
|---|---|---|
| JP | 62-207917 | 9/1987 |
| JP | 63-308390 | 12/1988 |
| JP | 2-260333 | 10/1990 |
| JP | 2-309259 | 12/1990 |
| JP | 4-43226 | 7/1992 |
| JP | 5-63209 | 3/1993 |
| JP | 5-167083 | 7/1993 |
| JP | 5-226674 | 9/1993 |
| JP | 5-281251 | 10/1993 |
| JP | 6-45618 | 2/1994 |
| JP | 6-88837 | 3/1994 |
| JP | 6-123631 | 5/1994 |
| JP | 6-123632 | 5/1994 |
| JP | 6-163938 | 6/1994 |
| JP | 6-347474 | 12/1994 |
| JP | 6-347475 | 12/1994 |
| JP | 7-140167 | 6/1995 |
| JP | 7-306221 | 11/1995 |
| JP | 8-21722 | 3/1996 |
| JP | 8-236788 | 9/1996 |
| JP | 8-254428 | 10/1996 |
| JP | 8-510837 | 11/1996 |
| JP | 9-92909 | 4/1997 |
| JP | 9-145740 | 6/1997 |
| JP | 9-153627 | 6/1997 |
| JP | 9-211022 | 8/1997 |
| JP | 9-232594 | 9/1997 |
| JP | 10-135484 | 5/1998 |

* cited by examiner

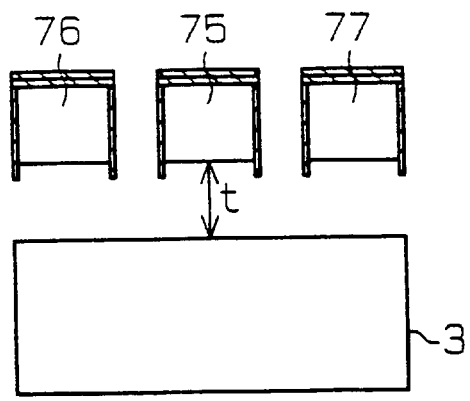
FIG. 18
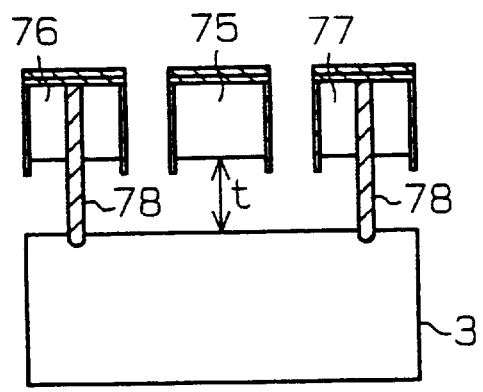
FIG. 19
FIG. 20
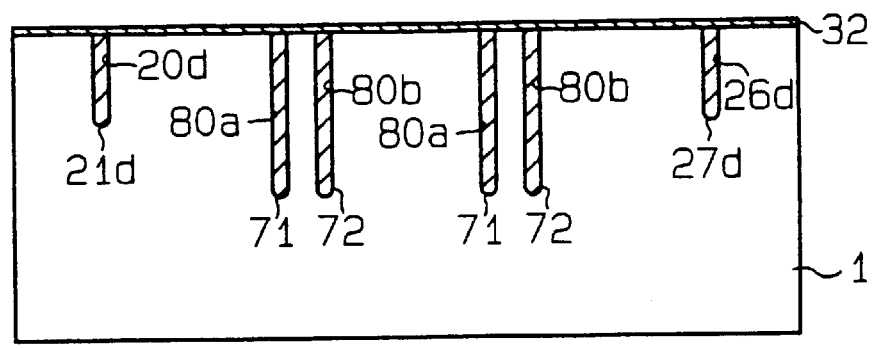

SEMICONDUCTOR PHYSICAL QUANTITY SENSOR AND METHOD OF MANUFACTURING THE SAME

CROSS REFERENCE TO RELATED APPLICATION

This application is based upon Japanese Patent Application Nos. Hei. 11-15573 filed on Jan. 25, 1999, and Hei. 11-304323 filed on Oct. 26, 1999, the contents of which are incorporated herein by reference.

BACKGROUND OF THE INVENTION

1. Field of the Invention:

This invention generally relates to semiconductor physical quantity sensors, and particularly to a semiconductor physical quantity sensor including a beam-structure having a movable electrode for detecting physical quantity such as acceleration, yaw rate, vibration or the like.

2. Related Art:

Conventional semiconductor physical quantity sensor for detecting acceleration, yaw rate, vibration or the like is described in JP-A-9-211022. According to this sensor, abeam-structure having a movable electrode and a fixed electrode confronting with the movable electrode are integrally formed in a semiconductor substrate by processing the semiconductor substrate by using a micro-machine technology. This kind of sensor will be explained in detail hereinafter.

FIG. 83 is a plan view of a semiconductor acceleration sensor. FIGS. 84 to 87 respectively shows sectional views taken along lines 84—84, 85—85, 86—86 and 87—87 in FIG. 83.

In FIGS. 83, 84, a beam-structure 501 ma de of monocrystalline semiconductor material is arranged above an upper surface of a substrate 500. The beam-structure 501 is supported by four anchor portions 502a, 502b, 502c and 502d each of which is protruded from the substrate 500 side, and is arranged with keeping a predetermined distance from the upper surface of the substrate 500. The beam-structure 501 has beam portions 503, 504, a mass portion 505, and comb-shaped movable electrodes 506a to 506d, 507a to 507d. First fixed electrodes 508a to 508d, 509a to 509d, and second fixed electrodes 510a to 510d, 511a to 511d is fixed to the upper surface of the substrate 500. Each of the fixed electrodes 508a to 508d, 509a to 509d, 510a to 510d and 511a to 511d are supported by anchor portions 512 each of which is protruded from the substrate 500 side, and is confronted with each one side of the movable electrodes 506a to 506d, 507a to 507d of the beam-structure 501 arranged with keeping the predetermined distance from the upper surface of the substrate 500. Capacitors are formed between the movable electrodes 506a to 506d, 507a to 507d of the beam-structure 501 and the fixed electrodes 508a to 508d, 509a to 509d.

As shown in FIG. 84, the substrate 500 has a structure in which a polysilicon thin film 514, a lower layer side insulating thin film 515, a conductive film 516, and an upper layer side insulating thin film 517 are laminated on a silicon substrate 513. As shown in FIG. 83, four wire patterns 518 to 521 are formed by the conductive thin film 516. The wire patterns 518 to 521 are wires of the fixed electrodes 508a to 508d, 510a to 510d, 509a to 509d and 511a to 511d.

In this structure, degree of acceleration can be detected by measuring displacements of the beam-structure 501 by way of capacitance changes of the capacitors between the movable electrodes and the fixed electrodes, when acceleration is acted on the beam-structure toward a direction parallel to the surface of the substrate.

The acceleration sensor is manufactured as follows. Here, a method of manufacturing will be explained with reference to FIGS. 88 to 97, which are sectional views taken along line 88—88 in FIG. 83.

At first, as shown in FIG. 88, a monocrystalline silicon substrate 530 is provided, and a pattern of trenches 531 is formed in the silicon substrate 530. After that, impurities such as phosphorus are implanted and diffused into the silicon substrate 530 to form electrodes for detecting electrostatic. capacitance. Next, as shown in FIG. 89, a silicon oxide film 532 as a sacrificial layer thin film is formed on the silicon substrate 530, and a surface of the silicon oxide film 532 is flattened. After that, as shown in FIG. 90, a silicon nitride film 534 to be an etching stopper during a sacrificial layer etching is formed. Furthermore, openings 535a to 535c are formed in a laminated structure of the silicon nitride 534 and the silicon oxide film 532 at where anchor portions are to be formed.

Next, as shown in FIG. 91, a polysilicon thin film 536 is formed on the openings 535a to 535c and the silicon nitride film 534. Impurities such as phosphorus are implanted and diffused to the poly silicon thin film 536 to be a conductive film. A wire pattern 536a, a lower electrodes 536b (see FIG. 87) and anchor portions 536c are formed by using a photolithography. As shown in FIG. 92, a silicon oxide film 537 is formed on the polysilicon thin film 536 and the silicon nitride film 534. As shown FIG. 93, a polysilicon thin film 538 as a bonding thin film is formed on a surface of the silicon oxide film 537, and a surface of the polysilicon thin film 538 is mechanically polished to a flat for the purpose of bonding.

Furthermore, as shown in FIG. 94, another monocrystalline silicon substrate 539, which is different from the silicon substrate 530, is provided, and the surface of the polysilicon thin film 538 and the silicon substrate 539 are bonded each other. As shown in FIG. 95, the silicon substrates 530, 539 are reversed, and the silicon substrate 530 side is mechanically polished to a flat. As show in FIG. 96, an interlayer insulating film 540 is formed, and contact holes are formed by dry etching after the photolithography. Furthermore, a silicon nitride film 541 is formed at a predetermined area on the interlayer insulating film 540, and aluminum electrode 542 is formed by depositing and photolithography.

Finally, as shown in FIG. 97, the silicon oxide film 532 is removed by etching using HF-based etchant to make the beam-structure having the movable electrode movable. In other words, the beam-structure 501 and the fixed electrodes (508a, 508b etc) are formed in the silicon substrate 530 by removing a predetermined area of the silicon oxide film 532 by the sacrificial layer etching using the etchant.

In these ways, the semiconductor acceleration sensor using a laminated substrate can be manufactured.

However, in such kinds of semiconductor physical quantity sensor, a sensor structure may be complicated, because it needs to electrically isolate the movable electrode from each of the fixed electrodes from a viewpoint of the sensor structure, and it needs to connect wires with separated electrodes. Furthermore, it is difficult to lower a cost because there is a bonding step of the substrate (the substrate 530 and the substrate 539) as shown in FIG. 94.

SUMMARY OF THE INVENTION

This invention has been conceived in view of the background thus far described and its first object is to provide a semiconductor physical quantity sensor having a new electric isolation structure and a method of manufacturing the same.

Its second object is to provide a semiconductor physical quantity sensor, in which a beam-structure having a movable electrode and a fixed electrode confronted with the movable electrode are integrally formed in one substrate, having a new electric isolation structure and a method of manufacturing the same.

According to the present invention, a frame portion, a beam-structure and a fixed electrode are divided. Furthermore, at least one insulator is provided at least one of between the frame portion and the movable electrode, and between the frame portion and the fixed electrode. Therefore, it can easily electrically insulate the frame portion from at least one of the movable electrode and the fixed electrode.

According to another aspect of the present invention, a method comprising:

conducting an anisotropic etching from an upper surface of a semiconductor layer constituting a substrate to form a first trench being vertically extended for electrically insulating a movable electrode and a fixed electrode from a frame portion;

burying an insulator into the first trench;

conducting an another anisotropic etching from the upper surface of the semiconductor layer to form a second trench being vertically extended for dividing and forming the frame portion, a beam-structure, and the fixed electrode;

forming a protection film on a sidewall of the second trench except of a bottom surface thereof; and conducting an isotropic etching from the bottom surface of the second trench to form a hollow laterally extended for dividing and forming a base plate portion positioned under the hollow, the frame portion positioned as sides of the hollow and the second trench, the beam-structure, and the fixed electrode.

Therefore, it can easily electrically insulate the frame portion from at least one of the movable electrode and the fixed electrode.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

FIGS. 18 and 19 are sectional views illustrating a support structure of the fixed electrode of the second embodiment;

FIGS. 20 to 24 are sectional views for illustrating each step of a method of manufacturing of the second embodiment;

FIGS. 28 and 29 are sectional views taken along lines 28—28, 29—29 in FIG. 27;

DESCRIPTION OF THE PREFERRED EMBODIMENTS

First Embodiment

A first embodiment of the present invention will be explained hereinafter with reference to the accompanying drawings.

Figure 1:
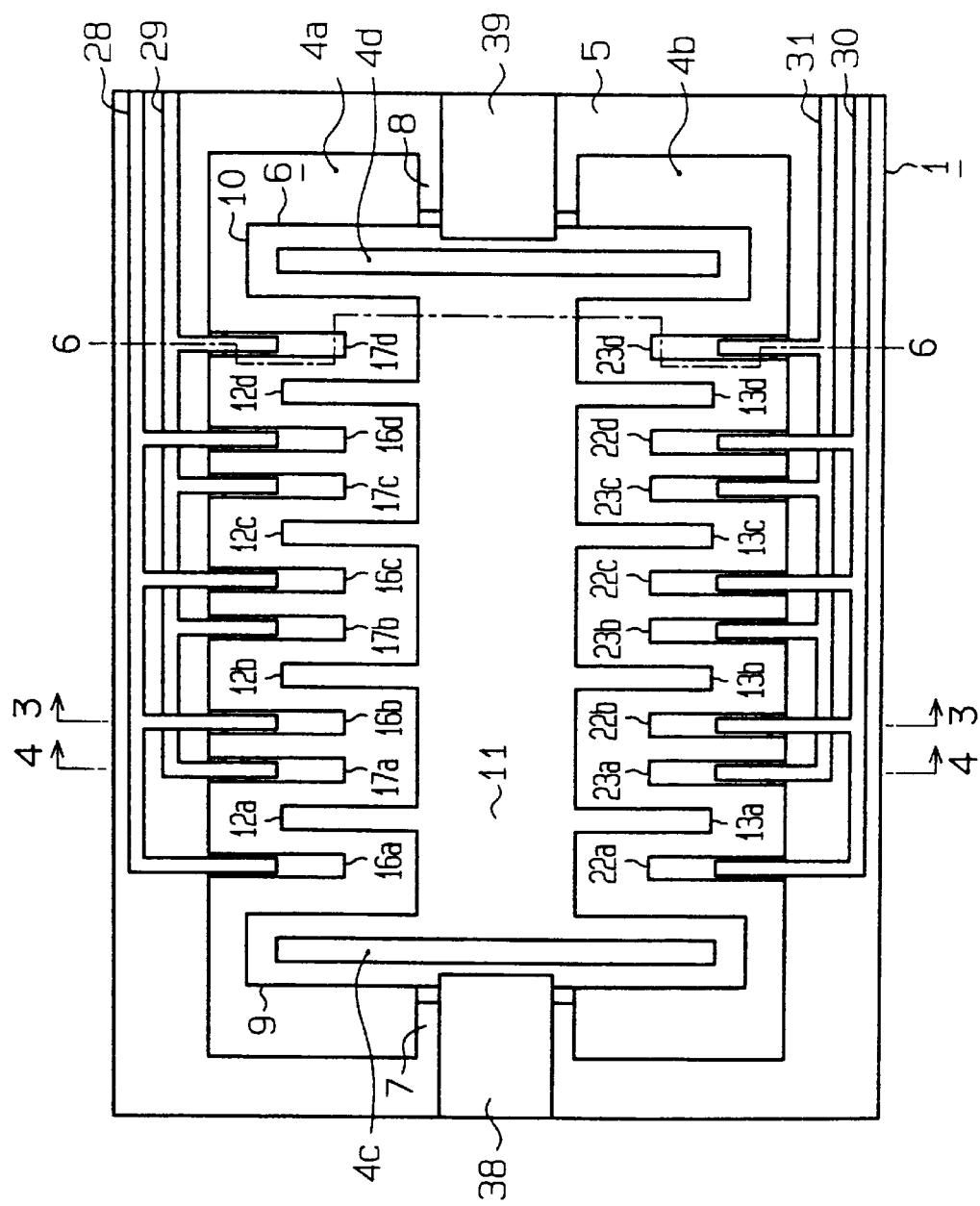
FIG. 1 is a plan view of a semiconductor acceleration sensor of a first embodiment according to the present invention.
Figure 2:
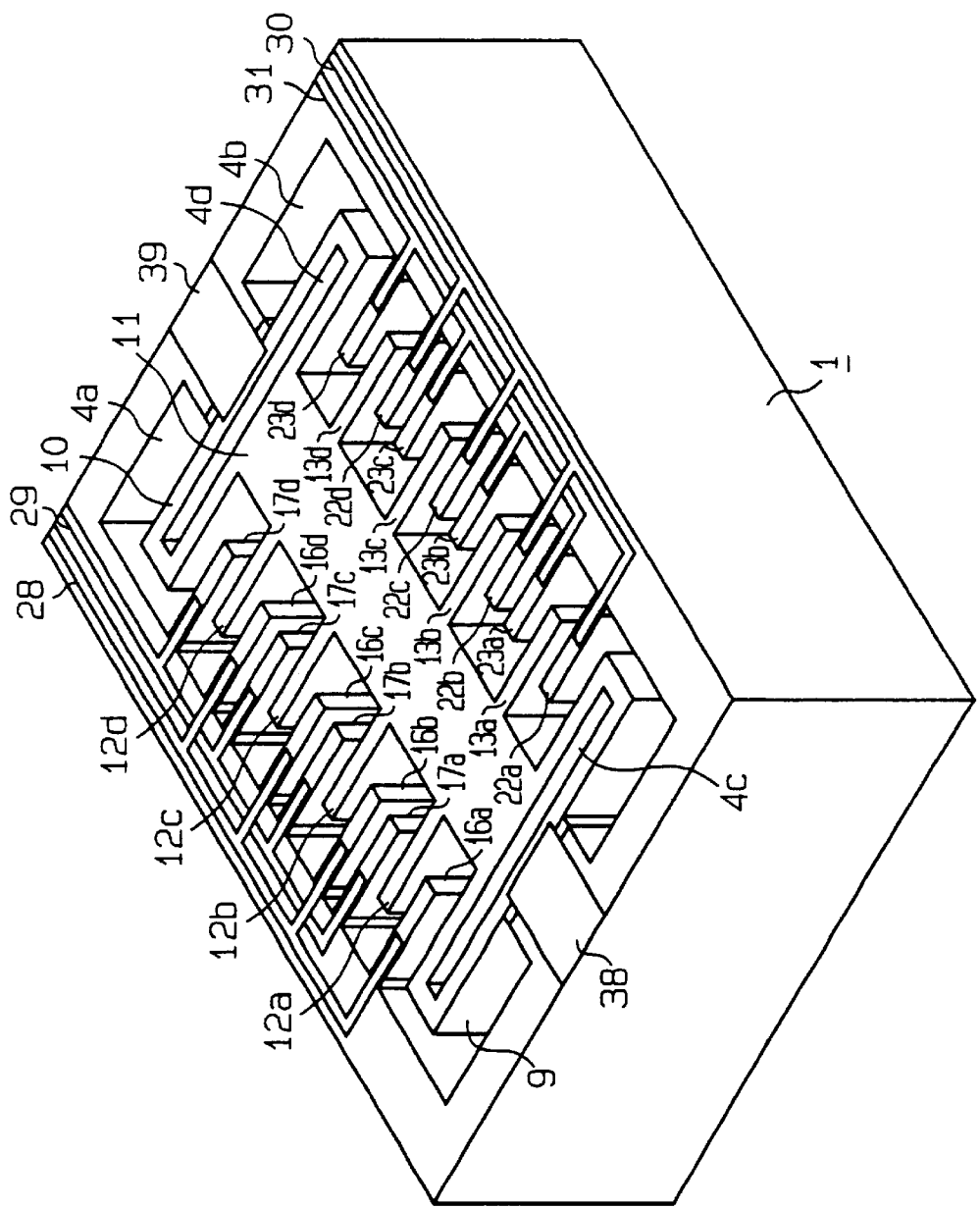
FIG. 2 is a perspective view of the semiconductor acceleration sensor of the first embodiment.

FIGS. 1, 2 show an acceleration sensor of this embodiment. FIG. 1 is a plan view of the acceleration sensor, and FIG. 2 is a perspective view of the acceleration sensor. Furthermore, FIG. 3 shows a sectional view taken along a line 3—3 in FIG. 1, and FIG. 4 shows a sectional view taken along a line 4—4 in FIG. 1.

Figure 5:
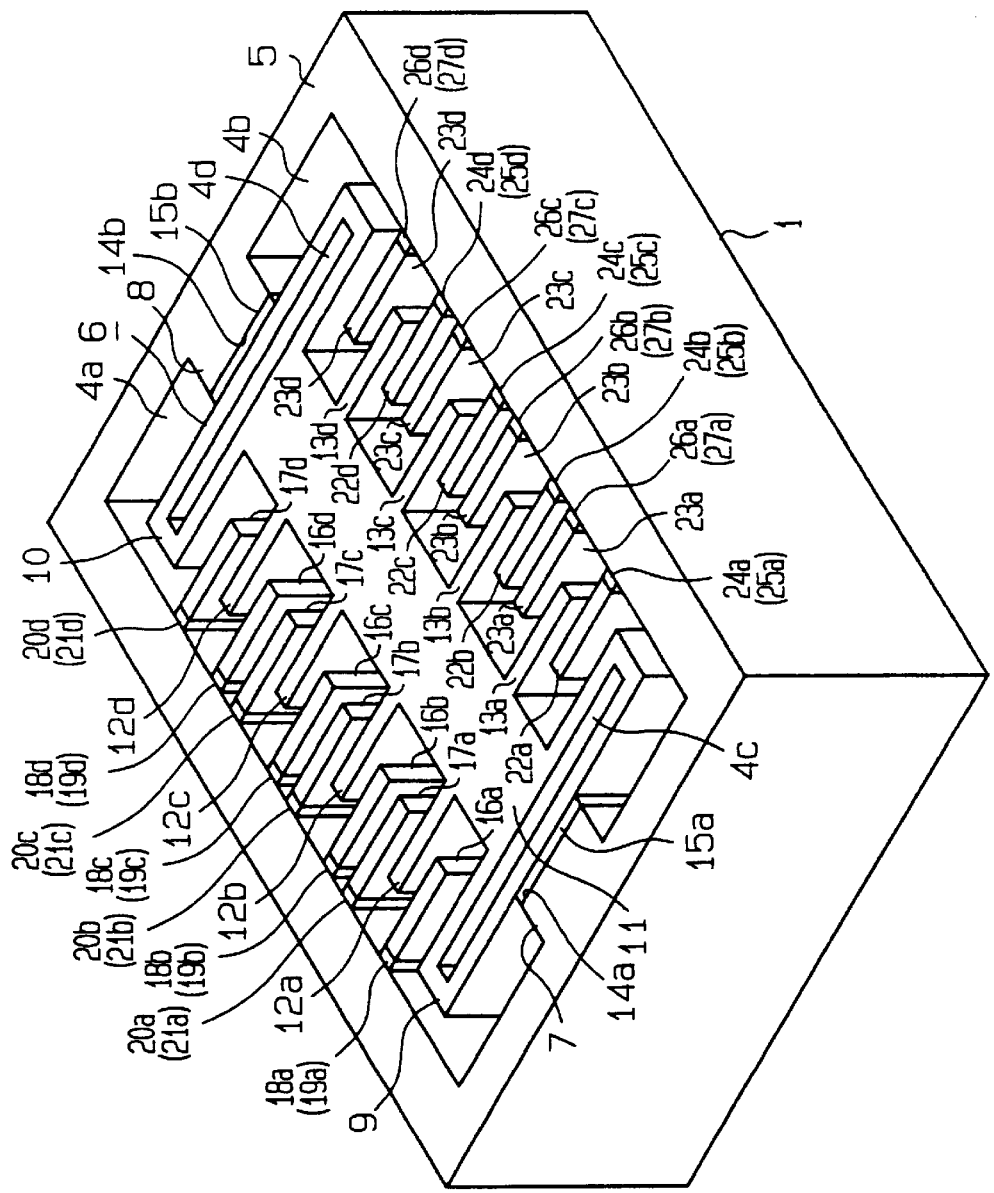
FIG. 5 is a perspective view of the semiconductor acceleration sensor of the first embodiment.

FIG. 5 shows a perspective view of the acceleration sensor in a condition where wires are removed. That is, FIG. 2 is the perspective view of the sensor including the wires, whereas FIG. 5 shows the perspective view without the wires.

Figure 3:
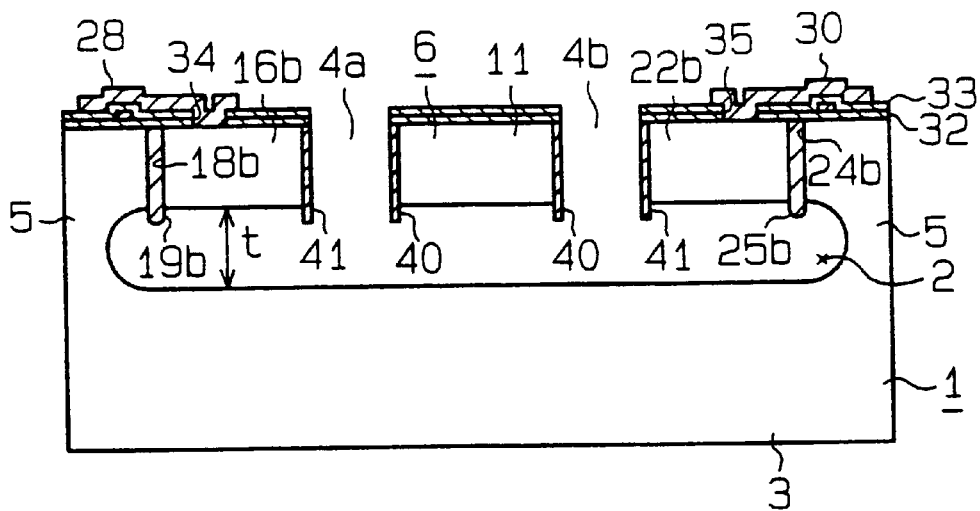
FIG. 3 is a sectional view taken along a line 3—3 in FIG. 1.
Figure 4:
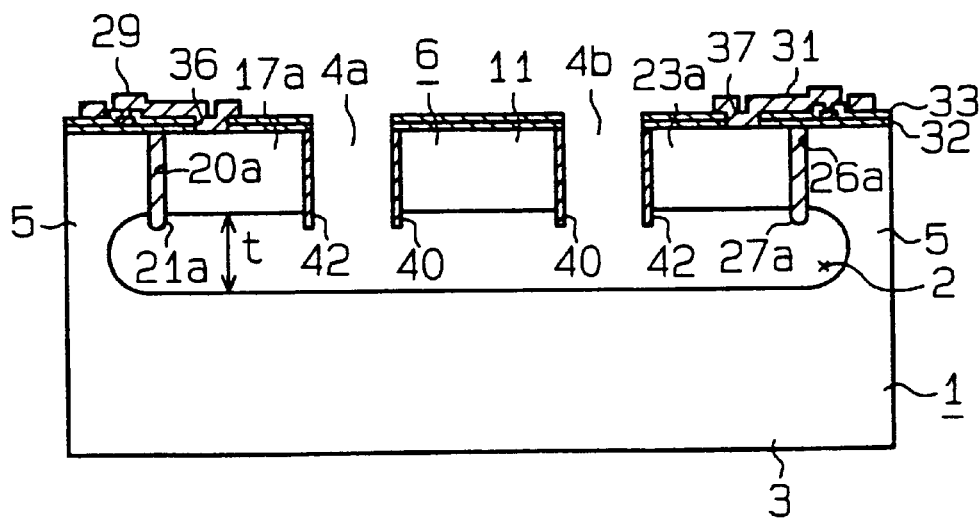
FIG. 4 is a sectional view taken along a line 4—4 in FIG. 1.

In FIG. 3, a hollow 2 is formed inside of a silicon substrate 1 as a single layer semiconductor substrate. The hollow 2 has a predetermined inner diameter t, and is laterally extended (parallel to a surface of the silicon substrate). A lower portion of the substrate 1 below the hollow 2 is defined as a base plate portion 3. That is, the base plate portion 3 is divided by the hollow 2 and the base plate portion 3 is located below the hollow 2. As shown in FIGS. 1, 3, trenches 4a, 4b, 4c and 4d are formed above the hollow 2 in the substrate 1. The trenches 4a, 4b, 4c and 4d are vertically extended (perpendicular to the surface of the silicon substrate) and are reached the hollow 2. As shown in FIG. 5, a rectangular frame portion 5 and a beam-structure 6 are formed by dividing the substrate 1 with the hollow 2 and the trenches 4a to 4d. The rectangular frame portion 5 is positioned at sides of the hollow 2 and the trenches 4a, 4b, and is formed on a surface of the base plate portion 3. The rectangular frame portion 5 is made up of a sidewall of the substrate 1. The beam-structure 6 positions above the hollow 2, and is extended from the rectangular frame portion 5. Here, the beam-structure 6 is arranged with keeping a predetermined distance t from the upper surface of the base plate portion 3. Furthermore, fixed electrodes 16a to 16d, 17a to 17d, 22a to 22d and 23a to 23d are defined by being divided by the hollow 2 and the trenches 4a, 4b. Each of the fixed electrodes is positioned above the hollow 2 and is extended from the rectangular frame portion 5.

In FIG. 5, the beam-structure 6 includes anchor portions 7, 8, beam portions 9, 10, a mass portion 11 and movable electrodes 12a, 12b, 12c, 12d, 13a, 13b, 13c, 13d. The anchor portions 7, 8 are respectively protruded from two inner wall surfaces opposing with each other. The mass portion 11 is connected and supported to the anchor portions 7, 8 via the beam portions 9, 10. In other words, the mass portion 11 is suspended by the anchor portions 7, 8 at inner sides of the rectangular frame portion 5, and is arranged with keeping a predetermined distance t from the upper surface of the base plate portion 3.

Insulating trenches 14a, 14b are formed between the anchor portions 7, 8 and the beam portions 9, 10. Electric insulating materials 15a, 15b made of oxide film or the like are arranged (buried or filled) in the insulating trenches 14a, 14b to electrically insulate between the anchor portions 7, 8 and the beam portions 9, 10.

The four movable electrodes 12a to 12d are protruded from one side surface of the mass portion 11, and the four movable electrodes 13a to 13d are protruded from another side surface of the mass portion 11. The movable electrodes 12a to 12d, 13a to 13d constitute a comb-shape in which each of which extends in parallel with each other with an equal distance. In this way, the beam-structure 6 has the movable electrodes 12a to 12d and 13a to 13d, which displace due to an action of acceleration as physical quantity.

In FIG. 5, first fixed electrodes 16a, 16b, 16c, 16d and second fixed electrodes 17a, 17b, 17c, 17d are respectively fixed on one of two inner wall surfaces opposing each other of the rectangular frame portion 5. The first fixed electrodes 16a to 16d are arranged with keeping a predetermined distance t from the upper surface of the base plate portion 3, and are confronted with one side of the movable electrodes 12a to 12d. Similarly, the second fixed electrodes 17a to 17d are arranged with keeping a predetermined distance t from the upper surface of the base plate portion 3, and are confronted with another side of the movable electrodes 12a to 12d. Here, insulating trenches 18a to 18d (see FIG. 3) are formed between the first fixed electrodes 16a to 16d and the rectangular frame portion 5, and electric insulating materials 19a to 19d such as oxide film (see FIG. 3) are buried (filled) in the insulating trenches 18a to 18d to insulate the first fixed electrodes 16a to 16d from the rectangular frame portion 5. Similarly, insulating trenches 20a to 20d (see FIG. 4) are formed between the second fixed electrodes 17a to 17d and the rectangular frame portion 5, and electric insulating materials 21a to 21d such as oxide film (see FIG. 4) are buried in the insulating trenches 20a to 20d to insulate the second fixed electrodes 17a to 17d from the rectangular frame portion 5.

Similarly, in FIG. 5, first fixed electrodes 22a, 22b, 22c, 22d and second fixed electrodes 23a, 23b, 23c, 23d are respectively fixed on the other of said two inner wall surfaces opposing each other of the rectangular frame portion 5. The first fixed electrodes 22a to 22d are arranged with keeping a predetermined distance t from the upper surface of the base plate portion 3, and are confronted with one side of the movable electrodes 13a to 13d. Similarly, the second fixed electrodes 23a to 23d are arranged with keeping a predetermined distance t from the upper surface of the base plate portion 3, and are confronted with another side of the movable electrodes 13a to 13d. Here, insulating trenches 24a to 24d (see FIG. 3) are formed between the first fixed electrodes 22a to 22d and the rectangular frame portion 5, and electric insulating materials 25a to 25d such as oxide film (see FIG. 3) are buried in the insulating trenches 24a to 24d to insulate the first fixed electrodes 22a to 22d from the rectangular frame portion 5. Similarly, insulating trenches 26a to 26d (see FIG. 4) are formed between the second fixed electrodes 23a to 23d and the rectangular frame portion 5, and electric insulating materials 27a to 27d such as oxide film (see FIG. 4) are buried in the insulating trenches 26a to 26d to insulate the second fixed electrodes 23a to 23d from the rectangular frame portion 5.

In this way, according to this embodiment, the movable electrodes and the fixed electrodes are supported to the rectangular frame portion 5 via the electric insulating materials 15a, 15b, 19a to 19d, 21a to 21d, 25a to 25d and 27a to 27d such as the oxide film buried in the insulating trenches, and are electrically insulated from the base plate 3 side.

As shown in FIG. 2, electrical potential of the first fixed electrodes 16a to 16d is externally taken out through a wire 28, and electrical potential of the second fixed-electrodes 17a to 17d is externally taken out through a wire 29. Similarly, electrical potential of the first fixed electrodes 22a to 22d is externally taken out through a wire 30, and electrical potential of the second fixed electrodes 23a to 23d is externally taken out through a wire 31. In detail, as shown in FIG. 3, the electric potential is externally taken out from the first fixed electrodes 16a to 16d and 22a to 22d via the wires 28, 30 formed on the oxide film 32, 33 through contact portions 34, 35 with being electrically insulated from the rectangular frame portion 5. Furthermore, as shown in FIG. 4, the electric potential is externally taken out from the second fixed electrodes 17a to 17d and 23a to 23d via the wires 29, 31 formed on the oxide film 32, 33 through contact portions 36, 37 with being electrically insulated from the rectangular frame portion 5.

Furthermore, as shown in FIG. 2, the potential of the movable electrodes 12a to 12d, 13a to 13d are externally taken out by the wires 38, 39 (in detail, through the contact portion provided in the beam portions 9, 10) through the mass portion 11 and the beam portions 9, 10.

On the contrary, a protection film is formed on a sidewall of the trench formed in the substrate 1. FIGS. 3, 4 show a condition where the protection film is respectively formed on the sidewalls of the mass portion 11 and the fixed electrodes 16b, 17a, 22b, 23a. That is, as shown in FIGS. 3, 4, a protection film 40 is formed on the sidewall of the mass portion 11, and protection films 41, 42 are formed on the sidewalls of the fixed electrodes 16a to 16d, 17a to 17d, 22a to 22d, 23a to 23d. Furthermore, oxide films 32, 33 are formed on the surface of the substrate 1 (In FIGS. 3, 4: on the surfaces of the rectangular frame portion 5, the mass portion 11, and fixed portions 16a to 16d, 17a to 17d, 22a to 22d, 23a to 23d).

As described the above, according to the semiconductor acceleration sensor of this embodiment, as shown FIGS. 3, 5, the base plate portion 3 is divided by the hollow 2; the rectangular frame portion 5 is divided by the hollow 2 and the trenches 4a, 4b; the beam-structure 6 having the movable electrodes 12a to 12d, 13a to 13d is divided by the hollow 2 and the trenches 4a to 4d; and the fixed electrodes 16a to 16d, 17a to 17d, 22a to 22d, 23a to 23d are divided by the hollow 2 and the trenches 4a, 4b. Furthermore, the trenches 14a, 14b, 18a to 18d, 20a to 20d, 24a to 24d, 26a to 26d are formed between the movable electrodes 12a to 12d, 13a to 13d and the rectangular frame portion 5, and between the fixed electrodes 16a to 16d, 17a to 17d, 22a to 22d, 23a to 23d and the rectangular frame portion 5. The electric insulating materials 15a, 15b, 19a to 19d, 21a to 21d, 25a to 25d, 27a to 27d are buried in the trenches 14a, 14b, 18a to 18d, 20a to 20d, 24a to 24d, 26a to 26d.

Therefore, the base plate portion 3, the rectangular frame portion 5, the beam-structure 6 and the fixed electrodes 16a to 16d, 17a to 17d, 22a to 22d, 23a to 23d are divided by the hollow 2 and the trenches 4a to 4d, which are formed in the silicon substrate 1; and the electrodes are electrically isolated by the electric insulating materials 15a, 15b, 19a to 19d, 21a to 21d, 25a to 25d, 27a to 27d buried in the trenches 14a, 14b, 18a to 18d, 20a to 20d, 24a to 24d, 26a to 26d, which are formed between the movable electrodes 12a to 12d, 13a to 13d and the rectangular frame portion 5, and between the fixed electrodes 16a to 16d, 17a to 17d, 22a to 22d, 23a to 23d and the rectangular frame portion 5.

As described the above, a section structure of the sensor can be simplified because the single layer semiconductor substrate, in detail monocrystalline silicon substrate 1, is used for the semiconductor acceleration sensor, in which the beam-structure having the movable electrodes and the fixed electrodes confronted with the movable electrodes are integrally formed in the one silicon substrate.

Next, operations of the acceleration sensor constructed in this way will be explained with reference to FIG. 5.

A first capacitor is defined between the movable electrodes 12a to 12d and the first fixed electrodes 16a to 16d, and a second capacitor is defined between the movable electrodes 12a to 12d and the second fixed electrodes 17a to 17d. Similarly, a first capacitor is defined between the movable electrodes 13a to 13d and the first fixed electrodes 22a to 22d, and a second capacitor is defined between the movable electrodes 13a to 13d and the second fixed electrodes 23a to 23d.

Here, the movable electrodes 12a to 12d (13a to 13d) position at a center portion between the fixed electrodes 16a to 16d (22a to 22d) and the 17a to 17d (23a to 23d) at both sides. The electrostatic capacitances C1, C2 between the movable electrodes and the fixed electrodes are equal with each other. Furthermore, a voltage V1 is applied between the movable electrode 12a to 12d (13a to 13d) and the fixed electrodes 16a to 16d (22a to 22d); and a voltage V2 is applied between the movable electrode 12a to 12d (13a to 13d) and the fixed electrodes 17a to 17d (23a to 23d).

When no acceleration is acted on, the voltage V1=voltage V2, and the movable electrodes 12a to 12d (13a to 13d) are attracted by the fixed electrodes 16a to 16d (22a to 22d) and by the fixed electrodes 17a to 17d (23a to 23d) with the same electrostatic force each other.

When acceleration is acted toward a direction parallel to the surface of the substrate 1, the movable electrodes 12a to 12d (13a to 13d) are displaced so that distance between the movable electrodes and the fixed electrodes is changed. As a result, the electrostatic capacitance C1 becomes different from the electrostatic capacitance C2.

In this case, when the movable electrodes 12a to 12d (13a to 13d) are displaced toward the fixed electrodes 16a to 16d (22a to 22d) side, the voltages V1, V2 are externally controlled so that the electrostatic capacitances C1, C2 become equal each other. In this case, the voltage V1 is decreased, and voltage V2 is increased. Thus, the movable electrodes 12a to 12d (13a to 13dare attracted toward the fixed electrodes 17a to 17d (23a to 23d) side.

When the electrostatic capacitances C1, C2 become equal each other as a result the movable electrodes 12a to 12d (13a to 13dreturn to the center portion, the acceleration and the electrostatic force are balanced each other. Hence, the degree of the acceleration can be detected from the voltages V1, V2.

In this way, in the first and second capacitor, the voltages of the fixed electrodes forming the first and the second capacitor are controlled so that the movable electrodes are substantially unmoved against displacements due to an action of the acceleration. The acceleration is detected from changes of the voltages. In other words, this semiconductor acceleration sensor is a kind of capacitance change detection type sensor.

Next, a method of manufacturing the acceleration sensor will be explained with reference to FIGS. 6 to 10, which are sectional views taken along the line 4—4 in FIG. 1. It should be noted that because an insulation structure (support structure) of each of the fixed electrodes is the same as that of the beam-structure in this explanation, explanations for the other portions are omitted.

Figure 6:
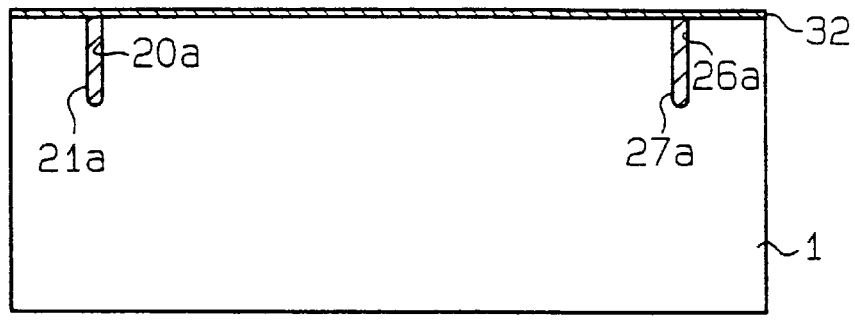
FIGS. 6 to 10 are sectional views taken along a line 6—6 in FIG. 1, for illustrating each step of a method of manufacturing of the first embodiment.

At first, as shown in FIG. 6, a monocrystalline silicon substrate 1 as a single layer semiconductor substrate is provided. An anisotropic etching is conducted from an upper surface of the silicon substrate 1 so that vertically extending first trenches 20a, 26a are patterned and formed. The first trenches 20a, 26a electrically insulate the movable electrodes and the fixed electrodes from the rectangular frame portion. A silicon oxide film is formed on the silicon substrate 1. Insulating materials (oxide films) 21a, 27a are buried in the trenches 20a, 26a. After that, the surface of the substrate is covered with an oxide film 32.

Figure 7:
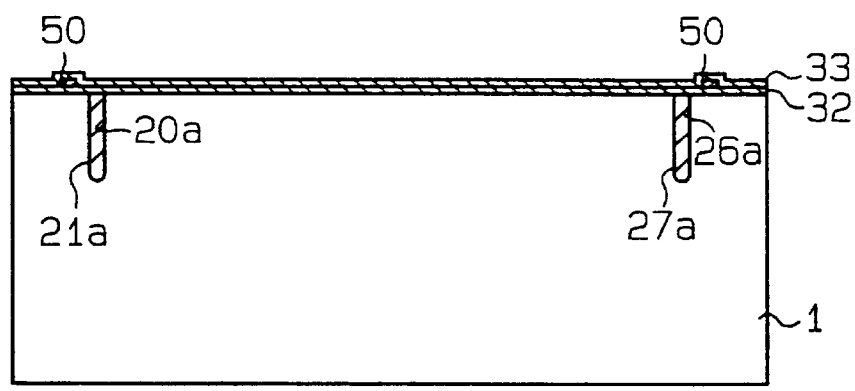

Furthermore, as shown in FIG. 7, a wire material is formed and is patterned to form a wire pattern. Next, an oxide film 33 is formed to cover the wire pattern 50.

Figure 8:
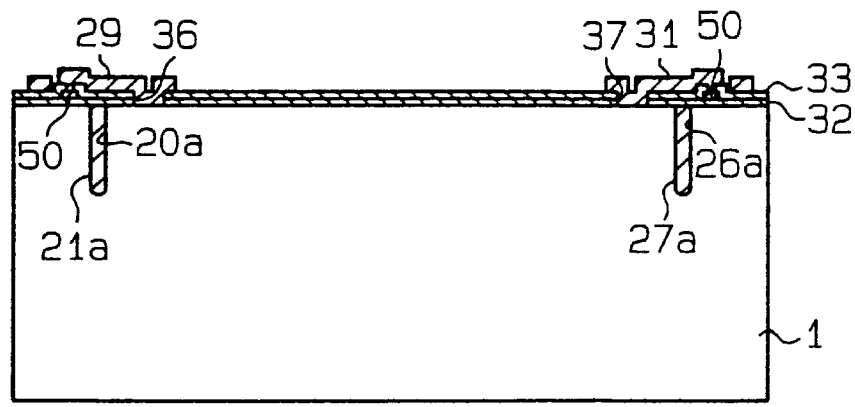

As shown in FIG. 8, contact holes 36, 37 are formed by partly removing the oxide films 32, 33 formed on the substrate 1 and the wire material 50. Furthermore, wire materials 29, 31 are formed and are patterned.

Figure 9:
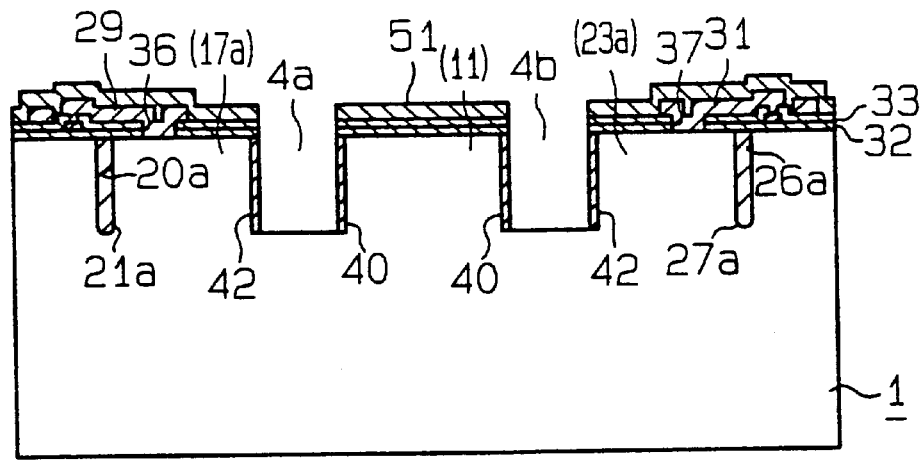

As shown in FIG. 9, a mask 51 for forming a structure is formed on the substrate by using a photolithography. The oxide films 32, 33 are etched through the mask 51. Next, anisotropic etching (trench etching) is conducted from the upper surface of the silicon substrate 1 through the mask 51 so as to form vertically extending trenches (second trenches) 4a, 4b for forming the rectangular frame portion, the beam-structure and the fixed electrodes. In FIG. 9, regions to be the mass portion 11 and the fixed electrodes 17a, 23a are formed. Furthermore, protection films 40, 42 for protecting the sidewall before an isotropic etching are formed on the inner wall surface of the trenches 4a, 4b. After that, parts of protection films, which are attached to bottom surfaces of the trenches, are removed. Thus, the protection films 40, 42 are formed on the sidewalls of the trenches 4a, 4b except of the bottom surfaces of the trenches 4a, 4b.

Here, it needs to select a material of the protection films 40, 42 from one suitable for manufacturing process. In detail, the protection films 40, 42 can be formed by: forming polymer or the like during the trench etching; forming oxide film; depositing oxide film by CVD or the like; forming thin oxide film by $O_2$ plasma or the like; or forming oxide film by chemical. Furthermore, a wire material is appropriately selected based on a method of forming the protection films to be applied and the mask is also appropriately selected. That is, when there is no thermal step, the wire materials 29, 31 may be made of metallic wire such as aluminum or polysilicon or the like; and there is no problem even if a photo-resist is remained regarding the mask for forming the structure. On the contrary, when there is a thermal step, the wire materials 29, 31 may be made of high melting point metal such as tungsten or its alloy, or polysilicon. Regarding the mask for forming the structure, the photo-resist or the like is removed, and the structure is formed by using an oxide film mask.

In this way, the oxide film can be applied as the protection film, particularly a thermal oxide film can be used as the oxide film. Here, when the oxide film is formed by oxygen plasma process, it can form the sidewall protection film easily compared to the thermal oxidation. Furthermore, since there is no thermal process, the protection film can be formed after wiring step including forming aluminum. Here, a film-generated during the etching for forming trenches (sidewall protection film formed during etching) may be used.

Figure 10:
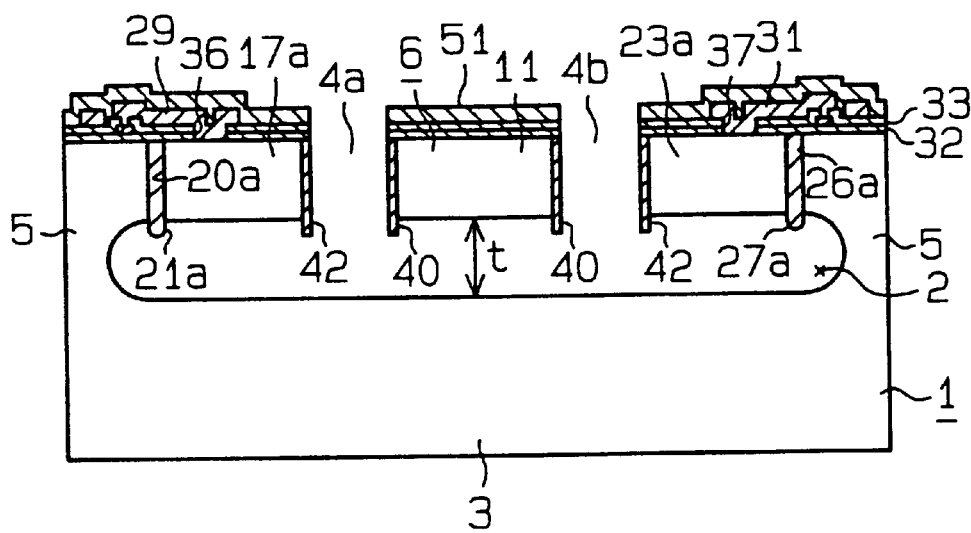

Next, as shown in FIG. 10, an isotropic etching is conducted on the silicon substrate 1 from the bottom surface of the trenches 4a, 4b so that a laterally extending hollow 2 is formed. As a result, the base plate portion 3 positioned below the hollow 2, the rectangular frame portion 5 positioned at side of the hollow 2 and the trenches 4a, 4b, the beam-structure 6 having the movable electrodes movable by the acceleration, and the fixed electrodes 17a, 23a confronted with the movable portions of the beam-structure 6 are divided each other. In FIG. 10, only silicon below the mass portion 11 and the fixed electrodes 17a, 23a is removed by the etching. Particularly, the mass portion 11 is completely separated from the base plate portion 3, and air gap having a predetermined inner diameter t is formed below the beam-structure 6.

Here, in this isotropic etching, it needs to select the material of the sidewall protection films 40, 42 from material that is not etched during the isotropic etching. Furthermore, when a plasma etching process using gas such as $SF_6$ or $CF_4$ is applied in the isotropic etching, throughput of forming the structure after etching can be improved compared to a wet etching step.

Finally, the acceleration sensor shown in FIG. 4 can be completed by removing the etching mask 51.

By applying the above-described steps, the movable structure can be formed by the monocrystalline silicon without applying a bonding step of substrates or without using bonded wafer. Hence, it can form the sensors with low cost and high reliability. In detail, in the acceleration sensor in which the beam-structure having the movable electrodes and the fixed electrodes confronted with the movable electrodes are integrally formed in the one silicon substrate, it can use an single layer semiconductor substrate (monocrystalline silicon substrate) as a start wafer in manufacturing, and it can largely reduce a manufacturing cost of the sensor because it does not need to apply the bonding step of the substrates.

Here, a method of forming the trenches 4a, 4b and the hollow 2 is also disclosed in U.S. Pat. Nos. 5,198,390 and 5,719,073.

However, the method of manufacturing according this embodiment has the following effects compared to the case where the method disclosed in U.S. Pat. Nos. 5,198,390 or 5,719,073 is applied or modified. According to the method disclosed in U.S. Pat. No. 5,198,390, a movable structure and electrodes are formed by a monocrystalline silicon substrate by a so-called SCREAM process including one photolithography step, plural dry etching steps, and a forming film step. In the case where the SCREAM process is applied, the movable structure can be formed, however, it is very difficult to insulate and isolate a movable portion, and a fixed portion and is almost impossible to manufacture a physical quantity sensor such as an acceleration sensor or a yaw rate sensor. On the contrary, according to this embodiment, the physical quantity sensor such as an acceleration sensor or a yaw rate sensor can be manufactured by applying an insulating isolation step, which cannot be realized in the SCREAM process.

Furthermore, the insulating trenches of this embodiment insulate and isolate the fixed electrodes from the rectangular frame portion by using the hollow 2 formed in the lower portion, a depth of each of the insulating trench is enough as long as the insulating trench reaches the hollow 2.

Furthermore, it is preferable to protrude the electric insulating material into the hollow 2, because the insulation is achieved without fail.

Figure 11:
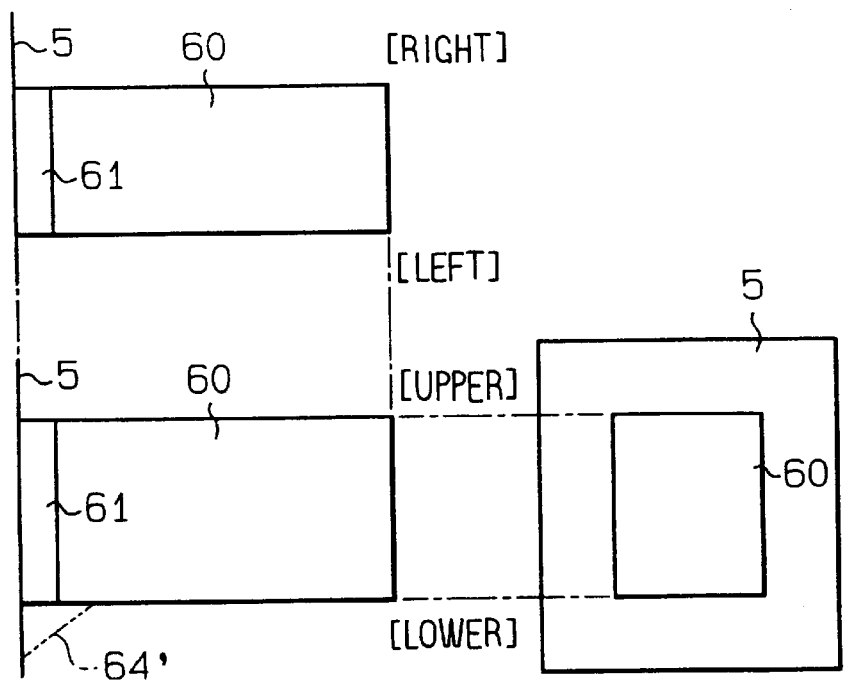
FIG. 11 is a diagram illustrating an isolation structure of electrodes of the first embodiment.
Figure 12:
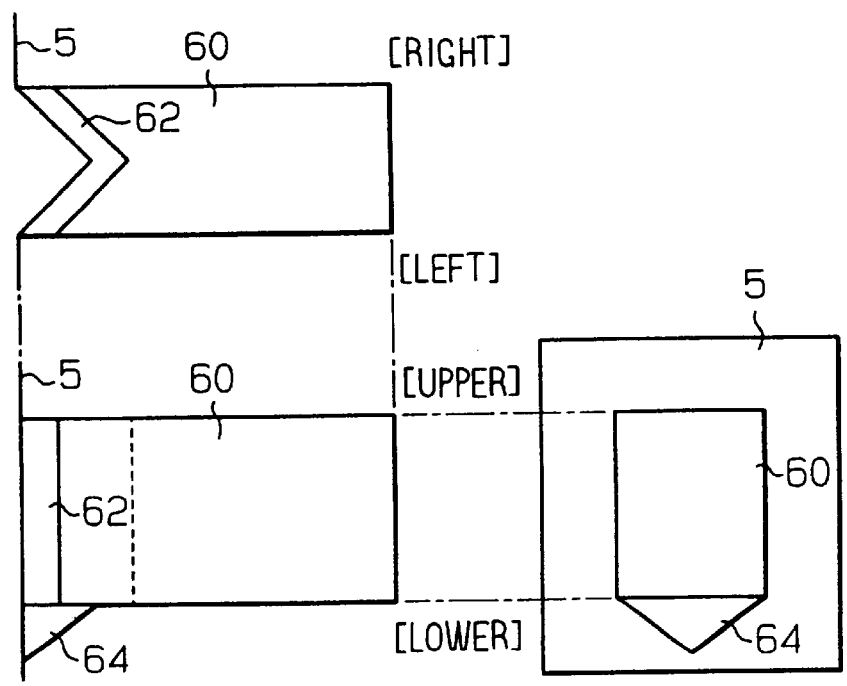
FIGS. 12 and 13 are diagrams illustrating isolation structures of electrodes of a modified first embodiment.
Figure 13:
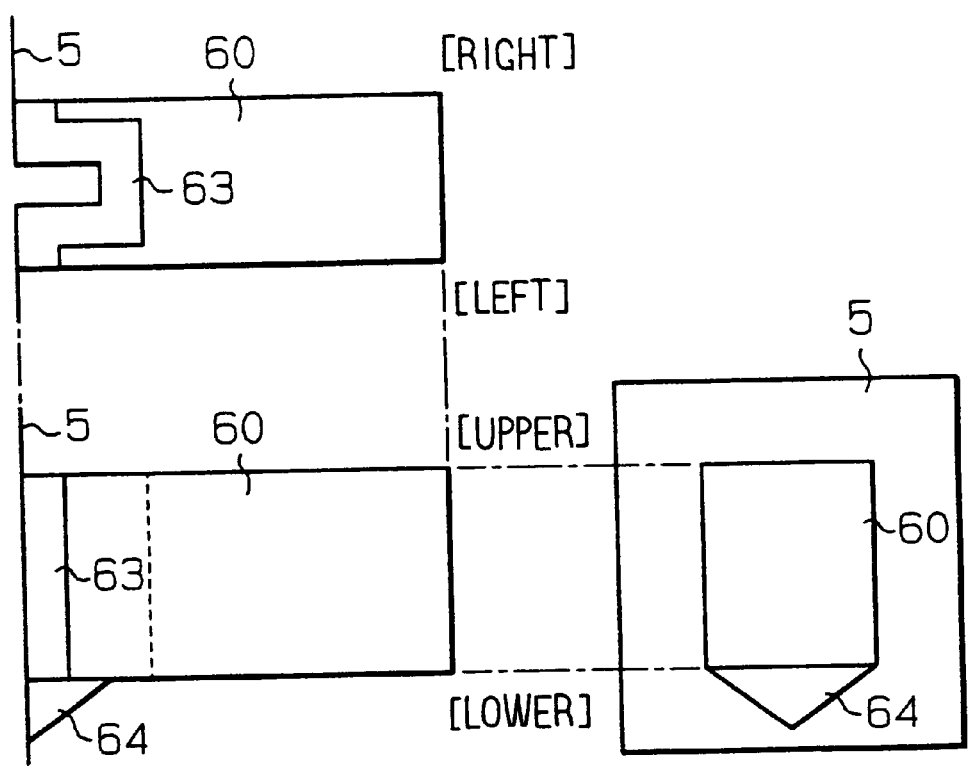

In the above-mentioned explanation, as shown in FIG. 11, the insulating trench 61 (insulating film) provided between the fixed electrode 60 and the rectangular frame portion 5 is formed in parallel with a vertical surface of the rectangular frame portion 5 and is formed linearly, however, the insulating trench may be formed so that a center portion of a portion protruded from the rectangular frame portion 5 is protruded toward a tip portion of the fixed electrode 60 as a plan view of the insulating trench, as shown in FIGS. 12, 13 instead. In detail, as shown in FIG. 12, the insulating trench 62 may be protruded toward the fixed electrode 60 side to have a triangle-shape (tapered-shape), or to have a rectangular-shape.

By protruding the sidewall of the rectangular frame portion 5 toward the fixed electrode 60 side, a portion (low etching speed portion) 64 in which an advance of the isotropic etching is relatively slow is formed at a lower portion of a root portion of the fixed electrode 60. However, there is no problem when the etching is ended before the low etching speed portion 64 is completely removed, because the low etching speed portion 64 is isolated by the insulating trenches 62, 63. Therefore, a time of the isotropic etching for dividing the fixed electrode 60 from the rectangular frame portion 5 can be shortened. In other words, when the etching is ended at timing a remaining portion 64' still exists, as shown in FIG. 11, the fixed electrode 60 may be shorten-circuit with the rectangular frame portion 5. On the contrary, when the structure shown in FIG. 12 or 13 is applied, the fixed electrode 60 may not be shorten-circuit with the rectangular frame portion 5, even if the etching is ended at timing a remaining portion (low etching speed portion) 64 still exists.

As described the above, although the etching speed of the center portion of the lower (root) portion at which protrudes from the rectangular frame portion 5 is relatively slow when the isotropic etching is conducted, the etching can be ended in relatively short period by applying the structure shown in FIG. 12 or 13 (the fixed electrode 60 can be insulated from the rectangular frame portion 5 even if the etching is ended at timing the remaining portion 64 still exists).

Figure 14:
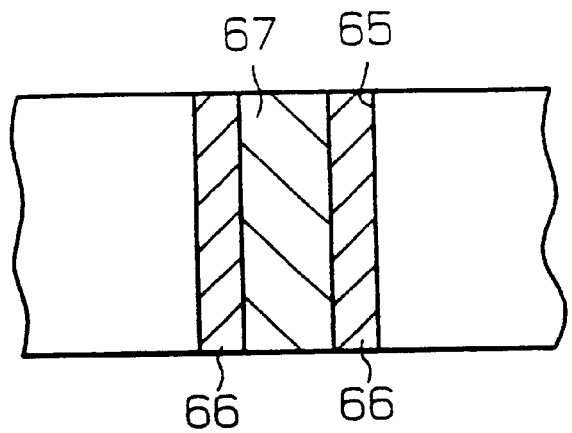
FIGS. 14, 15A and 15B are diagrams illustrating trench structures of the modified first embodiment.
Figure 15A:
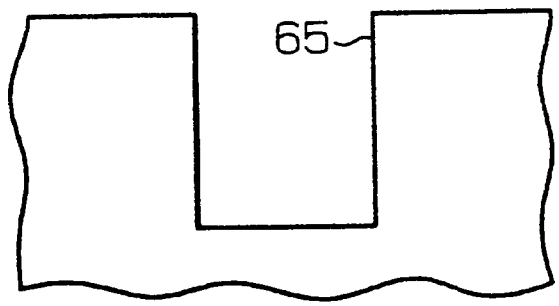
Figure 15B:
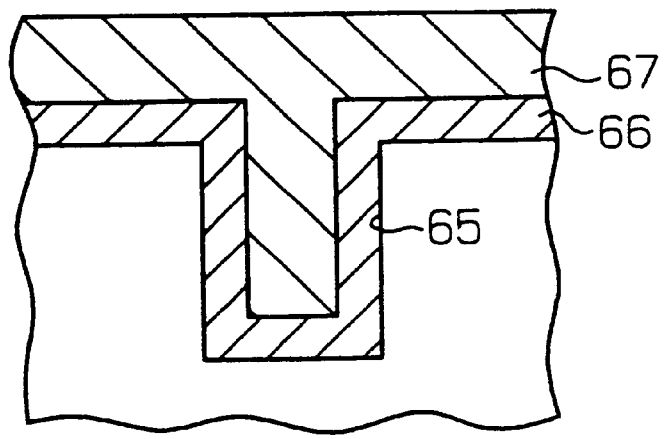

Furthermore, regarding the material to be buried in the trench for performing insulating isolation, the silicon oxide film is buried in the trenches 20a, 26a formed in the silicon substrate 1 in FIG. 6. However, composed multilayer film may be applied as long as the insulating isolation is secured in the substrate 1. That is, the single layer insulating material (silicon oxide film) is described as the material to be buried in the trench, however, a material (e.g., polysilicon) 67 covered by the insulating material (e.g., silicon oxide film) 66, as shown in FIG. 14, may be applied instead. In this case, a stress generated in the trench 65 can be reduced by using polysilicon having low stress compared to the case only oxide film is buried therein. To manufacturing this structure, after forming a trench as shown in FIG. 15A, a silicon oxide film 66 is formed on inner wall surface of the trench 65 and a polysilicon is buried therein as shown in FIG. 15B.

As described the above, the insulating material or the conductive material covered by the insulating material can be used as the material to be buried in the trench. Furthermore, when the a material (e.g., polysilicon) covered by the silicon oxide film is buried, the stress generated in the trench can be reduced compared to the case where only the oxide film is buried (filled in the trench because of the low stress material (polysilicon).

Second Embodiment

Next, a second embodiment of the present invention will be explained. Here, differences between the first embodiment will be mainly described.

Figure 16:
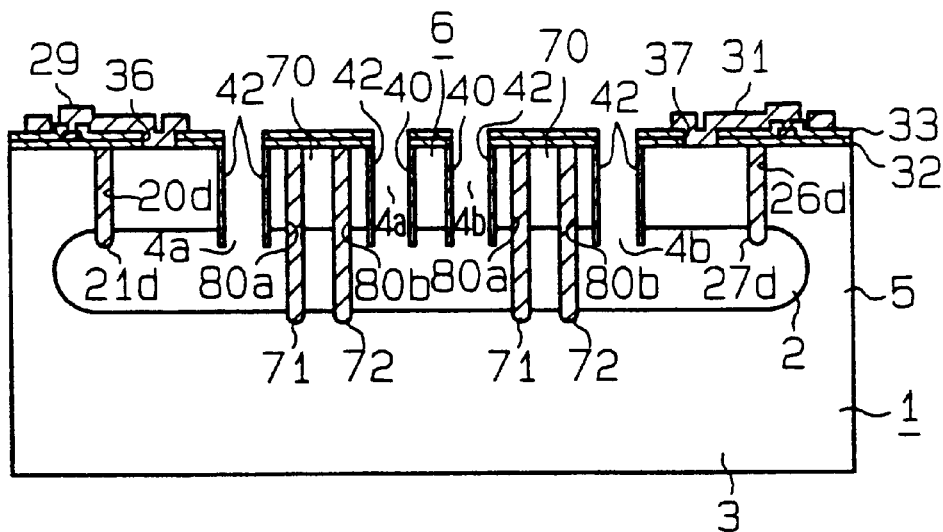
FIG. 16 is a sectional view of a semiconductor acceleration sensor of a second embodiment according to the present invention.

FIG. 16 shows a sectional view of an acceleration sensor of this embodiment. FIG. 16 corresponds to the section taken along the line 6—6 in FIG. 1, and also corresponds to the section of the fixed electrode taken along a line 16—16 in FIG. 17.

This embodiment is different from the first embodiment in a structure for supporting the fixed electrode (and beam-structure) and for performing the insulation.

Props 71, 72 made of electric insulating material (e.g., oxide film) are vertically provided on the base plate portion 3. The props 71, 72 support (prop) at least one of a fixed electrode 70 and the beam-structure 5 with being electrically insulated. In detail, the fixed electrode 70 is divided by the hollow 2 and the trenches 4a, 4b, positioned above the hollow 2, extended from the rectangular frame portion 5, and confronted with the movable portion of the beam-structure 6. Furthermore, the props 71, 72 made of the electric insulating material (e.g., oxide film) are buried in trenches 80a, 80b penetrating the fixed electrode 70, and are extended toward the base plate portion 3.

In detail, as shown in FIG. 18, a movable electrode 75 and fixed electrodes 76, 77 are arranged so that their lower surfaces are kept a predetermined distance t from the base plate portion 3. Here, a voltage difference occurs between the movable electrode 75 and the fixed electrodes 76, 77 due to an operation of the sensor. In this case, electrostatic force is acted between the movable electrode 75 and the fixed electrodes 76, 77 due to the voltage difference, and then the movable electrode 75 is attracted toward the fixed electrodes 76, 77. On the contrary, according to this embodiment, the electrostatic force is not acted on at least the fixed electrodes 76, 77 by applying the structure in which the fixed electrodes 76, 77 are supported by a prop 78 made of insulating material, as shown in FIG. 19, because the fixed electrodes 76, 77 are fixed to the base plate portion 3. Hence, an output of the sensor is stable.

Next, a method of manufacturing this acceleration sensor will be explained with reference to FIGS. 20 to 24.

At first, as shown in FIG. 20, a monocrystalline silicon substrate 1 as a single layer semiconductor substrate is provided. Shallow trenches 20d, 26d and deep trenches 80a, 80b are formed in the silicon substrate 1 by conducting anisotropic etching from an upper surface of the silicon substrate 1. In other words, first trenches 20d, 26d, which are vertically extended, for electrically insulating the movable electrodes and the fixed electrodes from the rectangular frame portion are formed; and second trenches 80a, 80b, which are vertically extended deeply than the first trenches, for supporting at least one of the fixed electrodes and the beam-structure to the base plate portion are formed. A silicon oxide film is formed on the silicon substrate 1, and insulating materials (e.g., oxide film) 21d, 27d, 71, 72 are buried in the trenches 20d, 26d, 80a and 80b. Thus, the props 71, 72 made of the insulating material, are formed. Furthermore, the surface of the substrate is covered with an oxide film 32.

Figure 21:
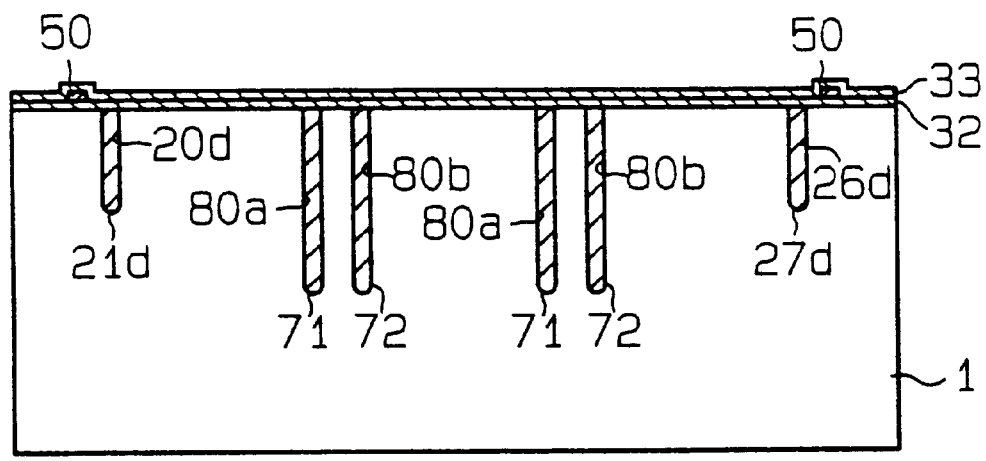

Next, as shown in FIG. 21, a wire material is formed and is patterned to form a wire pattern 50. An oxide film 33 is formed to cover the wire pattern 50.

Figure 22:
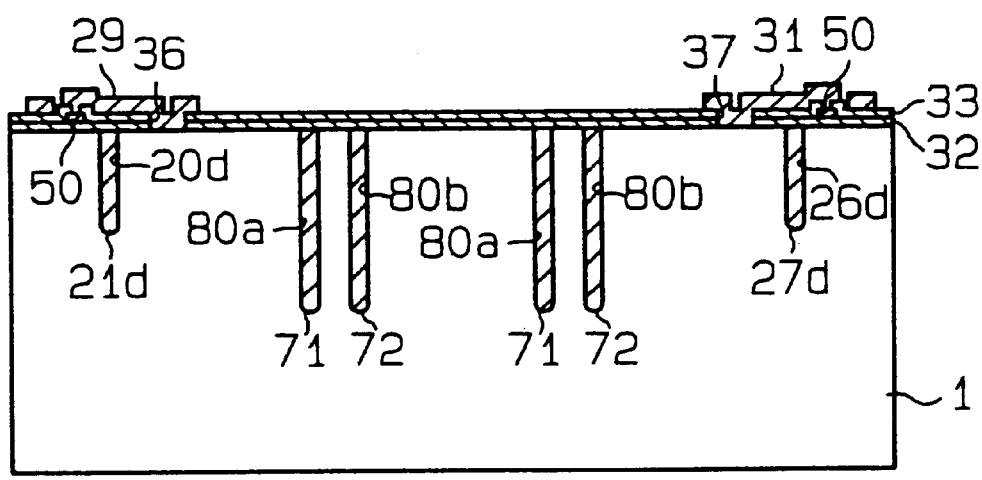

As shown in FIG. 22, contact holes 36, 37 are formed by partly removing the oxide films 32, 33 formed on the substrate 1 and the wire material 50. Furthermore, wire materials 29, 31 are formed and are patterned.

Figure 23:
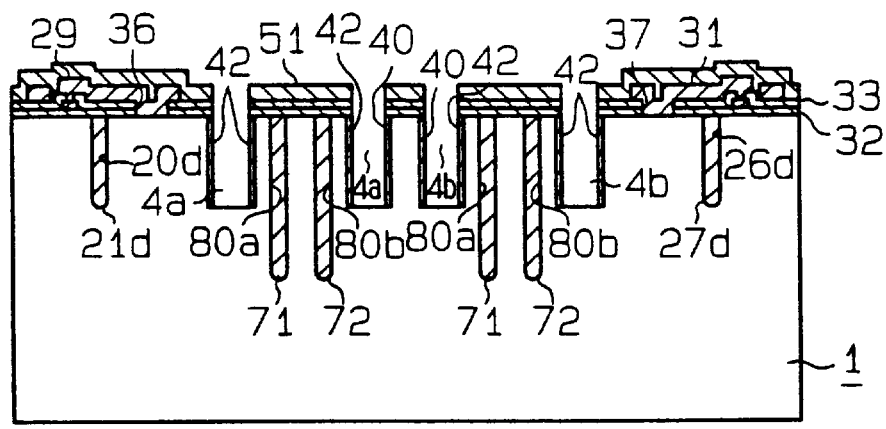

As shown in FIG. 23, a mask 51 for forming a structure is formed on the substrate 1 by using a photolithography. The oxide films 32, 33 are etched through the mask 51. Next, anisotropic etching (trench etching) is conducted from the upper surface of the silicon substrate 1 through the mask 51 so as to form vertically extending third trenches 4a, 4b for forming the rectangular frame portion, the beam-structure and the fixed electrodes. Furthermore, protection films 40, 42 for protecting the sidewall before an isotropic etching are formed on the inner wall surface of the trenches 4a, 4b. After that, parts of protection films, which are attached to bottom surfaces of the trenches, are removed. Thus, the protection films 40, 42 are formed on the sidewalls of the trenches 4a, 4b except for the bottom surfaces of the trenches 4a, 4b.

Here, it needs to select a material of the protection films 40, 42 from one suitable for manufacturing process. In detail, the protection films 40, 42 may be formed by: forming polymer or the like during the trench etching; forming oxide film; depositing oxide film by CVD or the like; forming thin oxide film by $O_2$ plasma or the like; or forming oxide film by chemical. When there is no thermal step, the wire materials 29, 31 may be made of metallic wire such as aluminum or polysilicon or the like. On the contrary, when there is a thermal step, the wire materials 29, 31 may be made of high melting point metal such as tungsten or its alloy, or polysilicon.

Figure 24:
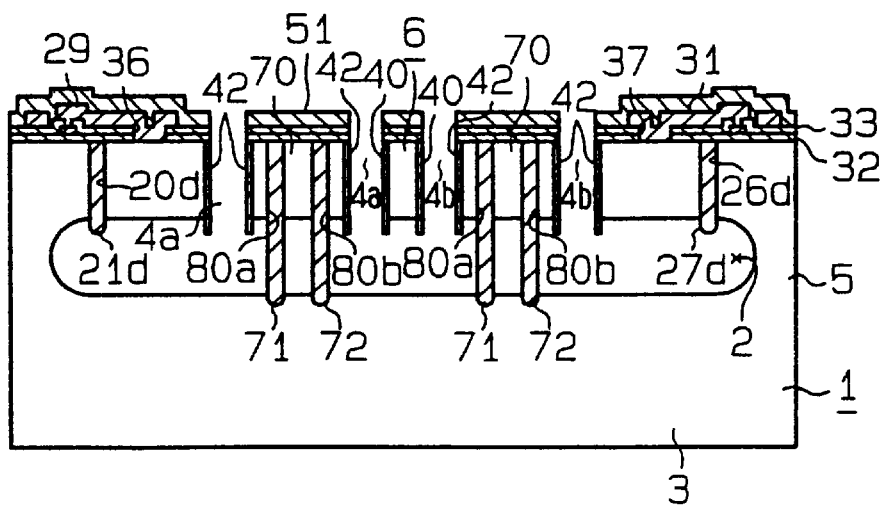

Next, as shown in FIG. 24, isotropic etching is conducted to the silicon substrate 1 from bottom surfaces of the third trenches 4a, 4b so that lower ends of the props 71, 72 made of the insulating material in the second trenches 80a, 80b are not exposed. As a result, the hollow laterally extended, the base plate portion 3 positioned below the hollow 2, the rectangular frame portion 5 positioned at side of the hollow 2 and the third trenches 4a, 4b, the beam-structure 6 having the movable electrodes movable by the acceleration, and the fixed electrodes 70 confronted with the movable portions of the beam-structure 6, are divided each other.

Here, in this isotropic etching, it needs to select the material of the sidewall protection films 40, 42 from material that is not etched during the isotropic etching. Furthermore, when a plasma etching process using gas such as $SF_6$ or $CF_4$ is applied in the isotropic etching, throughput of forming the structure after etching can be improved compared to a wet etching step.

Finally, the acceleration sensor shown in FIG. 16 can be completed by removing the etching mask 51.

As described the above, at least one of the fixed electrodes 70 and the beam-structure 6 is supported by the props 71, 72 made of the electric insulating material vertically provided on the base plate portion 3. Hence, even when section area of the bottom surface of at least one of the fixed electrodes 70 and the beam-structure 6 is small, at least one of the fixed electrodes 70 and the beam-structure 6 can be supported by the props 71, 72 made of the electric insulating material. In other words, when section area of the bottom surface of at least one of the fixed electrodes 70 and the beam-structure 6 is not large, it is difficult to fix at least one of the fixed electrodes 70 and the beam-structure 6 to the base plate portion. However, by applying this structure of this embodiment, at least one of the fixed electrodes 70 and the beam-structure 6 can be arranged in even narrow area, and this member can be completely insulated from the base plate portion 3. Particularly, it is effective when modification needs to be minimum (e.g., acceleration sensor).

Here, in the above-mentioned explanation, the fixed electrodes 70 are supported by the props 71, 72 vertically provided on the base plate portion 3 with electrically insulating has described. However, similar structure may be applied to the anchor portions 7, 8 (see FIG. 1) of the beam-structure 6.

Furthermore, the structures shown in FIGS. 12, 13 (the center portion of the insulating trench as planar structure is protruded toward the tip portion), or the structures shown in FIGS. 14, 15 (the material to be buried in the trenches is made of low stress material covered by insulating material) may be applied to this embodiment.

Modification of Second Embodiment

Next, a modification of the second embodiment in which the present invention is applied to an omnidirectional acceleration sensor (seismoscope).

Figure 17:
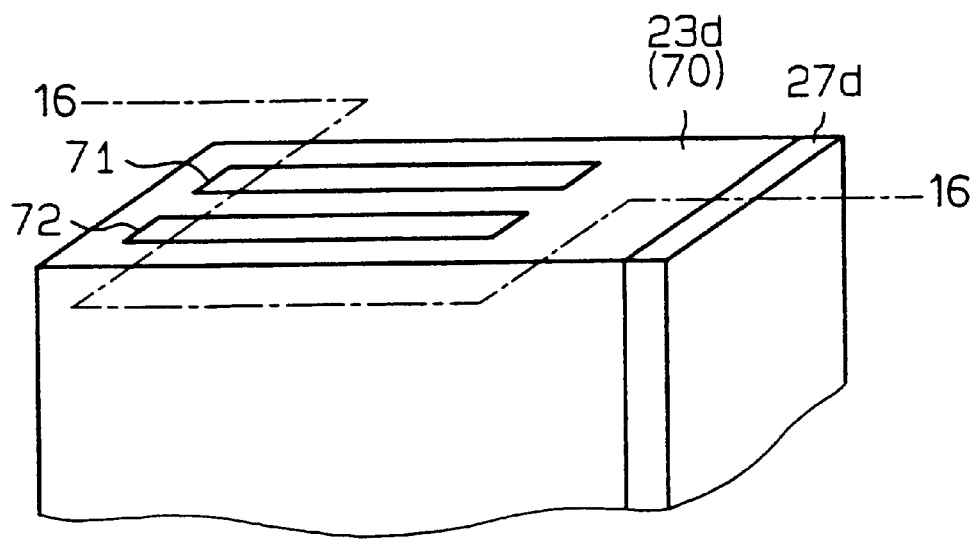
FIG. 17 is a perspective view of a fixed electrode of the semiconductor acceleration sensor of the second embodiment.
Figure 25:
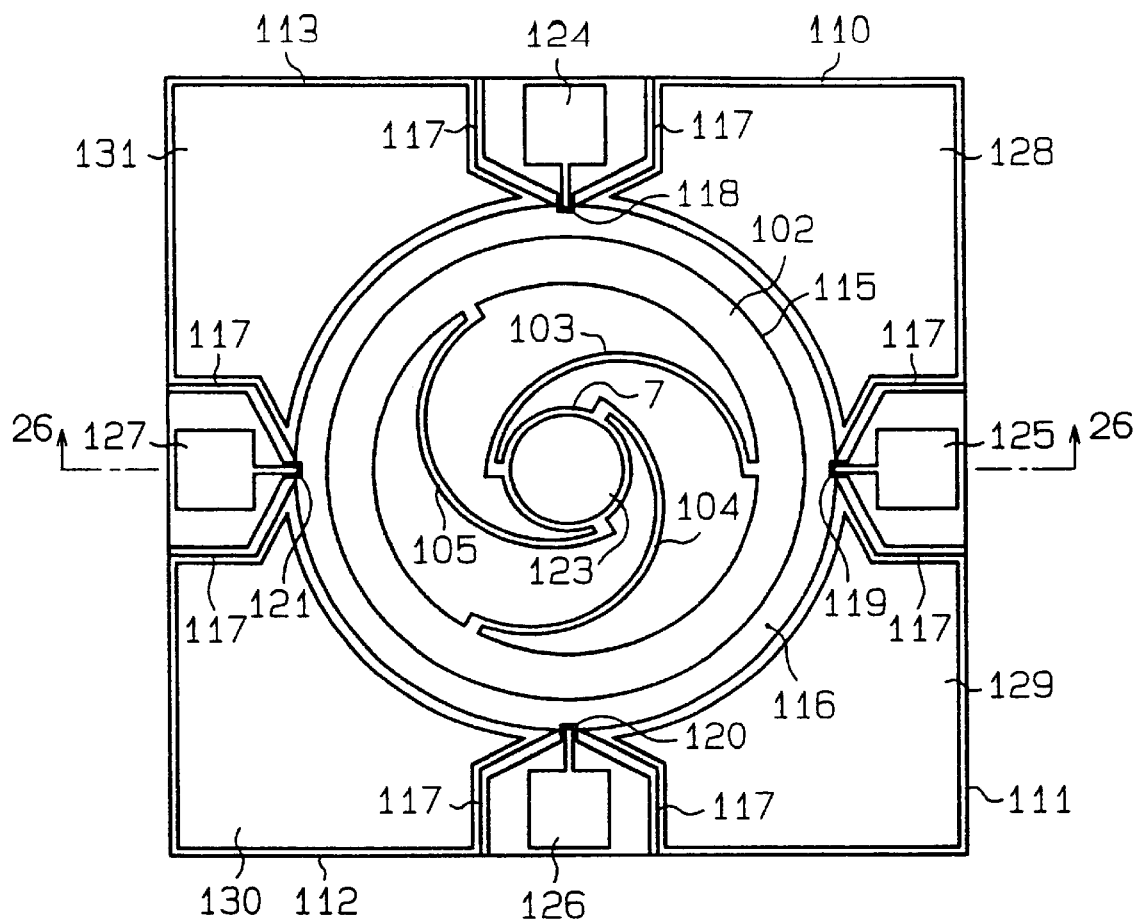
FIG. 25 is a plan view of a switch type acceleration sensor of a modified second embodiment.
Figure 26:
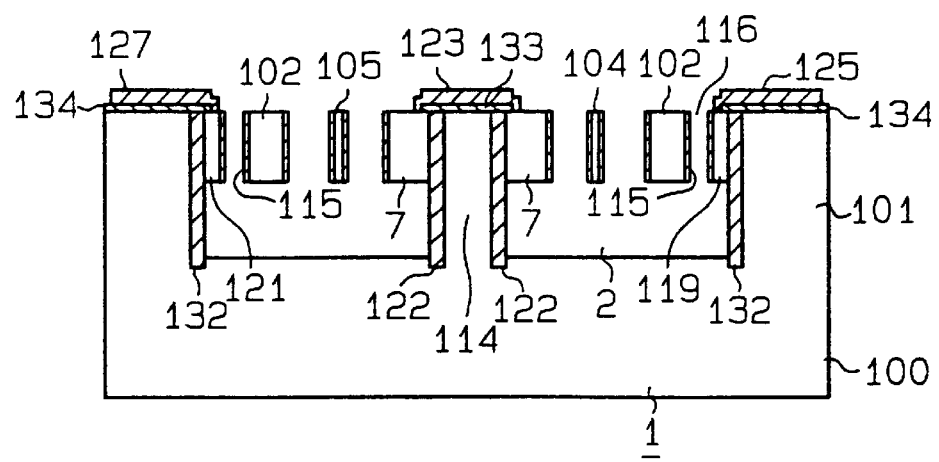
FIG. 26 is a sectional view taken along a line 26—26 in FIG. 25.

FIG. 25 shows a plan view of the omnidirectional acceleration sensor, and FIG. 26 is a sectional view taken along a line 26—26 in FIG. 25. In this modification, the insulating material 27d in FIG. 17 is downwardly extended so that lower portion is buried in the base plate portion 3. That is, a buried material for electrode isolation is used as the prop. This corresponds to members indicated by numerals 122, 132.

The omnidirectional acceleration sensor is a kind of a switch type acceleration sensor, and is provided with a base plate portion 100, a frame portion 101, a frame portion 114, amass movable electrode 102, three beam portions 103, 104, 105, four fixed electrodes 118, 119, 120, 121, and four sensibility adjusting fixed electrodes 110, 111, 112, 113.

The base plate portion 100 is defined at lower portion of the hollow 2 formed in the silicon substrate 1. Beam-structure (anchor portion 7, the three beam portions 103 to 105, and the mass movable electrode 102) is positioned above the hollow 2. The beam-structure is supported by a prop 122 made of insulating material and a frame portion 114. The frame portion 114 is vertically provided at a substantially center portion of the base plate portion 100. A cylindrical prop 122 made of insulating material is provided at peripheral surface of the frame portion 114. A lower end of the prop 122 is buried in the base plate portion 100.

A movable electrode 102 is positioned at surrounding portion of the cylindrical prop 122, and is supported by the anchor portion 7 via the three beam portions 103 to 105. The three beam portions 103 to 105 are elastically deformable substantially parallel to a surface of the base plate portion 100. In detail, each of the beam portions 103 to 105 has a sectional shape whose aspect ratio (longitudinal length against lateral length) is large, and is formed in a circular arc as planar shape so as to be elastically deformable substantially parallel to a surface of the base plate portion 100. The mass movable electrode 102 has a cylindrical shape, and is supported in parallel to the base plate portion 100 with keeping a predetermined distance from the base plate portion 100, and is displaced by acceleration. Furthermore, the mass movable electrode 102 has a conductive detecting surface 115 at a substantial cylindrical sidewall vertically extended (a peripheral cylindrical surface).

The frame portion 101 is divided by a cylindrical trench 116 formed in the substrate 1. A prop 132 made of insulating material is provided at outer surrounding surface of the trench 116. A lower end of the prop 132 is buried in the base plate portion 100. The four sensibility adjusting fixed electrodes 110 to 113 are defined by the frame portion 101. The mass movable electrode 102 is positioned at inner side of the sensibility adjusting fixed electrodes 110 to 113 with keeping a predetermined distance. Furthermore, the fixed electrodes (protrusions) 118 to 121 are positioned above the hollow 2, and are protruded from the frame portion 101 (prop 132), that is, a cylindrical inner surface confronted with the detecting surface 115 of the mass movable electrode 102. The fixed electrodes 118 to 121 are positioned between the sensibility adjusting fixed electrodes 110 to 113. Furthermore, each of the sensibility adjusting fixed electrodes 110 to 113 is separated each other by a film 117 (or gap).

Potential of the mass movable electrode 102 is taken out to an electrode 123 through the beam portions 103 to 105 and the anchor portion 7; potentials of the fixed electrodes 118 to 121 are taken out to electrodes 124, 125, 126, 127; and potentials of the sensibility adjusting fixed electrodes 110 to 113 are taken out to electrodes 128, 129, 130, 131.

In detail, in FIG. 26, the fixed electrodes 118 to 121 are electrically isolated from the frame portion 101 by the prop 132 made of insulating material. An insulating film 133 is formed on an upper surface of a silicon portion (frame portion) 114 in the prop 122, and the electrode 123 is electrically isolated from the silicon portion 114 so that only the potential of the movable electrode 102 is taken out from the electrode 123. Similarly, an insulating film 134 is formed on upper surfaces of the fixed electrodes 118 to 121 so that the potentials of the fixed electrodes 118 to 121 are taken out through the electrodes 124 to 127.

Furthermore, a not-shown detection circuit detects that the detecting surface 115 of the mass movable electrode 102 contacts with the fixed electrodes (protrusions) 118 to 121 as a result of displacement of the mass movable electrode 102 by external acceleration.

Here, surfaces of the three beam portions 103 to 105, the mass movable electrode 102, the fixed electrodes 118 to 121 and the sensibility adjusting fixed electrodes 110 to 113 may be modified as follows. That is, impurities may be introduced to these surfaces by ion implantation, phosphorus deposition or the like, or another film made of conductive material may be formed on the surfaces by deposition, plating or the like, to reduce resistivity of this structure.

Next, operation of the omnidirectional acceleration sensor will be explained.

When no acceleration is acted on the sensor, the mass movable electrode 102 is still with keeping a predetermined distance from the fixed electrodes 118 to 121. A predetermined voltage $V_0$ is applied between the fixed electrodes 118 to 121 and the movable electrode 102; and a predetermined voltage $V_R$ is applied between the fixed electrodes 110 to 113 and the movable electrode 102.

Here, when acceleration is acted in a two axial rectangular coordinate system (X-Y coordinates) defined in the surface of the substrate 1, the detecting surface 115 of the mass movable electrode contact with one of the fixed electrodes (protrusions) 118 to 121 as a result of displacement of the mass movable electrode 102. The acceleration (vibration) is detected by detecting this contacting.

In detail, for example, when the mass movable electrode 102 is displaced toward X-direction in a flat plane parallel to the surface of the substrate 1 as a result of action of the acceleration to the sensor, a distance between the mass movable electrode 102 and the fixed electrode 119 reduces. When the acceleration is larger than a certain degree, the detecting surface 115 contacts with the fixed electrode 119 on the X-axis. Here, since voltage difference is set between the mass movable electrode 102 and the fixed electrode 119, electric current flows therethrough. The detection circuit can detect the contacting by detecting the current flow. Similarly, when the mass movable electrode 102 is displaced toward Y-direction in the flat plane parallel to the surface of the substrate 1 as a result of action of the acceleration to the sensor, a distance between the mass movable electrode 102 and the fixed electrode 118 reduces. When the acceleration is larger than a certain degree, the detecting surface 115 contacts with the fixed electrode 118 on the Y-axis. Here, since voltage difference is set between the mass movable electrode 102 and the fixed electrode 118, electric current flows therethrough. The detection circuit can detect the contacting by detecting the current flow.

Third Embodiment

Next, a third embodiment will be explained. Hereinafter, differences between the first embodiment will be mainly explained.

Figure 27:
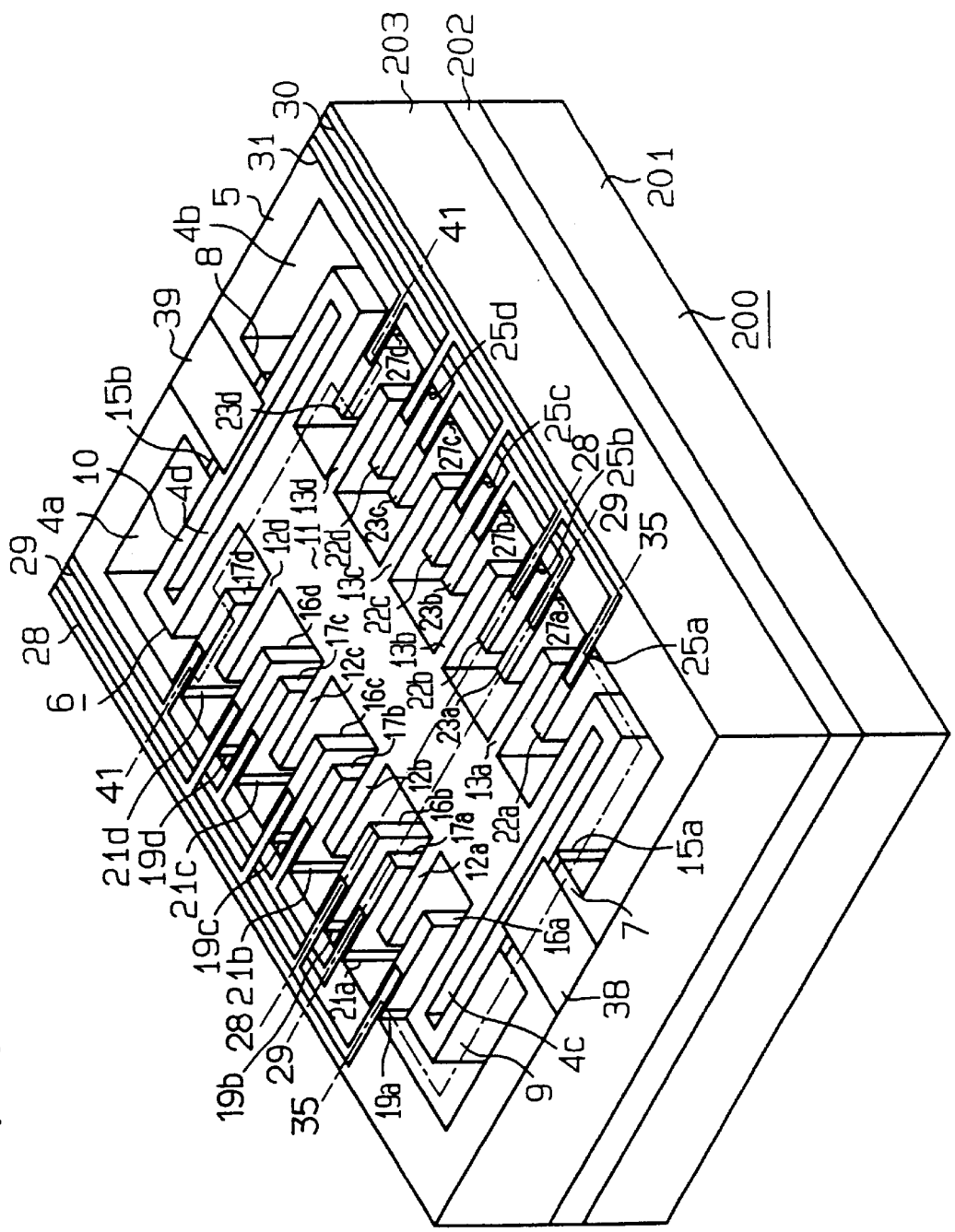
FIG. 27 is a perspective view of a semiconductor acceleration sensor of a third embodiment according to the present invention.
Figure 28:
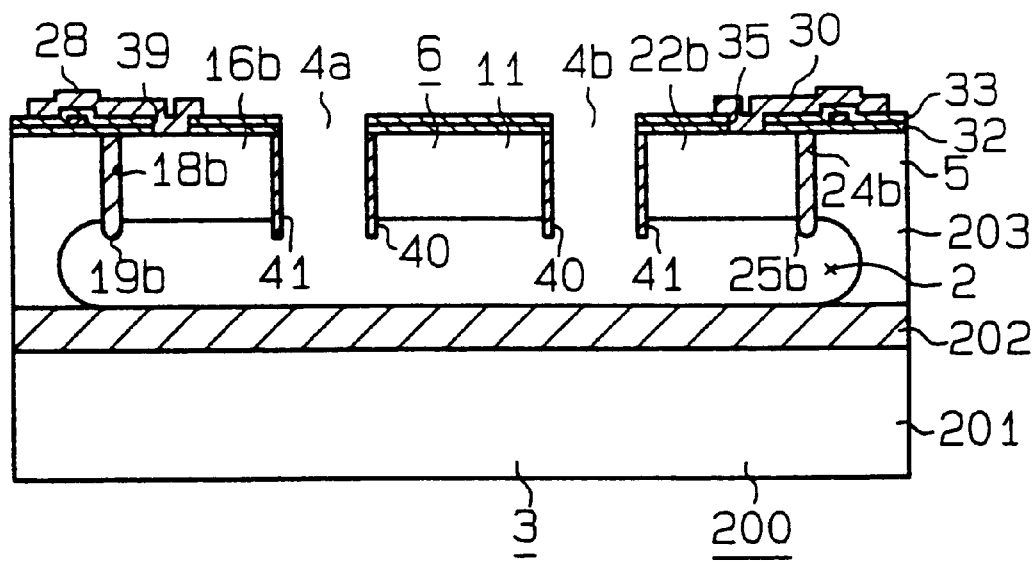
FIG. 28 is a sectional view taken along lines 28—28 in FIG. 27.
Figure 29:
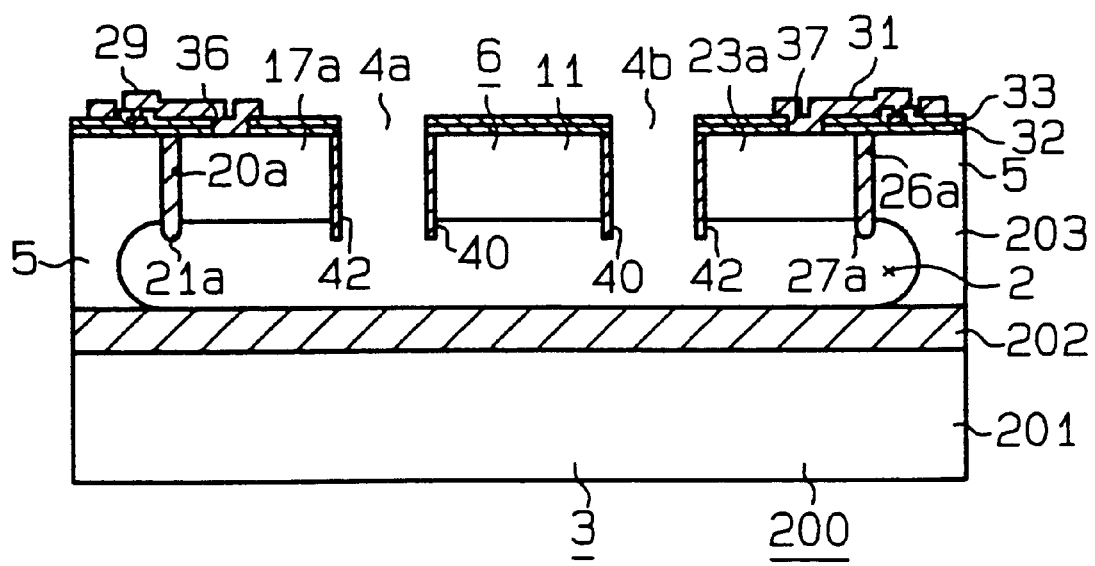
FIG. 29 is a sectional view taken along lines 29—29 in FIG. 27.

FIG. 27 shows a perspective view of an acceleration sensor of this embodiment. FIGS. 28, 29 respectively show sectional views taken along lines 28—28, 29—29 in FIG. 27.

In FIG. 29, an SOI substrate 200 is made up of a support substrate 201, and a semiconductor layer (SOI layer) 203 with a buried oxide film 202 as a buried insulating film formed on the support substrate 201 interposed therebetween. The support substrate 201 and the semiconductor layer 203 are made of monocrystalline silicon.

A hollow 2 laterally extended is formed in the semiconductor layer 203 of the SOI substrate 200, and trenches 4a to 4d vertically extended are formed in the semiconductor layer 203. A base plate portion 3 is divided by the hollow 2, and positions below the hollow 2. The base plate portion 3 is made up of the support substrate 201 and the buried oxide film 202. A rectangular frame portion 5 is divided by the hollow 3 and the trenches 4a, 4b, and positions at sides of the trenches 4a, 4b. A beam-structure 6 having a movable electrode movable in accordance with acceleration is divided by the hollow 3 and the trenches 4a to 4d, and positions above the hollow 2, and extends from the rectangular frame portion 5. In detail, as shown in FIG. 27, a mass portion 11 of the beam-structure 11 is supported two anchor portions 7, 8, which are made up of the semiconductor layer 203 and are protruded from the rectangular frame portion 5, via beam portions 9, 10. As shown in FIG. 29, the mass portion 11 positions above an upper surface of the buried oxide film 202 with keeping a predetermined distance with the upper surface of the buried oxide film 202.

As shown in FIG. 27, the anchor portions 7, 8 are connected with being electrically insulated to beam portions 9, 10 via insulating materials 15a, 15b made of oxide film or the like. Four movable electrodes 12a to 12d are protruded from one side surface of the mass portion 11; and four movable electrodes 13a to 13d are protruded from another side surface of the mass portion 11. The movable electrodes 12a to 12d, 13a to 13d constitute a comb-shape in which each of which extends in parallel with each other with an equal distance.

The fixed electrodes 16a to 16d, 17a to 17d, 22a to 22d, 23a to 23d are divided by the hollow 2 and the trenches 4a, 4b; and each of which positions above the hollow 2, extends from the rectangular frame portion 5, and respectively confronts with the movable electrodes 12a to 12d, 13a to 13d.

In detail, first electrodes 16a to 16d and second fixed electrodes 17a to 17d are fixed to the rectangular frame portion 5. The first fixed electrodes 16a to 16d are respectively connected to the rectangular frame portion 5 via insulating materials 19a to 19d made of oxide film or the like, and are electrically insulated with the rectangular frame portion 5 by the insulating materials 19a to 19d. The first fixed electrodes 16a to 16d confront one side surfaces of the movable electrodes 12a to 12d arranged above the upper surface of the buried oxide film 202 with keeping the predetermined distance therebetween. Similarly, the second fixed electrodes 17a to 17d are respectively connected to the rectangular frame portion 5 via insulating materials 21a to 21d made of oxide film or the like, and are electrically insulated with the rectangular frame portion 5 by the insulating materials 21a to 21d. The second fixed electrodes 17a to 17d confront another side surfaces of the movable electrodes 12a to 12d arranged above the upper surface of the buried oxide film 202 with keeping the predetermined distance therebetween.

Similarly, first electrodes 22a to 22d and second fixed electrodes 23a to 23d are fixed to the rectangular frame portion 5. The first fixed electrodes 22a to 22d are respectively connected to the rectangular frame portion 5 via insulating materials 25a to 25d made of oxide film or the like, and are electrically insulated with the rectangular frame portion 5 by the insulating materials 25a to 25d. The first fixed electrodes 22a to 22d confront one side surfaces of the movable electrodes 13a to 13d arranged above the upper surface of the buried oxide film 202 with keeping the predetermined distance therebetween. Similarly, the second fixed electrodes 23a to 23d are respectively connected to the rectangular frame portion 5 via insulating materials 27a to 27d made of oxide film or the like, and are electrically insulated with the rectangular frame portion 5 by the insulating materials 27a to 27d. The second fixed electrodes 23a to 23d confront another side surfaces of the movable electrodes 13a to 13d arranged above the upper surface of the buried oxide film 202 with keeping the predetermined distance therebetween.

Potential of the first fixed electrodes 16a to 16d is externally taken out through a wire 28 formed on oxide films 32, 33 (see FIG. 28) with being electrically insulated with the rectangular frame portion 5. Similarly, potential of the second fixed electrodes 17a to 17d is externally taken out through a wire 29; potential of the first fixed electrodes 22a to 22d is externally taken out through a wire 30; and potential of the second fixed electrodes 23a to 23d is externally taken out through a wire 31. Potentials of the movable electrodes 12a to 12d, 13a to 13d are externally taken out from wires 38, 39 through the mass portion 11 and the beam portions 9, 10.

Next, a sectional structure of the acceleration sensor will be explained with reference to FIGS. 28, 29. Since each of the support structure and the insulating structure between each of the fixed electrodes and the beam-structure are the same each other, only portions shown in FIGS. 28, 29 are mainly described hereinafter and explanation regarding to the other portions is omitted.

The fixed electrodes 16b, 22b, 17a, 23a are supported to the rectangular frame portion 5 via insulating materials 19b, 25b, 21a, 27a in which oxide film is buried in trenches 18a, 24b, 20a, 26a, and are electrically insulated with the rectangular frame portion 5 by the insulating materials 19b, 25b, 21a, 27a. Protection films 40, 41, 42 are formed on sidewalls of the beam-structure (mass portion 11 etc) and the fixed electrodes 16a, 22b, 17a, 23a; and insulating films 32, 33 are formed on the upper surfaces of the beam-structure (mass portion 11 etc) and the fixed electrodes 16a, 22b, 17a, 23a. Potentials of the fixed electrodes 16b, 22b, 17a, 23a are externally taken out by the wires 28 to 31 through contact holes 34 to 37.

In the above-described structure, a first capacitor is defined between the movable electrodes 12a to 12d and the first fixed electrodes 16a to 16a, and a second capacitor is defined between the movable electrodes 12a to 12d and the second fixed electrodes 17a to 17d. Similarly, a first capacitor is defined between the movable electrodes 13a to 13d and the first fixed electrodes 22a to 22a, and a second capacitor is defined between the movable electrodes 13a to 13d and the second fixed electrodes 23a to 23d.

As described the above, the trenches 18b, 24b, 20a, 26a are formed between the fixed electrodes 16b, 22b, 17a, 23a and the rectangular frame portion 5, and the insulating materials 19b, 25b are buried therein. Similar structure is applied between the movable electrode (in detail, anchor portions 7, 8) and the rectangular frame portion 5.

As described the above, the base plate portion 3, the rectangular frame portion 5, the beam-structure and the fixed electrodes 16a to 16d, 17a to 17d, 22a to 22d, 23a to 23d are divided each other by the hollow 3 and the trenches 4a to 4d formed in the semiconductor layer 203 of the SOI substrate. The electrodes are electrically isolated by the electric insulating materials 19b, 25b, 21a, 27a and so on buried in the trenches 18b, 24b, 20a, 26a and so on, which are formed between the movable electrodes 12a to 12d, 13a to 13d and the rectangular frame portion 5 and between the fixed electrodes and the rectangular frame portion 5.

In this way, since the SOI substrate is used in a semiconductor physical quantity sensor in which the beam-structure having the movable electrodes and the fixed electrodes confronted with the movable electrodes are integrally formed in one substrate, the sectional structure of the sensor can be simplified.

Here, the way of detection of the acceleration is substantially the same as that of the first embodiment.

Next, a method of manufacturing will be explained with reference to FIGS. 30 to 34, each of which is a sectional view taken along the line 29—29 in FIG. 27.

Figure 30:
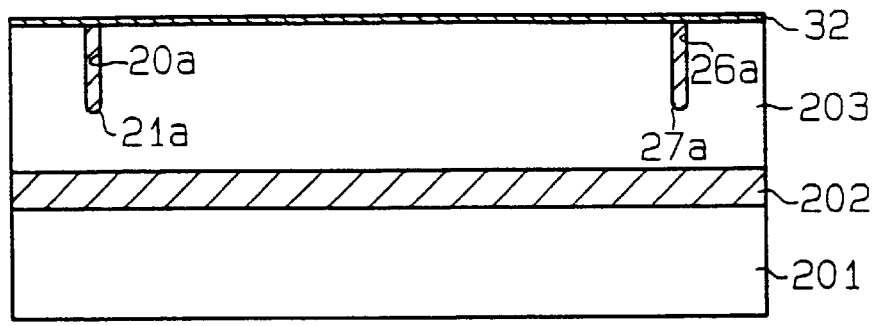
FIGS. 30 to 34 are sectional views for illustrating each step of a method of manufacturing of the third embodiment.

At first, as shown in FIG. 30, an SOI substrate 200 made up of a support substrate 201, a buried oxide film 202, and a semiconductor layer 203 is provided. An anisotropic etching is conducted from an upper surface of the semiconductor layer 203 to form the first trenches 20a, 26a, which is vertically extended and is for electrically insulated the movable electrodes and the fixed electrodes from the rectangular frame portion. After that, a silicon oxide film is formed on the semiconductor layer 203. The trenches 20a, 26a are filled with the insulating materials 21a, 27a, and the surface of the semiconductor layer 203 is covered with an oxide film 32.

Figure 31:
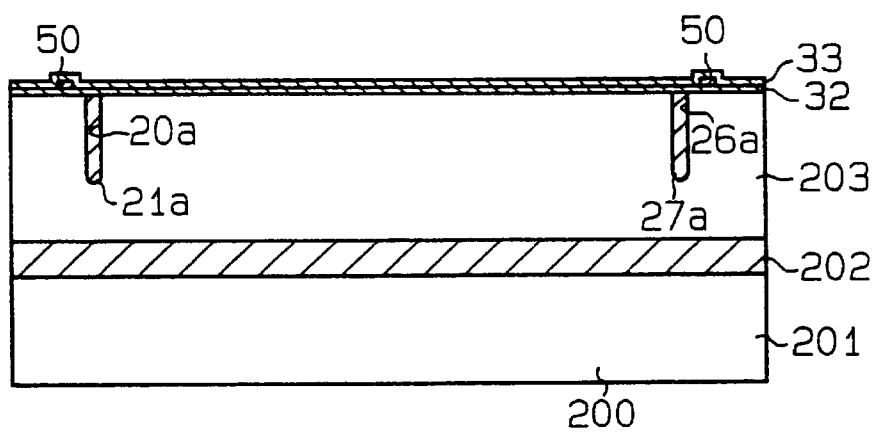

Furthermore, as shown in FIG. 31, aware material is formed and is patterned to form a wire pattern. Next, an oxide film 33 is formed to cover the wire pattern 50.

Figure 32:
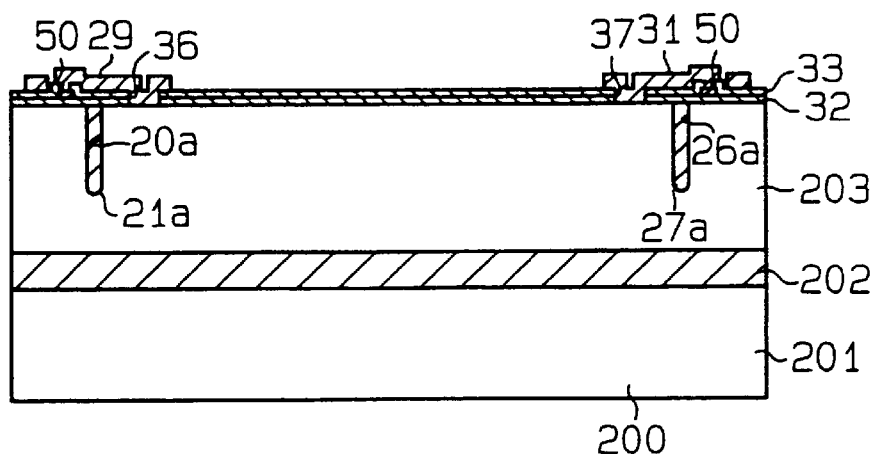

After that, as shown in FIG. 32, contact holes 36, 37 are formed by partly removing the oxide films 32, 33 formed on the substrate 1 and the wire material 50. Furthermore, wire materials 29, 31 are formed and are patterned.

Figure 33:
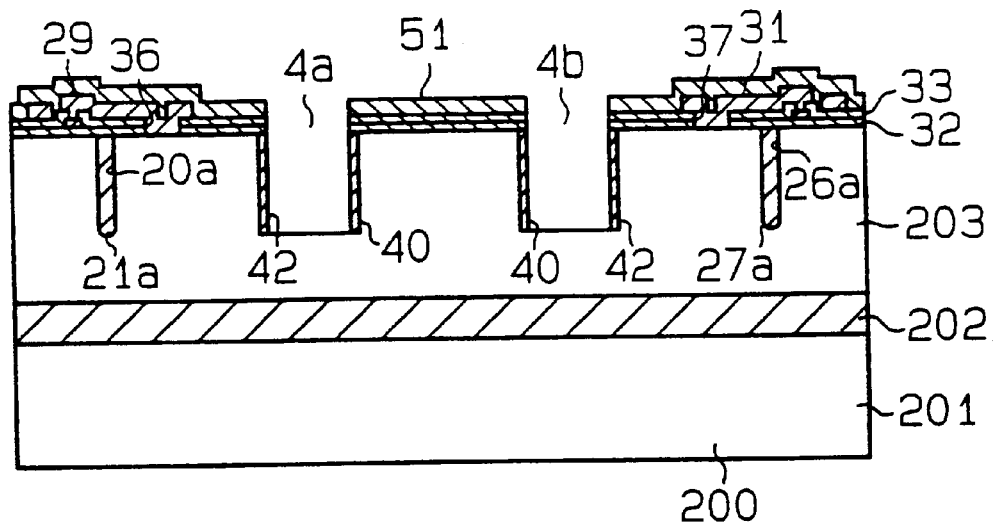

As shown in FIG. 33, a mask 51 for forming a structure is formed on the SOI substrate 200 by using a photolithography. The oxide films 32, 33 are dry-etched through the mask 51. Next, anisotropic etching (trench etching) is conducted from the upper surface of the semiconductor layer 203 through the mask 51 so as to form vertically extending trenches (second trenches) 4a, 4b for forming the rectangular frame portion, the beam-structure and the fixed electrodes. Here, the trenches 4a, 4b have a depth so as not to reach the buried oxide film 202 (the anisotropic etching is ended before reaching the buried oxide film 202).

Furthermore, protection films 40, 42 for protecting the sidewall before an isotropic etching are formed on the inner wall surfaces of the trenches 4a, 4b. After that, parts of protection films, which are attached to bottom surfaces of the trenches, are removed. Thus, the protection films 40, 42 are formed on the sidewalls of the trenches 4a, 4b except of the bottom surfaces of the trenches 4a, 4b.

Here, it needs to select a material of the protection films 40, 42 from one suitable for manufacturing process. In detail, the protection films 40, 42 may be formed by: forming polymer or the like during the trench etching; forming oxide film; depositing oxide film by CVD or the like; forming thin oxide film by $O_2$ plasma or the like; or forming oxide film by chemical. When there is no thermal step, the wire materials 29, 31 may be made of metallic wire such as aluminum or polysilicon or the like. On the contrary, when there is a thermal step, the wire materials 29, 31 may be made of high melting point metal such as tungsten or its alloy, or polysilicon.

Figure 34:
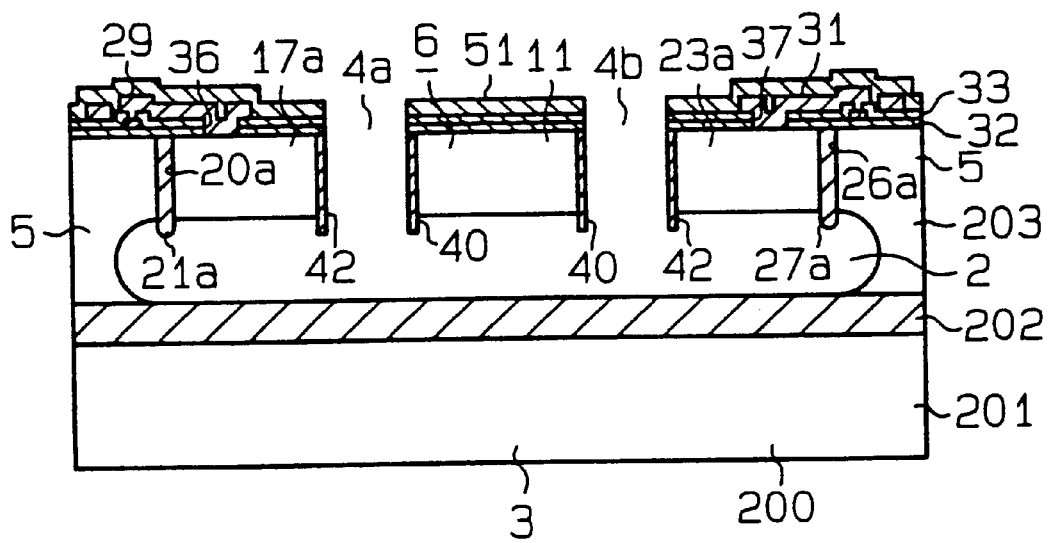

Next, as shown in FIG. 34, isotropic etching is conducted to the semiconductor layer 203 from bottom surfaces of the second trenches 4a, 4b by using the buried oxide film 202 as an etching stopper. As a result, a hollow laterally extended, the base plate portion 3 positioned below the hollow 2, the rectangular frame portion 5 positioned at side of the hollow 2 and the second trenches 4a, 4b, the beam-structure 6 having the movable electrodes movable by the acceleration, and the fixed electrodes 17a, 23a confronted with the movable portions of the beam-structure 6 are divided each other. In FIG. 34, only silicon below the mass portion 11 and below the fixed electrodes 17a, 23a is etched. Particularly, the mass portion 11 and the base plate portion (the buried oxide film 202 and the support substrate 201) are completely isolated to have a predetermined distance therebetween.

In this case, since the etching speed of the anisotropic etching to the buried oxide film 202 is sufficiently low, the oxide film 202 is hardly etched even if the buried oxide film 202 is exposed as a result the oxide film 203 is etched. Therefore, it can constantly keep the distances between the mass portion 11 and the oxide film 202 and between the fixed electrodes 17a, 23a and the oxide film 202. Furthermore, in this isotropic etching, it needs to select the combination so that the protection films 40, 42 are not etched. When a plasma etching process using gas such as $SF_6$ or $CF_4$ is applied in the isotropic etching, throughput of forming the structure after etching can be improved compared to a wet etching step.

Finally, the acceleration sensor shown in FIG. 29 can be completed by removing the etching mask 51.

As described the above, it can use an SOI substrate as a start wafer in manufacturing in a semiconductor physical sensor in which the beam-structure 6 having the movable electrodes and the fixed electrodes confronted with the movable electrodes are integrally formed in one substrate, and it can largely reduce a manufacturing cost of the sensor because it does not need to apply the bonding step of the substrates. Furthermore, since the manufacturing is started from the SOI substrate 200, it can easily insulate and isolate the electrodes such as the fixed electrodes and the movable electrodes with the base plate portion (the buried oxide film 202 and the support substrate 201). Therefore, flexibility of sensor designing can be expanded. Furthermore, since the buried oxide film 202 is used as the etching stopper, the distance (air gap) between the movable electrodes and the base plate portion can be easily controlled, because the etching is not advanced downwardly after exposing the buried oxide film 202.

Fourth Embodiment

Next, a fourth embodiment will be explained. Hereinafter, differences between the third embodiment will be mainly explained.

Figure 35:
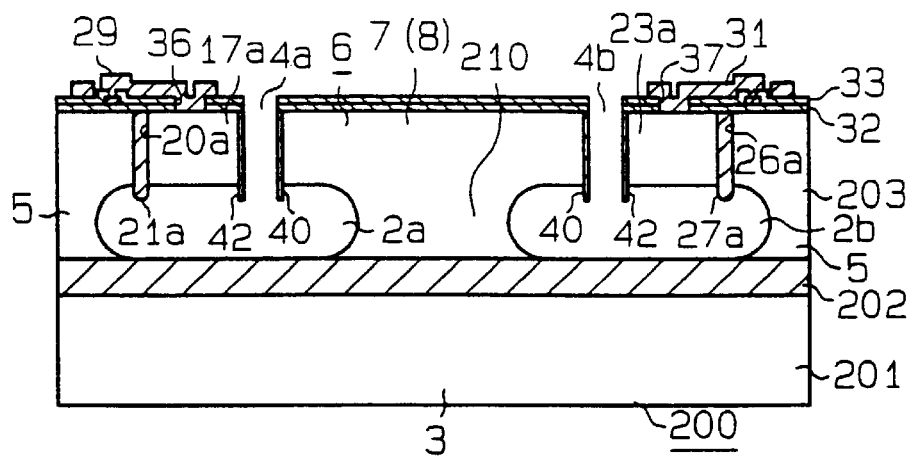
FIG. 35 is a sectional view of a semiconductor acceleration sensor of a fourth embodiment according to the present invention.
Figure 36:
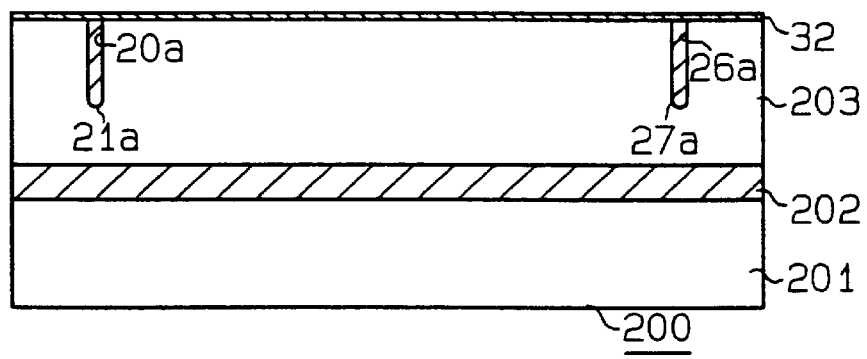
FIGS. 36 to 40 are sectional views for illustrating each step of a method of manufacturing of the fourth embodiment.

FIG. 35 shows a sectional view of a sensor of this embodiment, and corresponds to sectional view taken along a line 35—35 in FIG. 27.

In this embodiment, at least one of the beam-structure and the fixed electrode is supported by a prop 210, which is vertically provided on the base plate portion 3.

As shown in FIG. 35, in the anchor portion 7 (8) in FIG. 27, the prop 210 is extended from an upper surface of the buried oxide film 202 (support substrate 201), and the prop 210 is connected to the anchor portion 7 (8). The prop 210 is a part of the semiconductor layer 203, and is made of monocrystalline silicon. That is, hollows 2a, 2b are formed in the semiconductor layer 203 of the SOI substrate 200, and the prop 210 is formed between the two hollows 2a, 2b.

The prop 210 is electrically insulated from the support substrate 201 by the buried oxide film 202.

In this way, according to this structure using the SOI substrate, the base plate portion 3 can be completely insulated and isolated by remaining the prop 210 made of the silicon at the base plate portion because of an existence of the buried oxide film 202.

This structure is applied to the fixed electrodes as well as the support structure and the insulating structure of the beam-structure (movable electrode). That is, the fixed electrodes (17a, 23a etc) are divided by the hollow 2 and the trenches 4a, 4b; are positioned above the hollow 2; are extended from the base plate portion 3; and are confronted with the movable electrode of the beam-structure. However, the prop 210 made of silicon may be remained below the fixed electrode.

Next, a method of manufacturing will be explained with reference to FIGS. 36 to 40.

At first, as shown in FIG. 30 an SOI substrate 200 made up of a support substrate 201, a buried oxide film 202, and a semiconductor layer 203 is provided. An anisotropic etching is conducted from an upper surface of the semiconductor layer 203 to form the trenches 20a, 26a. After that, a silicon oxide film is formed on the semiconductor layer 203. The trenches 20a, 26a are filled with the insulating materials 21a, 27a, and the surface of the semiconductor layer 203 is covered with an oxide film 32.

Figure 37:
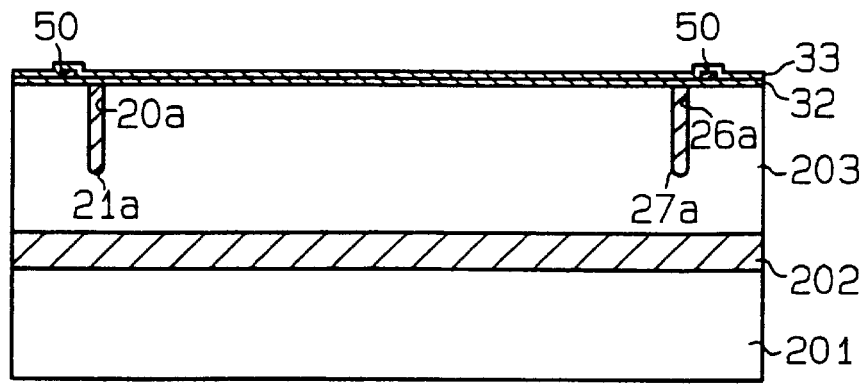

Furthermore, as shown in FIG. 37, aware material is formed and is patterned to form a wire pattern. Next, an oxide film 33 is formed to cover the wire pattern 50.

Figure 38:
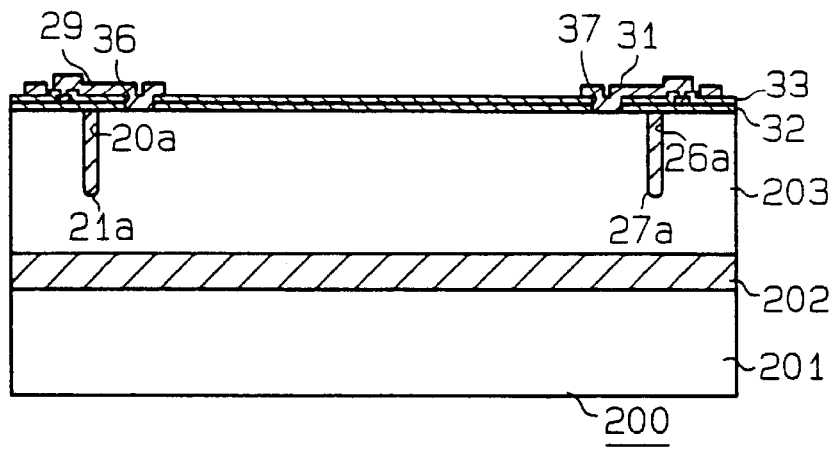

After that, as shown in FIG. 38, contact holes 36, 37 are formed by partly removing the oxide films 32, 33 formed on the substrate 1 and the wire material 50. Furthermore, wire materials 29, 31 are formed and are patterned.

Figure 39:
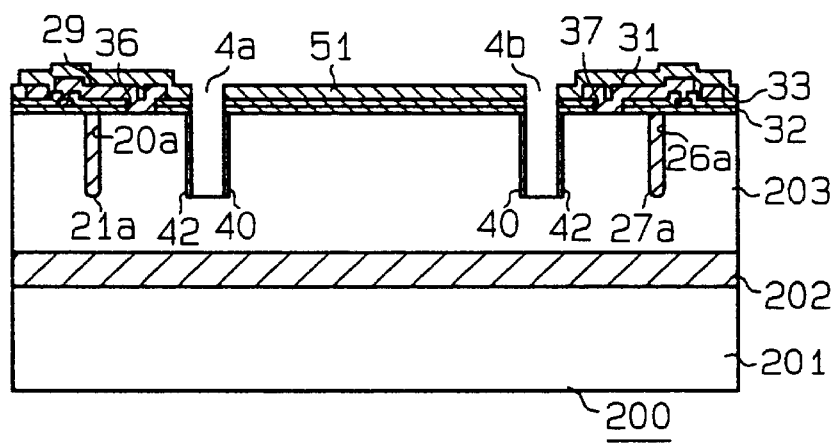

As shown in FIG. 39, a mask 51 for forming a structure is formed on the SOI substrate 200 by using a photolithography. The oxide films 32, 33 are dry-etched through the mask 51. Next, anisotropic etching (trench etching) is conducted from the upper surface of the semiconductor layer 203 through the mask 51 so as to form vertically extending trenches 4a, 4b for forming the rectangular frame portion, the beam-structure and the fixed electrodes. Here, the trenches 4a, 4b have a depth so as not to reach the buried oxide film 202. Furthermore, protection films 40, 42 for protecting the sidewall before an isotropic etching are formed on the inner wall surface of the trenches 4a, 4b. After that, parts of protection films, which are attached to bottom surfaces of the trenches, are removed.

Figure 40:
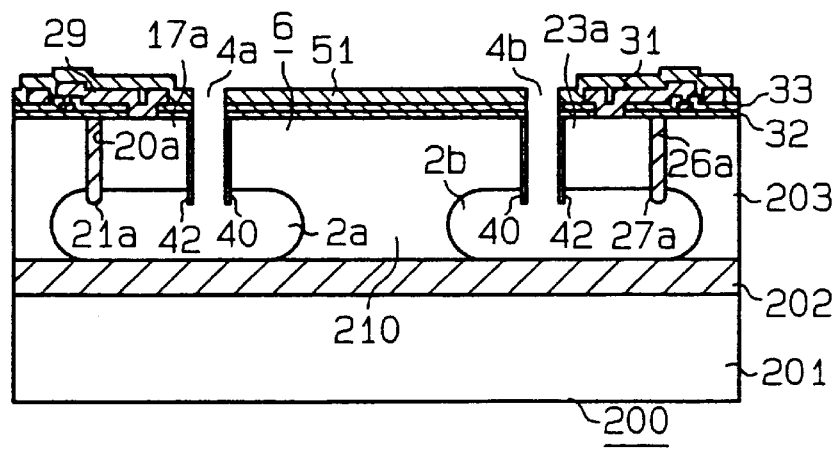

After etching the semiconductor layer 203 by the anisotropic etching in this way, as shown in FIG. 40, isotropic etching is conducted to the semiconductor layer 203 from bottom surfaces of the trenches 4a, 4b by using the buried oxide film 202 as an etching stopper. As a result, a hollow laterally extended with partly remaining the silicon. As a result, the beam-structure 6 positioned above the buried oxide film 202 is positioned with keeping a predetermined distance therebetween.

Finally, the acceleration sensor shown in FIG. 35 can be completed by removing the etching mask 51.

Fifth Embodiment

Next, a fifth embodiment will be explained. Hereinafter, differences between the fourth embodiment will be mainly explained.

Figure 41:
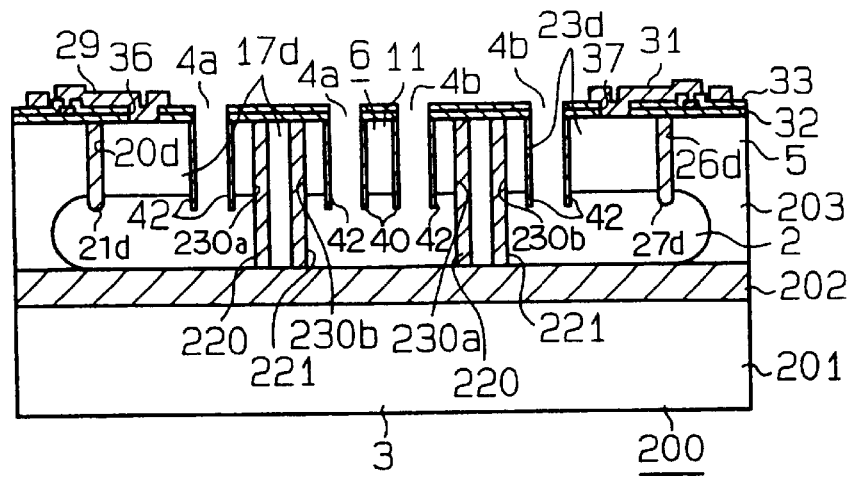
FIG. 41 is a sectional view of a semiconductor acceleration sensor of a fifth embodiment according to the present invention.

FIG. 41 shows a sectional view of a sensor of this embodiment, and corresponds to sectional view taken along a line 41—41 in FIG. 27.

Props 220, 221 made of electric insulating material (e.g., oxide film) are vertically provided on the base plate portion 3. The props 220, 221 support (prop) at least one of the fixed electrode and the beam-structure with electrically insulating. In detail, the props 220, 221 (e.g., Oxide film) are buried in at least one of the fixed electrode and the beam-structure, the lower ends of the props 220, 221 reach the buried oxide film 202, and silicon is arranged between the props 220, 221.

In detail, the fixed electrodes 17d, 23d shown in FIG. 41 are divided by the hollow 2 and the trenches 4a, 4b, are positioned above the hollow 2, are extended from the rectangular frame portion 5, and are confronted with the movable portion of the beam-structure 6. Furthermore, trenches 230a, 230b in which insulating materials 220, 221 are buried are formed. The fixed electrodes 17d, 23d are supported with being electrically insulated by the props 220, 221 made of the electric insulating material and are vertically provided from the base plate portion 3.

Figure 42:
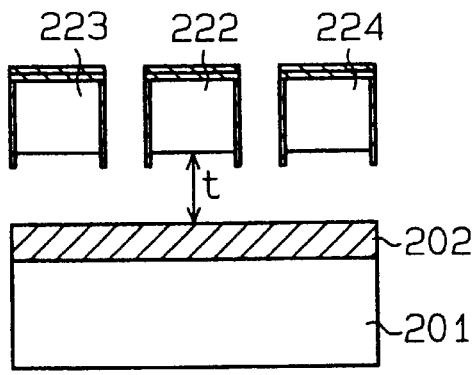
FIGS. 42 and 43 are sectional views illustrating a support structure of the fixed electrode of the fifth embodiment.

As shown in FIG. 42, a movable electrode 222 and fixed electrodes 223, 224 are arranged so that their lower surfaces are kept a predetermined distance t from the buried oxide film 202. Here, a voltage difference occurs between the movable electrode 222 and the fixed electrodes 223, 224 due to an operation of the sensor. In this case, electrostatic force is acted between the movable electrode 222 and the fixed electrodes 223, 224 due to the voltage difference, and then the movable electrode 222 is attracted toward the fixed electrodes 223, 224 in the case of the structure shown in FIG. 42. On the contrary, according to this embodiment, the electrostatic force is not acted on at least the fixed electrodes 223, 224 by applying the structure shown in FIG. 43, because the fixed electrodes 223, 224 are fixed to the buried oxide film 202 (support substrate 201). Hence, an output of the sensor is stable.

Furthermore, even when section area of the bottom surface of at least one of the fixed electrodes and the beam-structure is small, at least one of the fixed electrodes and the beam-structure can be supported by the props 220, 221 made of the electric insulating material by forming the props 220, 221 made of insulating material. In other words, when section area of the bottom surface of at least one of the fixed electrodes and the beam-structure is not large, it is difficult to fix at least one of the fixed electrodes and the beam-structure to the base plate portion. However, by applying this measure, at least one of the fixed electrodes and the beam-structure can be arranged in even narrow area, and this member can be completely insulated from the base plate portion. Particularly, it is effective when modification needs to be minimum (e.g., acceleration sensor).

Next, a method of manufacturing this acceleration sensor will be explained with reference to FIGS. 44 to 48.

Figure 44:
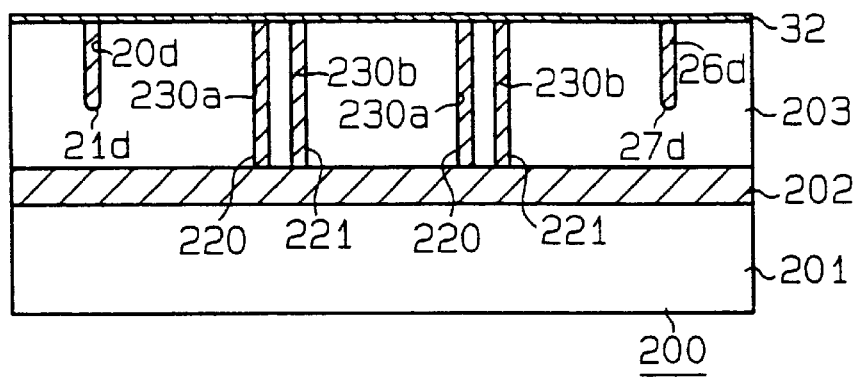
FIGS. 44 to 48 are sectional views for illustrating each step of a method of manufacturing of the fifth embodiment.

At first, as shown in FIG. 44, an SOI substrate is provided.

Shallow trenches 20d, 26d and deep trenches 230a, 230b are formed in the semiconductor layer 203 by conducting anisotropic etching from an upper surface of the semiconductor layer 203 of the SOI substrate 200. In other words, first trenches 20d, 26d, which are vertically extended, for electrically insulating the movable electrodes and the fixed electrodes from the rectangular frame portion are formed; and second trenches 230a, 230b, which are vertically extended deeply than the first trenches, for supporting at least one of the fixed electrodes and the beam-structure to the base plate portion are formed. A silicon oxide film is formed on the semiconductor layer 203, and insulating materials 21d, 27d, 220, 221 are buried in the shallow trenches 20d, 26d and deep trenches 230a, 230b. Furthermore, the surface of the substrate is covered with an oxide film 32.

Figure 45:
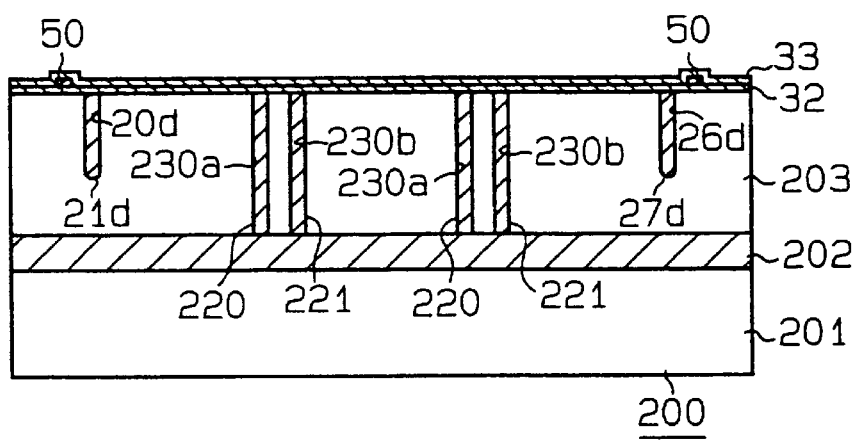

Next, as shown in FIG. 45, a wire material is formed and is patterned to form a wire pattern 50. An oxide film 33 is formed to cover the wire pattern 50.

Figure 46:
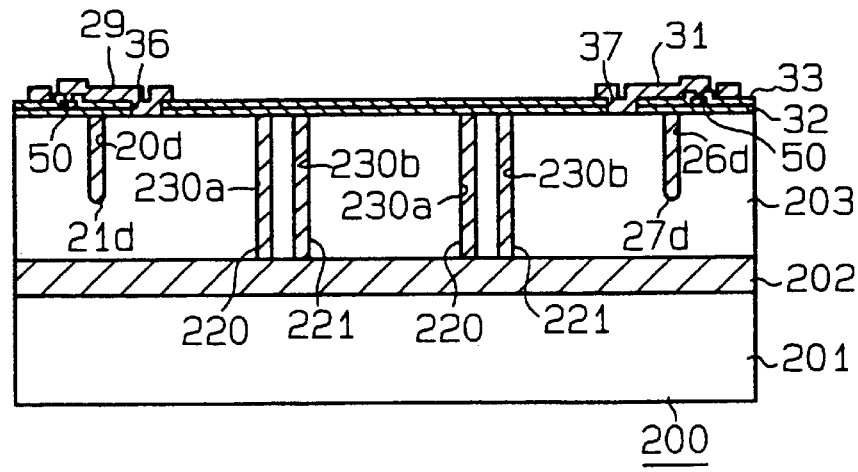

As shown in FIG. 46, contact holes 36, 37 are formed by partly removing the oxide films 32, 33 formed on the substrate 1 and the wire material 50. Furthermore, wire materials 29, 31 are formed and are patterned.

Figure 47:
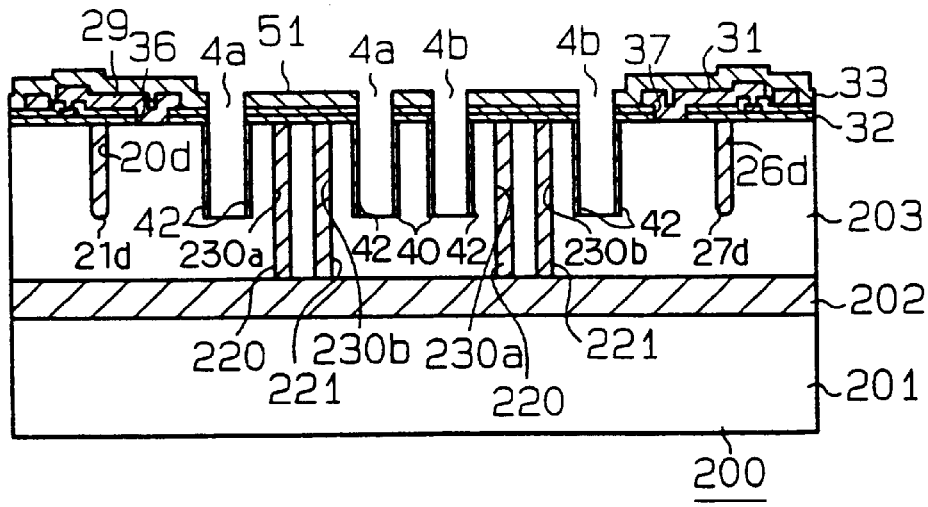

As shown in FIG. 47, a mask 51 for forming a structure is formed on the SOI substrate by using a photolithography. The oxide films 32, 33 are etched through the mask 51. Next, anisotropic etching (trench etching) is conducted from the upper surface of the semiconductor layer 203 through the mask 51 so as to form vertically extending third trenches 4a, 4b for forming the rectangular frame portion, the beam-structure and the fixed electrodes. Furthermore, protection films 40, 42 (thermal oxide film, oxide film by oxygen plasma process, a film generated in etching) for protecting the sidewall before an isotropic etching are formed on the inner wall surface of the trenches 4a, 4b. After that, parts of protection films, which are attached to bottom surfaces of the trenches, are removed. Thus, the protection films 40, 42 are formed on the sidewalls of the trenches 4a, 4b except of the bottom surfaces of the trenches 4a, 4b.

Figure 48:
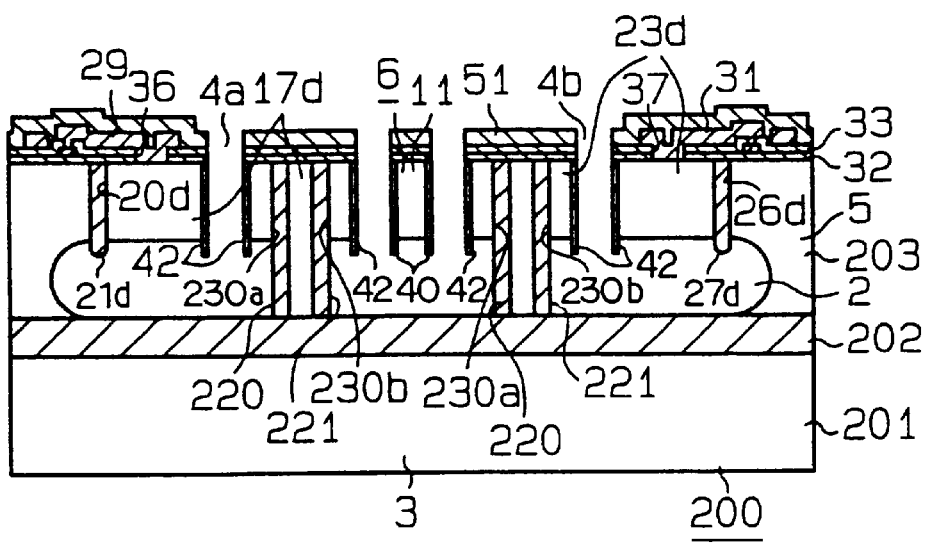

Next, as shown in FIG. 48, isotropic etching is conducted to the semiconductor layer 203 from bottom surfaces of the third trenches 4a, 4b by using the buried oxide film 202 as an etching stopper. As a result, a hollow laterally extended, the base plate portion 3 positioned below the hollow 2, the rectangular frame portion 5 positioned at side of the hollow 2 and the third trenches 4a, 4b, the beam-structure 6 having the movable electrodes movable by the acceleration, and the fixed electrodes 17d, 23d confronted with the movable portions of the beam-structure 6 are divided each other.

Finally, the acceleration sensor shown in FIG. 41 can be completed by removing the etching mask 51.

As described the above, in the case of FIG. 35, when a width of a portion to be fixed (anchor portions 7, 8 in FIG. 35) is narrow, the silicon between the buried oxide film 202 and the portion to be fixed (anchor portions 7, 8 in FIG. 35) may be completely removed during the isotropic etching. However, this embodiment can prevent this. Furthermore, etching laterally advancing in the etching step can be prevented by the trench (insulating material) reaching the buried oxide film 202. Hence, the sensor can be manufactured with stable, and without being influenced by instability of the process.

Here, the structures shown in FIGS. 12, 13 (the center portion of the insulating trench as plan structure is protruded toward the tip portion), or the structures shown in FIGS. 14, 15 (the material to be buried in the trenches is made of low stress material covered by insulating material) may be applied to these third, fourth, and fifth embodiment using the SOI substrate.

Sixth Embodiment

Next, a sixth embodiment of the present invention will be explained. Here, differences between the third embodiment will be mainly described.

Figure 49:
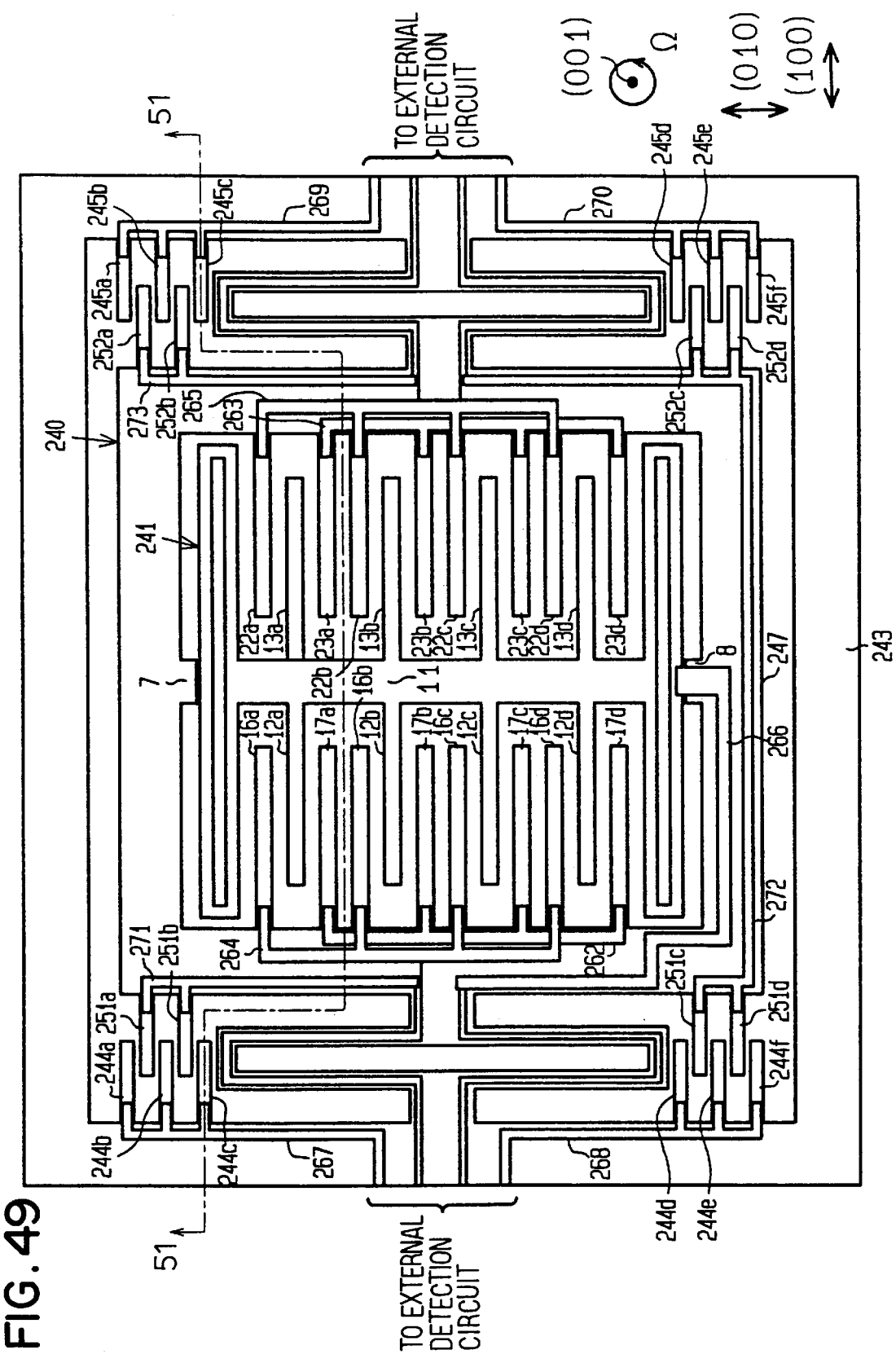
FIG. 49 is a sectional view of a yaw rate sensor of a sixth embodiment according to the present invention.
Figure 50:
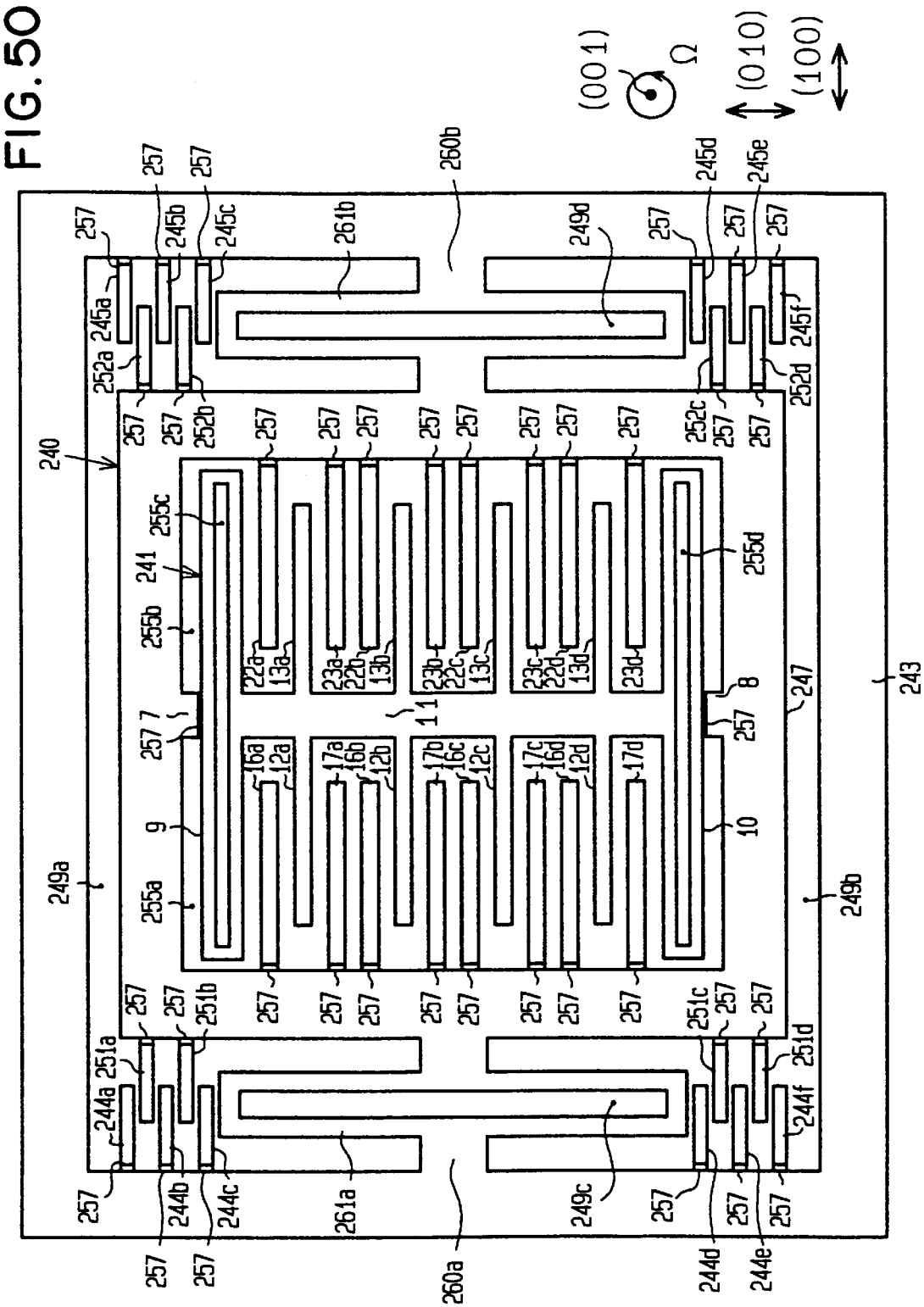
FIG. 50 is a sectional view of a yaw rate sensor of the sixth embodiment before being wired.

FIG. 49 shows a plan view of a yaw rate sensor; FIG. 50 shows a plan view of the yaw rate sensor without wire; and FIG. 51 shows a sectional view taken along a line 51—51 in FIG. 49.

As a whole, this sensor includes a primary oscillatory mass 240, and a beam-structure 241 as a secondary oscillatory mass arranged inside the primary oscillatory mass 240. In detail, the sensor is provided with primary oscillatory mass base plate portion (primary base plate portion) 242 shown in FIG. 51, a primary oscillatory mass frame portion (primary frame portion) 243 shown in FIG. 50, the primary mass 240, primary oscillatory mass excitation fixed electrodes (primary excitation fixed electrodes) 244a to 244f, 245a to 245f, a secondary oscillatory mass base plate portion (secondary frame portion) 246 shown in FIG. 51, a secondary oscillatory mass frame portion (secondary frame portion) 247 shown in FIG. 50, the beam-structure 241, and secondary oscillatory mass excitation fixed electrodes (secondary excitation fixed electrodes) 16a to 16d, 17a to 17d, 22a to 22d, 23a to 23d.

Figure 51:
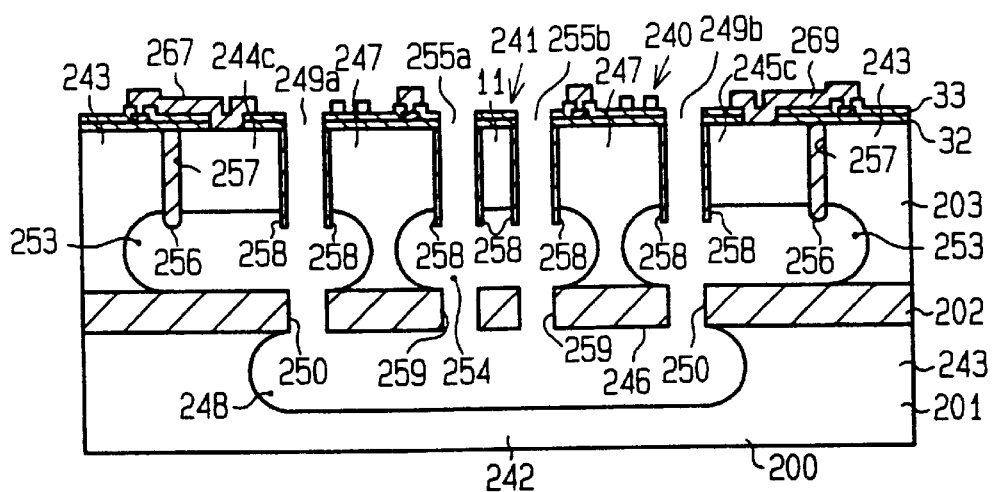
FIG. 51 is a sectional view taken along a line 51—51 in FIG. 49.
Figure 52:
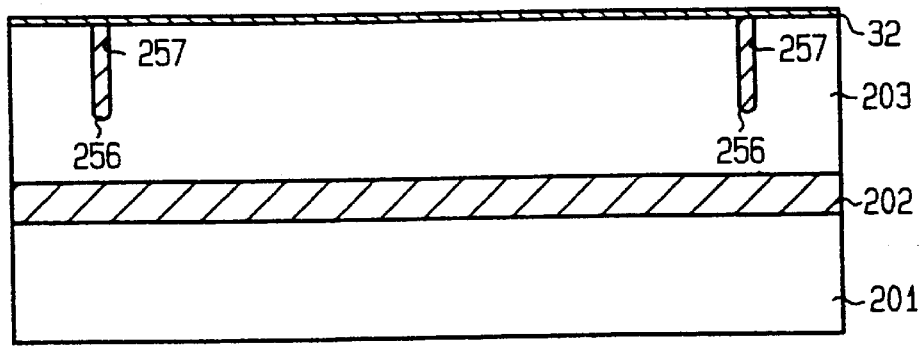
FIGS. 52 to 58 are sectional views for illustrating each step of a method of manufacturing of the sixth embodiment.

The primary base plate portion 242 shown in FIG. 51 is divided by a laterally extending primary oscillatory mass hollow (primary hollow) 248 formed in the support substrate 201 of the SOI substrate 200, and is positioned below the primary hollow 248. The primary frame portion 243 is divided by the primary hollow 248 shown in FIG. 51, laterally extending primary oscillatory mass trenches (primary trenches) 249a, 249b formed in a semiconductor layer 203, and a through hole 250 formed to a buried oxide film 202; and positions at sides of the primary hollow 248, the primary trenches 249a, 249b, and the through hole 250. The primary oscillatory mass 240 is also divided by the primary hollow 248 shown in FIG. 51, the primary trenches 249a to 249d and the through hole 250; is extended from the primary frame portion 243 as shown in FIG. 50; and has primary oscillatory mass movable electrodes (primary movable electrodes) 251a to 251d, 252a to 252d. The primary excitation fixed electrodes 244a to 244f, 245a to 245f are divided by a laterally extending hollow 253 formed in the semiconductor layer 203 shown in FIG. 51 and the vertically extending trenches 249a, 249b formed in the semiconductor layer 203; are extended from the primary frame portion 243; and are confront with the primary movable electrodes 251a to 251d, 252a to 252d.

The secondary base plate portion 246 shown in FIG. 51 is divided by a laterally extending secondary oscillatory mass hollow (secondary hollow) 254 formed in the semiconductor layer 203 of the primary oscillatory mass 240, and positions below the secondary hollow 254. The secondary frame portion 247 is divided by the secondary hollow 254 shown in FIG. 51 and laterally extending secondary oscillatory mass trenches (secondary trenches) 255a, 255b formed in a semiconductor layer 203 of the primary oscillatory mass 240; and is positioned at sides of the secondary hollow 254 and the secondary trenches 255a, 255b. Furthermore, as shown in FIG. 50, the secondary frame portion 247 is a support member of the primary movable electrodes 251a to 251d, 252a to 252d.

The beam-structure 241 as the secondary oscillatory mass 241 is divided by the secondary hollow 254 shown in FIG. 51 and the secondary trenches 255a to 255d, is positioned above the secondary hollow 254 in the primary oscillatory mass 240; is extended from the secondary frame portion 247 as shown in FIG. 50; and has secondary oscillatory mass movable electrodes (secondary movable electrodes) 12a to 12d, 13a to 13d movable by physical quantity. The secondary excitation fixed electrodes 16a to 16d, 17a to 17d, 22a to 22d, 23a to 23d are divided by the secondary hollow 254 and secondary trenches 255a, 255b shown in FIG. 51; are positioned above the secondary hollow 254 in the primary oscillatory mass 240; are extended from the secondary frame portion 247; and are confronted with the secondary movable electrodes 12a to 12d, 13a to 13d.

Furthermore, trenches 257 (see FIG. 51) in which an electric insulating material 256 is buried are formed between the primary movable electrodes 251a to 251d, 252a to 252d and the secondary frame portion 247, and between the primary excitation fixed electrodes 244a to 244f, 245a to 245f and the primary frame portion 243. Similarly, trenches 257 (see FIG. 51) in which an electric insulating material 256 is buried are formed between the secondary movable electrodes 12a to 12d, 13a to 13d and the secondary frame portion 247, and between the secondary excitation fixed electrodes 16a to 16d, 17a to 17d, 22a to 22d, 23a to 23d and the secondary frame portion 247.

Furthermore, a protection film 258 is formed at sidewalls of the trenches 249a to 249d, 255a to 255d shown in FIG. 51. A through hole 259 is formed in the buried oxide film 202. The primary oscillatory mass 240 shown in FIG. 51 has anchor portions 260a, 260b and beam portions 261a, 261b.

The structure will be explained in more detail hereinafter. In FIG. 51, the SOI substrate 200 is made up of the buried oxide film 202 and the semiconductor layer 203. The support substrate 201 and the semiconductor layer 203 are made of monocrystalline silicon. As shown in FIG. 50, the primary oscillatory mass 240 made of the monocrystalline silicon (monocrystalline semiconductor) and the beam-structure 241 as the secondary oscillatory mass are formed by being divided. The primary oscillatory mass 240 is movable (has flexibility) substantially only (1 0 0) direction in FIG. 50, and the beam-structure 241 as the secondary oscillatory mass is movable (has flexibility) substantially only (0 1 0) direction.

The beam-structure 241 includes a mass portion 11, the secondary movable electrodes 12a to 12d, 13a to 13d, and beam portions 9, 10. The mass portion 11 is supported by anchor portions 7, 8, which are protruded from the secondary frame portion 247 that supports the beam-structure 241, via the beam portions 9, 10; and is arranged above an upper surface of the buried oxide film 202 with keeping a predetermined distance therebetween, as shown in FIG. 51.

The trench 257 in which the insulating material such as oxide film is buried therein is arranged between the anchor portions 7, 8 and the beam portions 9, 10. The secondary movable electrodes 12a to 12d, 13a to 13d are electrically insulated from the secondary frame portion 247. Four secondary movable electrodes 12a to 12d are protruded from one side surface of the mass portion 11, and four secondary movable electrodes 13a to 13d are protruded from another side surface of the mass portion 11. The secondary movable electrodes 12a to 12d, 13a to 13d constitute a comb-shape in which each of which extends in parallel with each other with an equal distance.

The secondary excitation fixed electrodes are made up of first fixed electrodes 16a to 16d, 22a to 22d and second fixed electrodes 17a to 17d, 23a to 23d.

The first fixed electrodes 16a to 16d and the second fixed electrodes 17a to 17d are fixed to the secondary frame portion 247, which supports the beam-structure 241. The first fixed electrodes 16a to 16d are connected to the secondary frame portion 247 side via the trench 257 (trench in which the insulating material such as oxide film is buried therein), and are electrically insulated from the secondary frame portion 247. Furthermore, the first fixed electrodes 16a to 16d confront with one side of the secondary movable electrodes 12a to 12d, which are arranged above the upper surface of the buried oxide film 202 with keeping the predetermined distance therebetween. Similarly, the second fixed electrodes 17a to 17d are connected to the secondary frame portion 247 side via the trench 257 (trench in which the insulating material such as oxide film is buried therein), and are electrically insulated from the secondary frame portion 247. Furthermore, the second fixed electrodes 17a to 17d confront with another side of the secondary movable electrodes 12a to 12d, which are arranged above the upper surface of the buried oxide film 202 with keeping the predetermined distance therebetween.

Similarly, the first fixed electrodes 22a to 22d and the second fixed electrodes 23a to 23d are fixed to the secondary frame portion 247. The first fixed electrodes 22a to 22d are connected to the secondary frame portion 247 side via the trench 257 (trench in which the insulating material such as oxide film is buried therein), and are electrically insulated from the secondary frame portion 247. Furthermore, the first fixed electrodes 22a to 22d confront with one side of the secondary movable electrodes 13a to 13d, which are arranged above the upper surface of the buried oxide film 202 with keeping the predetermined distance therebetween. Similarly, the second fixed electrodes 23a to 23d are connected to the secondary frame portion 247 side via the trench 257 (trench in which the insulating material such as oxide film is buried therein), and are electrically insulated from the secondary frame portion 247. Furthermore, the second fixed electrodes 23a to 23d confront with another side of the secondary movable electrodes 13a to 13d, which are arranged above the upper surface of the buried oxide film 202 with keeping the predetermined distance therebetween.

The primary oscillatory mass 240 positions inner side of the primary frame portion 243, and is supported by the two anchor portions 260a, 260b, which are protruded from the primary frame portion 243 that supports the primary oscillatory mass 240, via the beam portions 261a, 261b.

Four primary movable electrodes 251a to 251d are protruded from one side surface (left side surface in FIG. 50) of the secondary frame portion 247 via the trench 257; and four primary movable electrodes 252a to 252d are protruded from another side surface (right side surface in FIG. 50) of the secondary frame portion 247 via the trench 257. The primary movable electrodes 251a to 251d, 252a to 252d constitute a comb-shape in which each of which extends in parallel with each other with an equal distance.

The primary excitation fixed electrodes 244a to 244f, 245a to 245f are fixed to the primary frame portion 243. The primary excitation fixed electrodes 244a to 244f are respectively connected to the primary frame portion 243 via the trench 257, and are electrically insulated from the primary frame portion 243. The primary excitation fixed electrodes 244a to 244f confront with side surfaces of the primary movable electrodes 251a to 251d, which are arranged above the upper surface of the buried oxide film 202 with keeping the predetermined distance therebetween. Similarly, the primary excitation fixed electrodes 245a to 245f are respectively connected to the primary frame portion 243 via the trench 257, and are electrically insulated from the primary frame portion 243. The primary excitation fixed electrodes 245a to 245f confront with side surfaces of the primary movable electrodes 252a to 252d, which are arranged above the upper surface of the buried oxide film 202 with keeping the predetermined distance therebetween.

In the beam-structure 241, as shown in FIG. 49, potentials of the first fixed electrodes 16a to 16d, 22a to 22b and the second fixed electrodes 17a to 17d, 23a to 23d are externally taken out from the wires 262, 263, 264, 265 formed on the oxide films 32, 33 (see FIG. 51) through upper portions of the beam portions 261a, 261b (see FIG. 50), the primary anchor portions 260a, 260b (see FIG. 50), and the primary frame portion 243, with being electrically insulated from the secondary frame portion 247.

Furthermore, potentials of the secondary movable electrodes 12a to 12d, 13a to 13d are externally taken out from the wire 266 formed on the oxide film through mass portion 11 and the beam portions 7, 8, through the primary anchor portions 260a, 260b, and the primary frame portion 243, with being electrically insulated from the secondary frame portion 247 as well as the first and second fixed electrodes.

In the primary oscillatory mass, potentials of the primary excitation fixed electrodes 244a to 244f, 245a to 245f are externally taken out from the wires 267, 268, 269, 270 formed on the oxide film as shown in FIG. 49. Furthermore, potentials of the primary movable electrodes 251a to 251d, 252a to 252d shown in FIG. 49 are externally taken out from the wires 271, 272, 273 formed on the oxide film through the secondary frame portion 247 and the beam portions 261a, 261b.

Next, a sectional structure of the yaw rate sensor will be explained with reference to FIG. 51.

The movable portion and the fixed portion of the yaw rate sensor structure are mainly made of monocrystalline silicon. The yaw rate sensor is made up of two oscillatory masses including the primary oscillatory mass 240 and the beam-structure (secondary oscillatory mass), each of which has an orthogonal flexibility. In detail, the yaw rate sensor is made up of the primary oscillatory mass 240 formed with keeping a predetermined distance between the primary base plate portion 242 and the beam-structure 241 formed in the primary oscillatory mass 240.

In detail, the laterally extending primary hollow 248 is formed in an upper portion of the support substrate 201 of the SOI substrate 200. The through hole 250 is formed in a circular shape to the buried oxide film 202, whose back surface is exposed to the primary hollow 248. Furthermore, the hollow 253 is formed in a circular shape in the semiconductor layer 203 of the SOI substrate 200, and is communicated with the through hole 250. The trenches 249a to 249d reaching the hollow 3 are formed in the semiconductor layer 203. In this structure, the primary oscillatory mass 240 is built in the SOI substrate 200. In this primary oscillatory mass 240, the hollow 254 is formed in the semiconductor layer 203, and the trenches 255a to 255d formed in the semiconductor layer 203 reaches the hollow 254 as well. Hence, the secondary oscillatory mass 241 is built in the primary oscillatory mass 240.

The mass portion 11 and the secondary movable electrodes 12a to 12d, 13a to 13d of the beam-structure 241 are arranged with keeping a predetermined distance from the buried oxide film 202. In the primary oscillatory mass 240, the secondary frame portion 247 of the beam-structure is supported to the buried oxide film 202, and the secondary excitation fixed electrodes 16a to 16d, 17a to 17d, 22a to 22d, 23a to 23d are arranged with keeping a predetermined distance from the buried oxide film 202. The primary excitation fixed electrodes 244a to 244f, 245a to 245f are formed to the primary frame portion 243. The primary excitation fixed electrodes 244a to 244f are fixed to the primary frame portion 243 via the insulating material 256 in which the oxide film is buried in the trench 257, and are electrically insulated from the primary frame portion 243 by the insulating material 256. Sidewall protection films 258 are respectively formed at sidewalls of the mass portion 11, the secondary frame portion 247, and primary excitation fixed electrodes 244a to 244f, 245a to 245f. Oxide films 32, 33 are formed on the mass portion 11, the secondary frame portion 247, and primary excitation fixed electrodes 244a to 244f, 245a to 245f.

Next, operations of the yaw rate sensor will be explained.

At first, the primary oscillatory mass 240 shown in FIG. 50 is oscillated (excited) in the (1 0 0) direction, by applying cyclic voltage such as sine wave voltage or rectangular alternating voltage between the primary excitation fixed electrodes 244a to 244f, 245a to 245f and the primary movable electrodes 251a to 251d, 252a to 252d.

In this case, phase of electrostatic force generated between the primary excitation fixed electrodes 244a to 244f and the primary movable electrodes 251a to 251d and phase of electrostatic force generated between the primary excitation fixed electrodes 245a to 245f and the primary movable electrodes 252a to 252d are shifted by PI ($\pi$) radian. Hence, the primary oscillatory mass 240 can be efficiently oscillated. Here, when an angular velocity $\Omega$ is acted about the (0 0 1) direction as shown in FIG. 50, Corioli's force is acted to entire primary oscillatory mass along the (0 1 0) direction. Since the primary oscillatory mass 240 has substantially no flexibility toward the (0 1 0) direction, 2 mv$\Omega$ of Corioli's force is acted to the beam-structure 241 having flexibility toward the (0 1 0) direction.

A first capacitor is defined between the secondary movable electrodes 12a to 12d and the first fixed electrodes 16a to 16d, and a second capacitor is defined between the secondary movable electrodes 12a to 12d and the second fixed electrodes 17a to 17d. Similarly, a first capacitor is defined between the secondary movable electrodes 13a to 13d and the first fixed electrodes 22a to 22d, and a second capacitor is defined between the secondary movable electrodes 13a to 13d and the second fixed electrodes 23a to 23d.

When Corioli's force is acted to the beam-structure 241, each of the capacitances of the first and second capacitor is periodically changed. The angular velocity $\Omega$ acted to the sensor can be detected by detecting the periodic change of the capacitances by using synchronous detection with respect to the periodic change of the displacement of the primary oscillatory mass 240.

As described the above, according to this sensor structure, the primary base plate portion 242, the primary frame portion 243, the primary oscillatory mass 240, and primary excitation fixed electrodes 244a to 244f, 245a to 245f are divided each other by the primary hollow 248 formed in the support substrate 201 of the SOI substrate, the through hole 250 formed in the buried oxide film 202, the hollow 253 formed in the semiconductor layer 203, and the primary trenches 249a to 249d. The secondary base plate portion 246, the secondary frame portion 247, the beam-structure 241, and secondary excitation fixed electrodes 16a to 16d, 17a to 17d, 22a to 22d, 23a to 23d are divided each other by the secondary hollow 254 formed in the semiconductor layer 203 in the primary oscillatory mass and the secondary trenches 255a to 255d. Furthermore, each of the electrodes is isolated by the insulating material 256 buried in the trenches, which are formed between the movable electrodes and the frame portion and between the fixed electrodes and the frame portion.

In this way, since the SOI substrate is used in a semiconductor physical quantity sensor, particular in an excitation type yaw rate sensor, in which the beam-structure having the movable electrodes and the fixed electrodes confronted with the movable electrodes are integrally formed in the SOI substrate, the sectional structure of the sensor can be simplified.

Next, a method of manufacturing will be explained with reference to FIGS. 52 to 58, each of which is a sectional view corresponding to the sectional view in FIG. 51.

At first, as shown in FIG. 30, an SOI substrate 200 made up of a support substrate 201, a buried oxide film 202, and a semiconductor layer 203 is provided. A trench 257 is patterned to the semiconductor layer 203. Furthermore, a silicon oxide film is formed on the semiconductor layer 203, the trench 257 is filled, and an upper surface of the semiconductor layer 203 is covered with an oxide film 32. In this way, an anisotropic etching is conducted from the upper surface of the semiconductor layer 203 of the SOI substrate 200 to form the first trench 257, which is vertically extended and is for electrically insulated the movable electrodes and the fixed electrodes from the frame portion. The trench 257 is filled with the insulating material 256. In other words, the trench for insulating the secondary movable electrodes 12a to 12d, 13a to 13d shown in FIG. 50 from the secondary frame portion 247 is formed; the trenches for insulating the primary movable electrodes 251a to 251d, 252a to 252d from the secondary frame portion 247 is formed; the trenches for insulating the secondary excitation fixed electrodes 16a to 16d, 17a to 17d, 22a to 22d, 23a to 23d from the secondary frame portion 247 is formed; and the trenches for insulating the primary excitation fixed electrodes 244a to 244f, 245a to 245f from the primary frame portion 243 is formed. After that, these trenches are filled with the insulating material 256.

Figure 53:
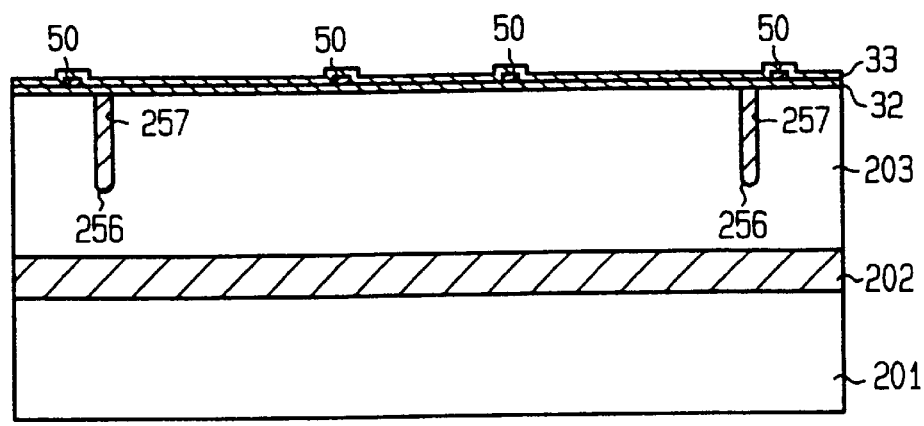

Furthermore, as shown in FIG. 53, a wire material is formed and is patterned to form a wire pattern. Next, an oxide film 33 is formed to cover the wire pattern 50.

Figure 54:
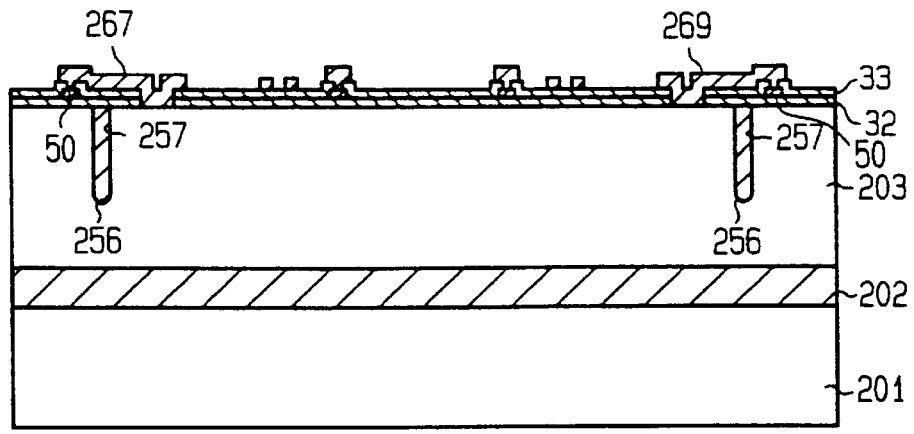

After that, as shown in FIG. 54, contact holes are formed by partly removing the oxide film 33 formed on the semiconductor layer 203 and the wire material 50. Furthermore, wire materials 267, 269 are formed and are patterned.

Figure 55:
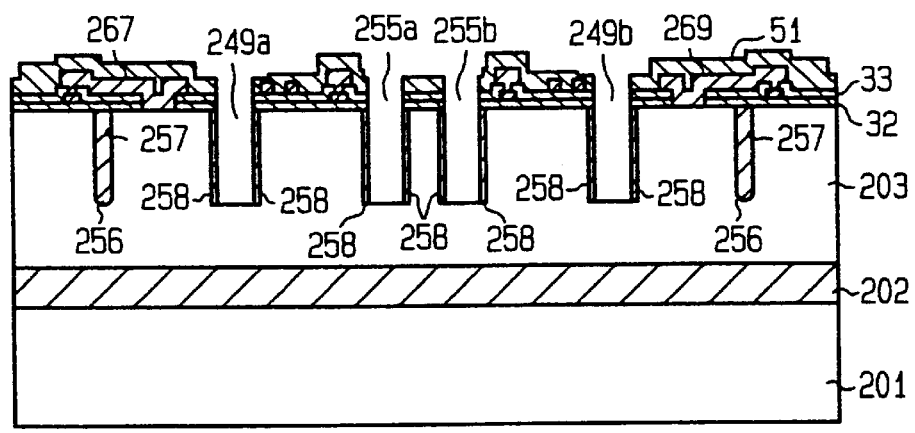

As shown in FIG. 55, a mask 51 for forming a structure is formed on the SOI substrate 200 by using a photolithography. Next, anisotropic etching is conducted from the upper surface of the semiconductor layer 203 through the mask 51 so as to form vertically extending second trenches 249a to 249d, 255a to 255d, which define and form the primary base plate portion 242, the primary frame portion 243, the primary oscillatory mass 240, the primary excitation fixed electrodes 244a to 244f, 245a to 245f, the secondary base plate portion 246, secondary frame portion 247, the beam-structure 241, and the secondary excitation fixed electrodes 16a to 16d, 17a to 17d, 22a to 22d, 23a to 23d. Here, the trenches have a depth so as not to reach the buried oxide film 202.

Furthermore, protection film 258 for protecting the sidewall before an isotropic etching is formed on the inner wall surface of the trenches 249a to 249d, 255a to 255d. After that, parts of protection films, which are attached to bottom surfaces of the trenches, are removed. Thus, the protection film 258 is formed on the sidewalls of the trenches 249a to 249d, 255a to 255d except of the bottom surfaces of the trenches 249a to 249d, 255a to 255d.

Here, it needs to select a material of the protection film 258 from one suitable for manufacturing process. In detail, the protection film 258 may be formed by: forming polymer or the like during the trench etching; forming oxide film; depositing oxide film by CVD or the like; forming thin oxide film by $O_2$ plasma or the like; or forming oxide film by chemical. When there is no thermal step, the wire materials 267, 269 may be made of metallic wire such as aluminum or polysilicon or the like. On the contrary, when there is a thermal step, the wire materials 267, 269 may be made of high melting point metal such as tungsten or its alloy, or polysilicon.

Figure 56:
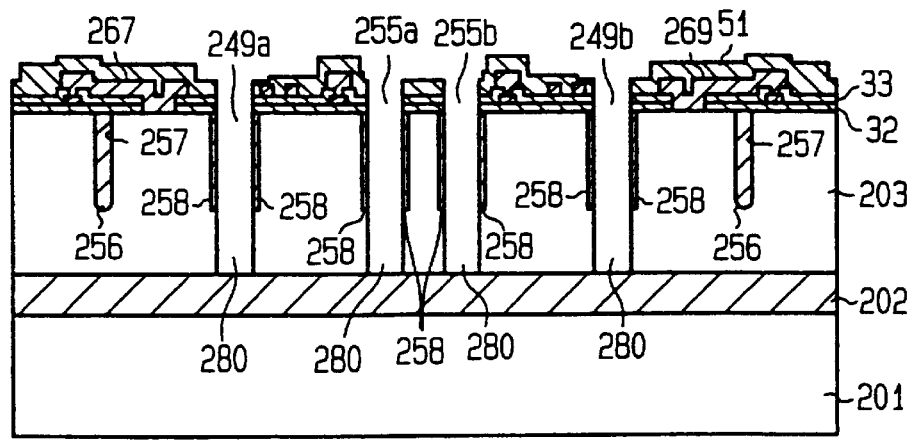

Next, as shown in FIG. 56, the anisotropic etching is continuously conducted through the mask 51 so as to form a third trench 280, which is vertically extended from bottom surface of the second trenches 249a to 249d, in the semiconductor layer 203. In the case of forming the third trench 280, the etching is advanced until the trench reaches the buried oxide film 202.

Here, it needs to select a etching condition so that the sidewall protection film 258 formed in the previous step is not substantially etched, or so that an etching amount of the sidewall protection film 258 is small enough to have no influence to the later steps.

Figure 57:
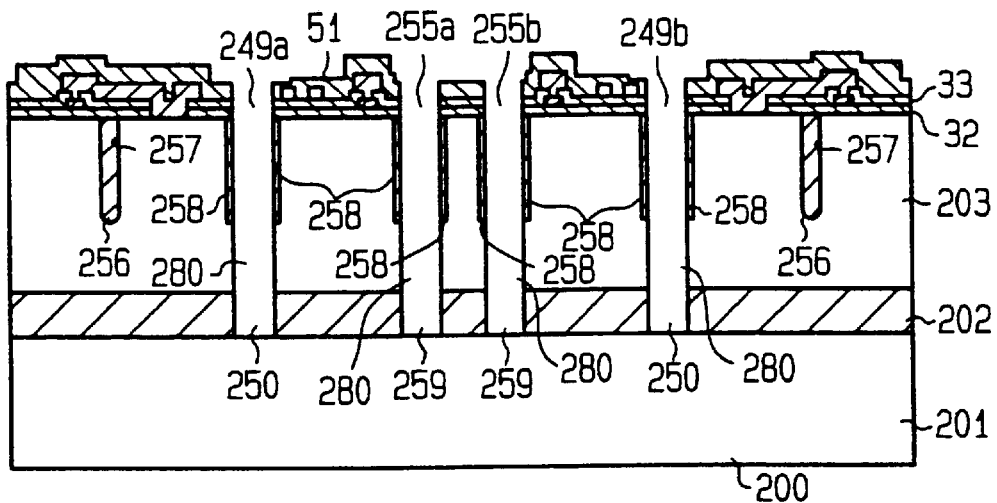

After that, as shown in FIG. 57, the etching for the buried oxide film 202 is continuously conducted through the mask 51 so as to form the through holes 250, 259, which are vertically extended in the buried oxide film 202 at the bottom surface of the third trench 280. That is, the through holes 250, 259 are formed so as to reach the support substrate 201.

Figure 58:
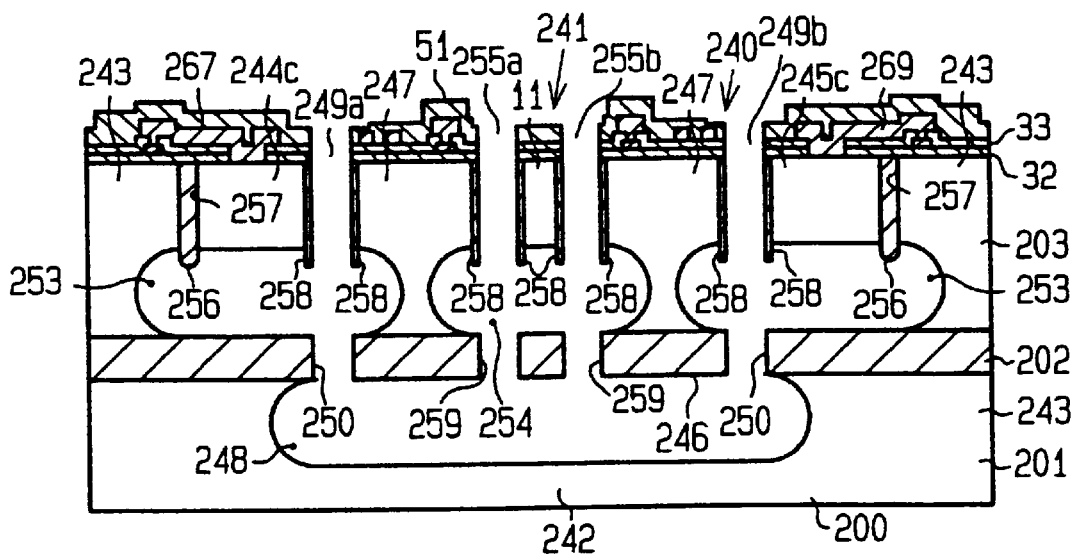

Next, the isotropic etching is conducted to the semiconductor layer 203 and the support substrate 201 through the third trench 280 and the through holes 250, 259 so as to form laterally extending hollows 253, 254, 248, as shown in FIG. 58. Thus, it can define and form the primary base plate portion 242, the primary frame portion 243, the primary oscillatory mass 240, the primary excitation fixed electrodes 244a to 244f, 245a to 245f, the secondary base plate portion 246, the secondary frame portion 247, the beam-structure 241, and the secondary excitation fixed electrodes 16a to 16d, 17a to 17d, 22a to 22d, 23a to 23d.

In this case, since the etching speed of the anisotropic etching to the buried oxide film 202 is sufficiently low, the oxide film 202 is hardly etched even if the buried oxide film 202 is exposed as a result the oxide film 203 is etched. Furthermore, in this isotropic etching, it needs to select the combination so that the protection films 40, 42 are not etched. When a plasma etching process using gas such as $SF_6$ or $CF_4$ is applied in the isotropic etching, throughput of forming the structure after etching can be improved compared to a wet etching step.

Finally, the acceleration sensor shown in FIG. 51 can be completed by removing the etching mask 51.

As described the above, it can build the primary oscillatory mass 240 having the orthogonal flexibility and the beam-structure 241 in one SOI substrate 200.

As described the above, it can use-an SOI substrate as a start wafer in manufacturing in a semiconductor physical sensor, particular in an excitation type yaw rate sensor, in which the beam-structure 241 having the movable electrodes and the fixed electrodes confronted with the movable electrodes are integrally formed in one substrate, and it can largely reduce a manufacturing cost of the sensor because it does not need to apply the bonding step of the substrates.

Seventh Embodiment

Next, a seventh embodiment of the present invention will be explained. Here, differences between the sixth embodiment will be mainly described.

Figure 59:
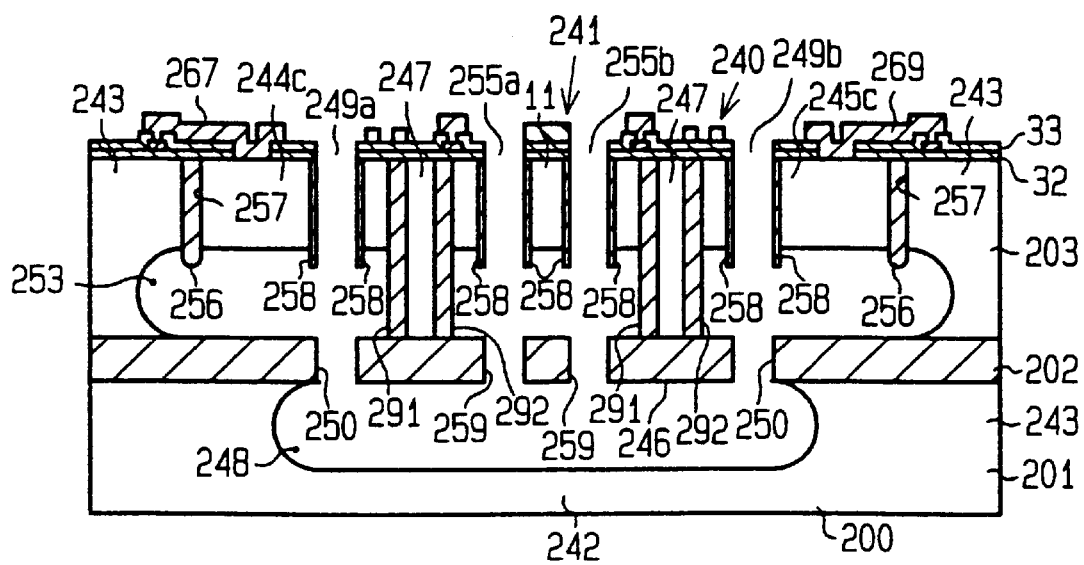
FIG. 59 is a sectional view of a yaw rate sensor of a seventh embodiment according to the present invention.

FIG. 59 shows a sectional view of a yaw rate sensor of this embodiment. This structure has the substantially the same structure as that of FIG. 51 of the sixth embodiment except that the frame portion 247 of the beam-structure is connected and supported to the buried oxide film 202 via props 291, 292 made of oxide film.

Next, a method of manufacturing this yaw rate sensor will be explained with reference to FIGS. 60 to 66.

Figure 60:
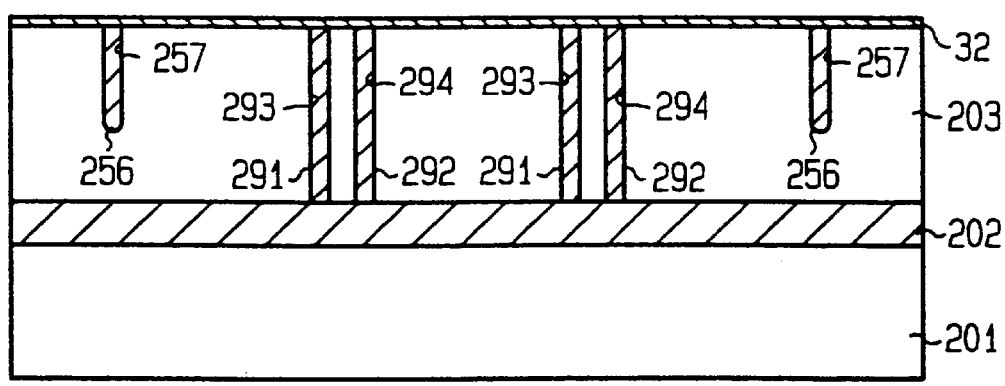
FIGS. 60 to 66 are sectional views for illustrating each step of a method of manufacturing of the seventh embodiment.
Figure 61:
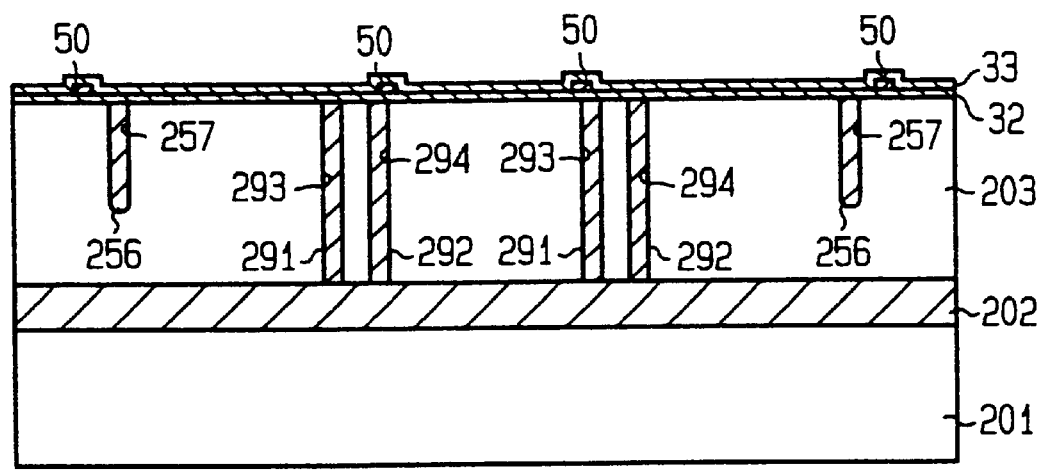
Figure 62:
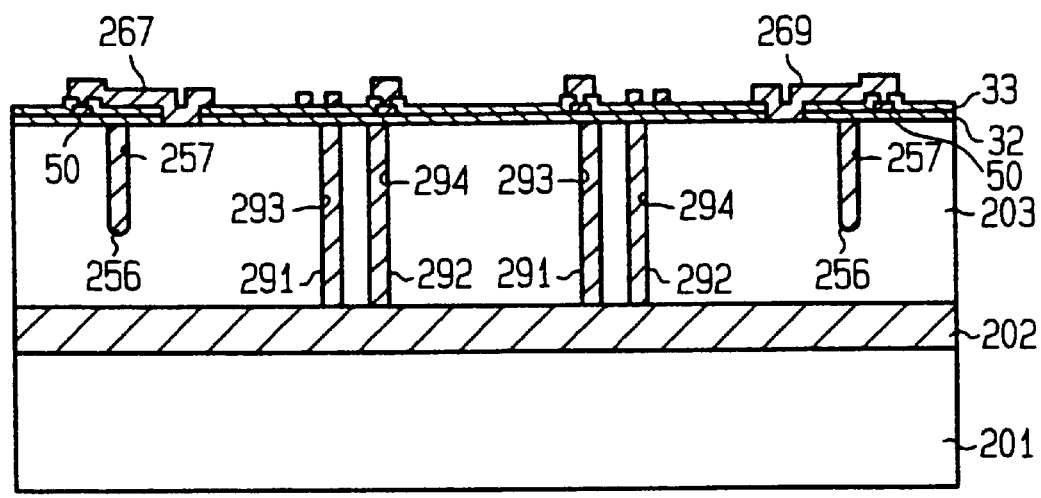

At first, as shown in FIG. 60, trenches 257, 293, 294 are patterned and formed in a semiconductor layer 203 of an SOI substrate 200. Here, the trenches 293, 294 reach a buried oxide film 202. A silicon oxide film is formed on the semiconductor layer 203; the trenches 257, 293, 294 are filled; and the semiconductor layer 203 is covered with an oxide film 32. As shown in FIG. 61, a wire material is formed and is patterned to form a wire pattern. Next, an oxide film 33 is formed to cover the wire pattern 50. As shown in FIG. 62, contact holes are formed by partly removing the oxide film 33 formed on the semiconductor layer 203 and the wire material 50. Furthermore, wire materials 267, 269 are formed and are patterned.

Figure 63:
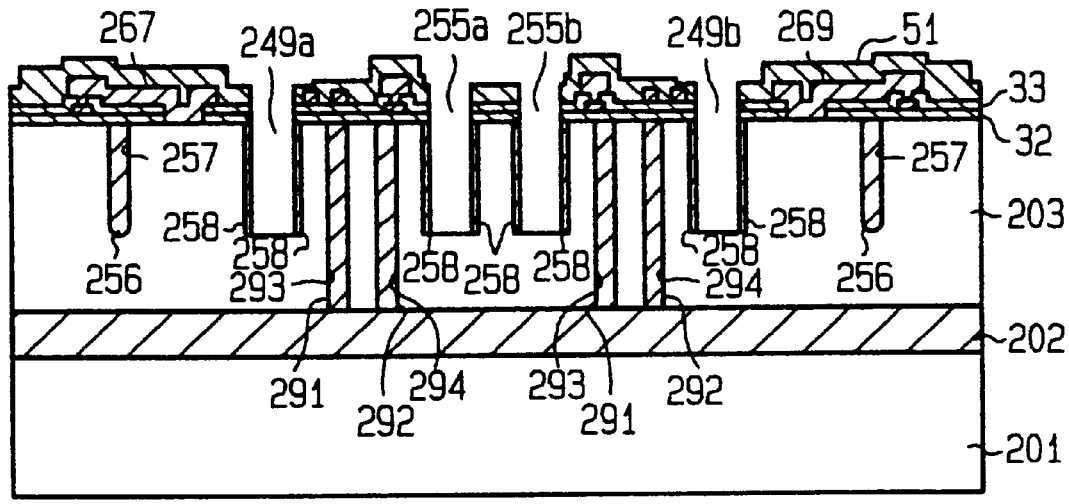

As shown in FIG. 63, a mask 51 for forming a structure is formed on the SOI substrate 200 by using a photolithography. Next, anisotropic etching (trench etching) is conducted from the upper surface of the semiconductor layer 203 through the mask 51 so as to form vertically extending second trenches 249a to 249d, 255a to 255d. Here, the trenches have a depth so as not to reach the buried oxide film 202. Furthermore, protection film 258 for protecting the sidewall before an isotropic etching is formed on the inner wall surface of the trenches 249a to 249d, 255a to 255d. After that, parts of protection films, which are attached to bottom surfaces of the trenches, are removed.

Figure 64:
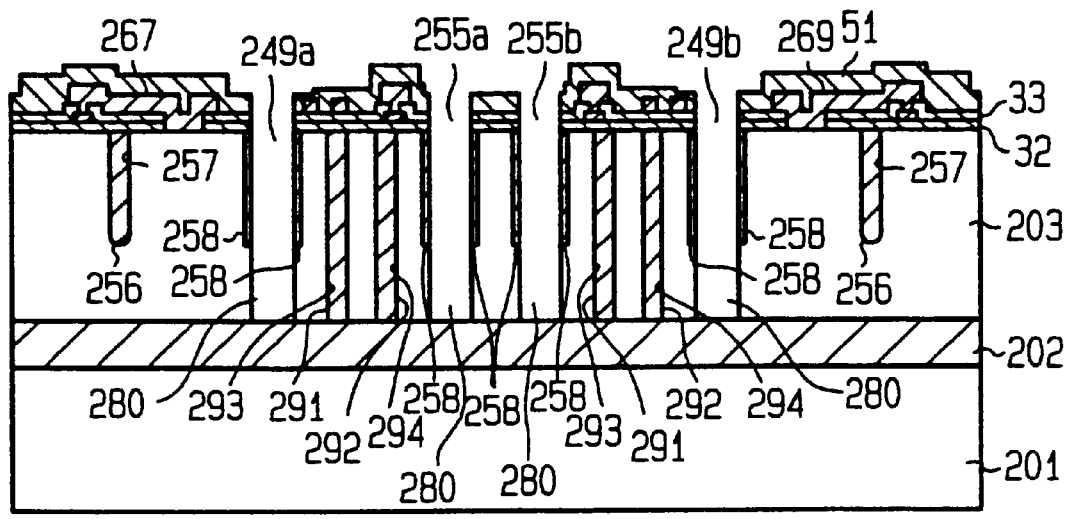
Figure 65:
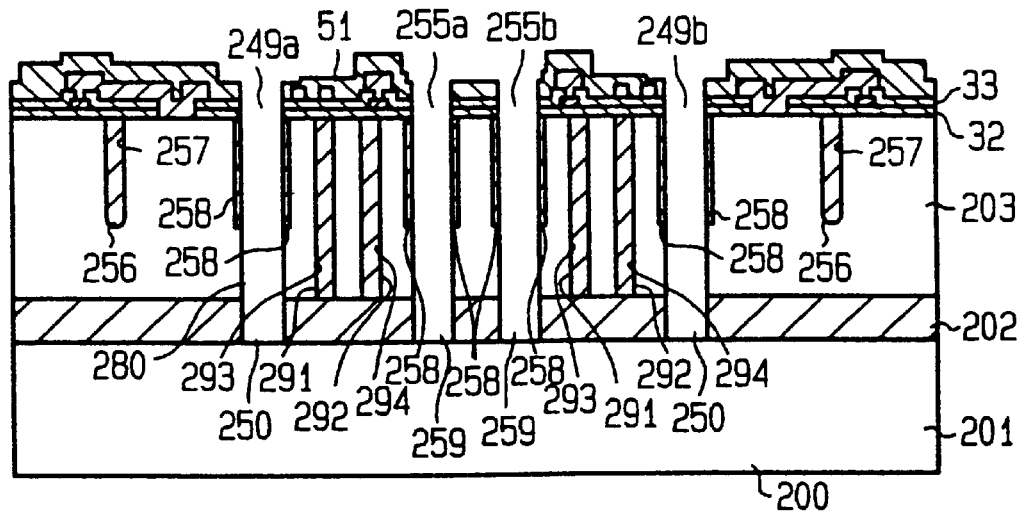

Next, as shown in FIG. 64, the anisotropic etching is continuously conducted through the mask 51 so as to form trenches 280, which are vertically extended from bottom surface of the trenches 249a to 249d, in the semiconductor layer 203. After that, as shown in FIG. 65, the etching for the buried oxide film 202 is continuously conducted through the mask 51 so as to form the through holes 250, 259, which reach the support substrate 201.

Figure 66:
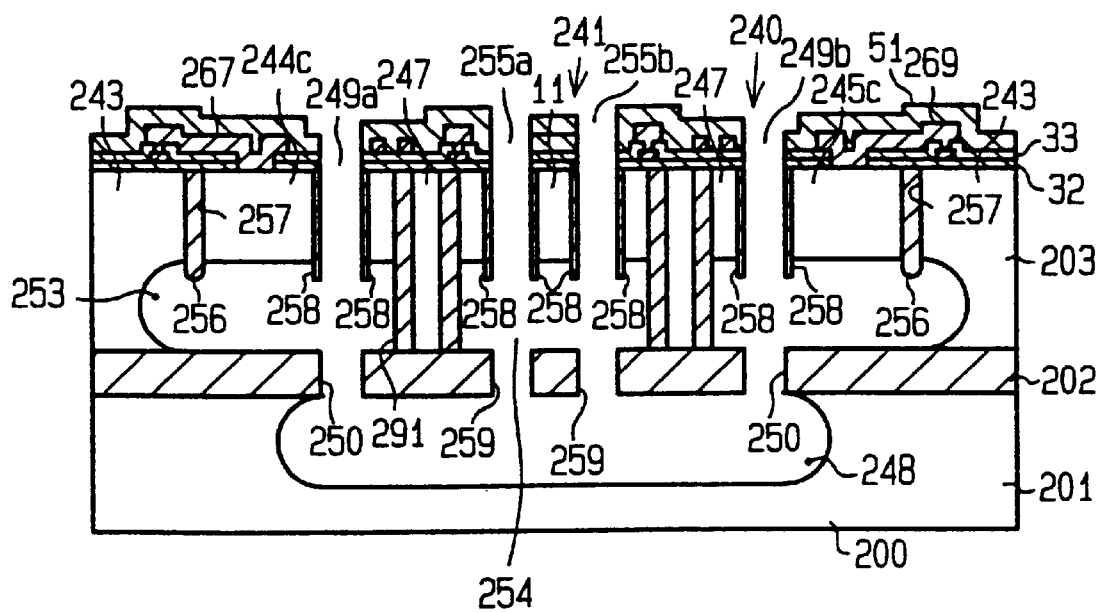

Next, as shown in FIG. 66, the isotropic etching is conducted to the semiconductor layer 203 and the support substrate 201 so as to form laterally extending hollows 253, 254, 248.

Finally, the yaw rate sensor shown in FIG. 59 can be completed by removing the etching mask 51.

In the case of FIG. 51, when a width of the frame portion for supporting the beam-structure is narrow, the silicon between the buried oxide film 202 and the frame portion 247 for supporting the beam-structure may be completely removed during the isotropic etching. However, this embodiment can prevent this by applying the above-described support structure.

Here, the structures shown in FIGS. 12, 13 (the center portion of the insulating trench as plan structure is protruded toward the tip portion), or the structures shown in FIGS. 14, 15 (the material to be buried in the trenches is made of low stress material covered by insulating material) may be applied to this embodiment (the first and the second oscillatory mass are formed by using the SOI substrate).

Other Modifications

The above-described embodiments may be modified as follows.

[1] The sidewall protection film of the trench (e.g., the sidewall protection films 40, 42 in FIG. 4) may be removed before completing the final step. By applying this modified step, it can achieve long-term reliability of the sensor without exfoliation, which might occur with time, of the sidewall protection film.

[2] At least one part of the films on the beam-structure other than the wire material (e.g., the interlayer insulating films 32, 33 in FIG. 4) may be removed before completing the final step. By applying this modified step, it can prevent the beam-structure from deformation, which might occur by remaining stress of the film when the film remains on the beam-structure (particularly, in the case a thickness of the beam-structure is thin). In this case, it is preferable to remain the film beneath the wire material.

The above-described modifications [1], [2] are further explained.

Figure 67:
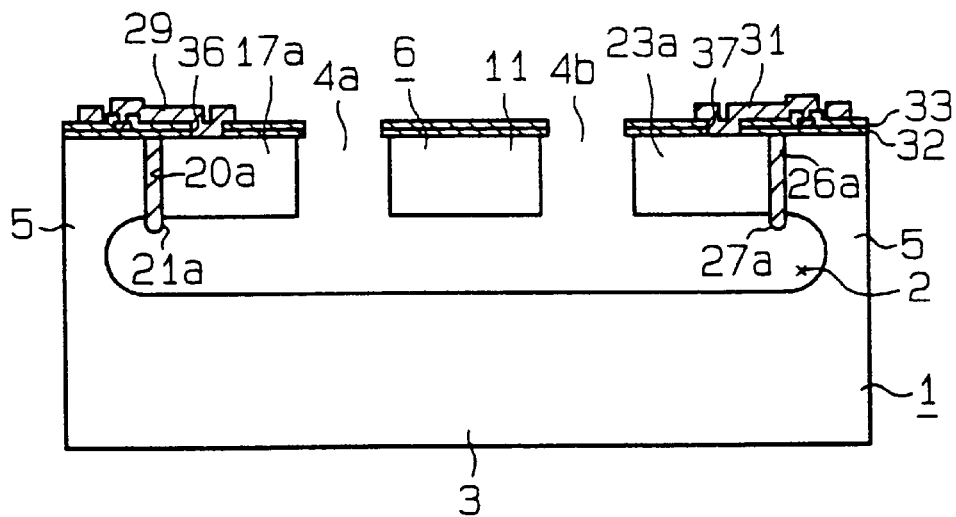
FIGS. 67 to 82 are sectional views for illustrating modifications.

In general, vehicles are designed so as to secure a guarantee of 19 years and 210,000 km. Regarding the modification [1], when this kind of sensors is applied to the vehicle sensors, the sidewall protection films 40, 42 shown in FIG. 4 are preferable to secure a long-term reliability. Therefore, it is preferable to finally remove the sidewall protection films 40, 42 as shown in FIG. 67 during or after etching step shown in FIG. 10.

Hereinafter, two cases in which a removing step is positively added and the removing step is not added are explained. In the case where the removing step is positively added, the sidewall protection films 40, 42 can be removed by conducting an ashing in O$_2$ plasma when the sidewall protection films 40, 42 are made of organic film such as polymer; or can be removed by conducting etching such as plasma dray etching having selectivity against silicon or HF vapor etching when the sidewall protection films 40, 42 are made of oxidation-based film. On the contrary, in the case where the removing step is not positively added, the sidewall protection films 40, 42 can be removed as follows. In the case of isotropic etching for forming the hollow 2, the hollow 2 can be etched with etching the sidewall protection films 40, 42. Therefore, thickness of the sidewall protection films 40, 42 is designed so that the sidewall protection films 40, 42 can be completely removed within an etching time of etching for the hollow 2. Thus, the sidewall protection films 40, 42 can be removed without applying the removing step. Particularly, it is effective when the sidewall protection films are formed sufficiently thin (some nanometers).

Figure 68:
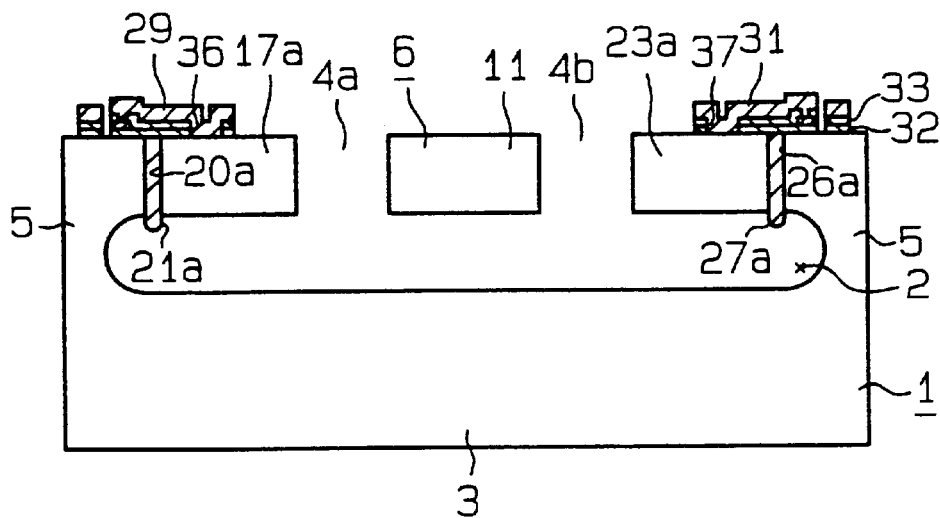

Regarding the modification [2], when the interlayer insulating films 32, 33 are remained on the beam-structure 6 after removing the etching mask 51 shown in FIG. 10, the beam-structure 6 might be deformed by an internal stress of the interlayer insulating films 32, 33. In such a case, the deformation can be prevented by partly removing the interlayer insulating films 32, 33 on the beam-structure 6 as shown in FIG. 68. The interlayer insulating films 32, 33 can be removed by plasma dry etching etc with a condition that can selectively etch silicon constituting the beam-structure 6 against the electrode material (e.g., aluminum). Here, when impurity diffusion layer or the like is formed on the entire surface of the beam-structure 6 at the step where the beam-structure 6 is formed, the beam-structure 6 might be deformed if the interlayer insulating films 32, 33 are removed. Therefore, in such a case, it is preferable to design the thickness of the interlayer insulating films 32, 33 so as to prevent the deformation without removing the interlayer insulating films 32, 33.

In this way, it is preferable to reduce an area of the oxide film or nitride film on the beam-structure 6 as small as possible. As described the above, when the film is remained on the beam-structure (particularly, a portion whose back surface is exposed by the etching) 6, the beam-structure 6 might deform due to the internal remaining stress of the film unless the thickness of the beam-structure is sufficiently thick. Therefore, when the thickness of the beam-structure 6 is thin (however, it depends on degree of a sectional secondary moment), it is practically preferable if the film of the beam-structure 6, at which does not concern with the wire, is partly removed as much as possible.

Figure 69:
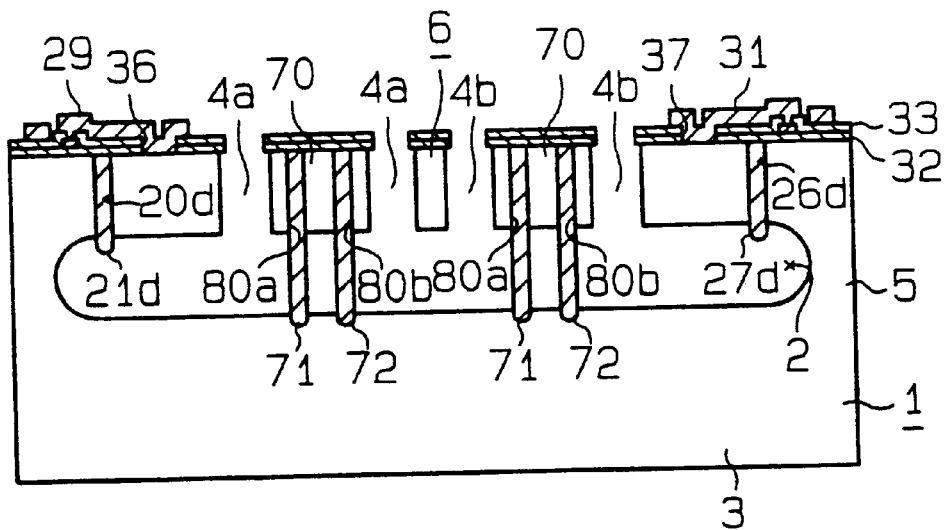
Figure 70:
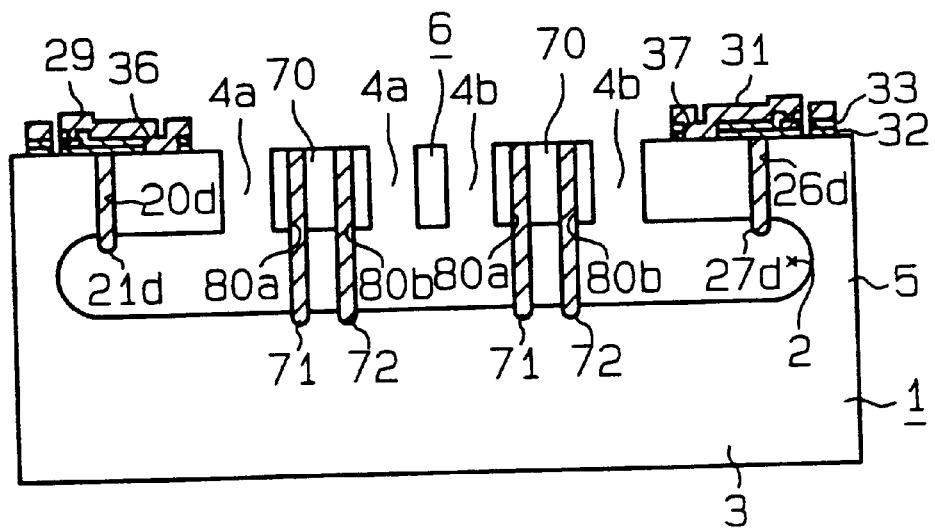

Similarly, regarding modification [1], the sidewall protection films 40, 42 shown in FIG. 24 may be removed as shown in FIG. 69. Regarding modification [2], the interlayer insulating films 32, 33 on the beam-structure 6 may be partly removed as shown in FIG. 70 when the interlayer insulating films 32, 33 are remained after removing the etching mask 51 shown in FIG. 24.

Figure 43:
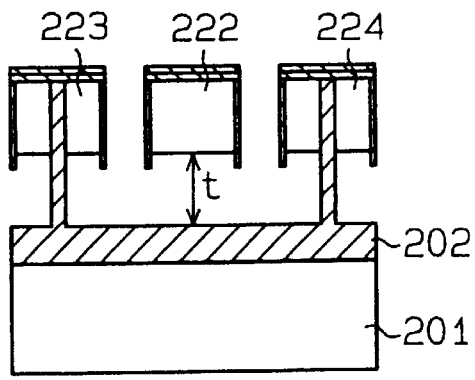
Figure 71:
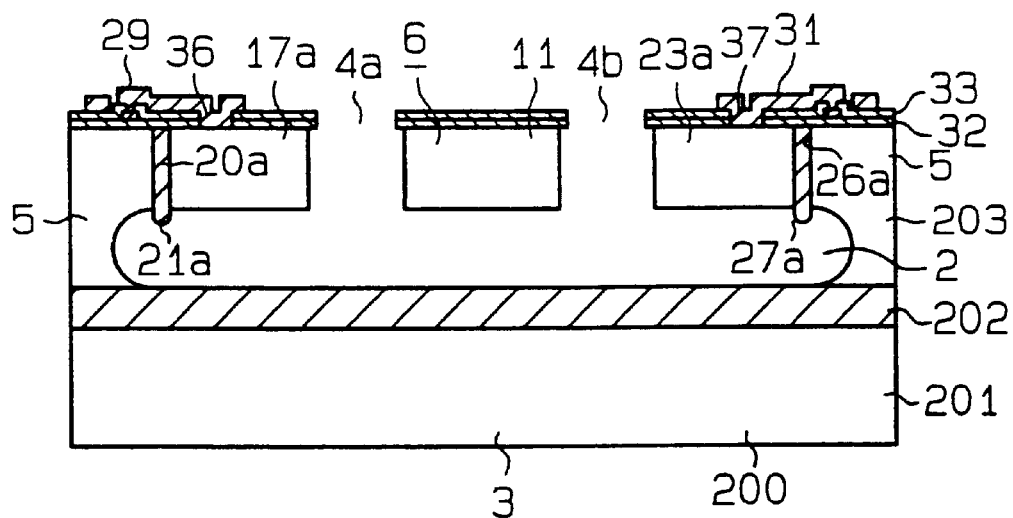
Figure 72:
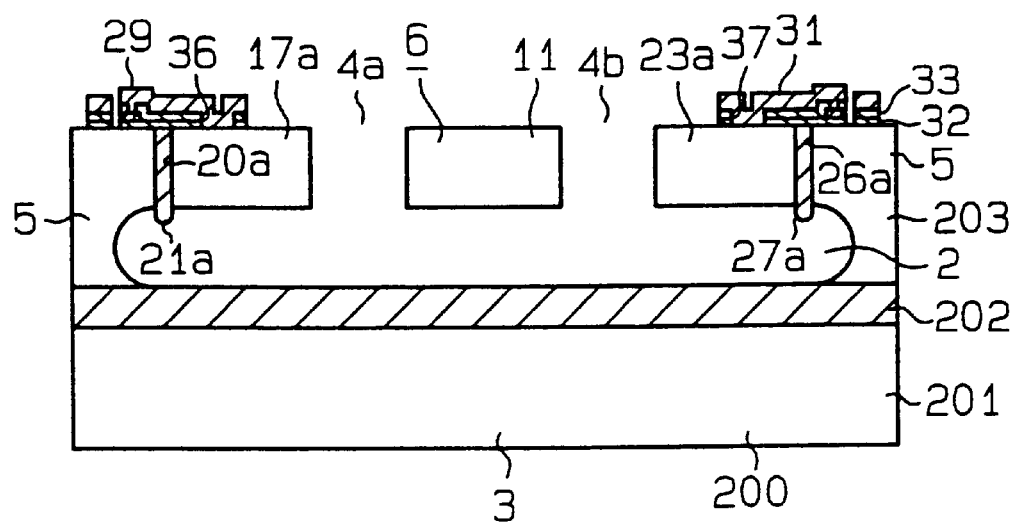
Figure 73:
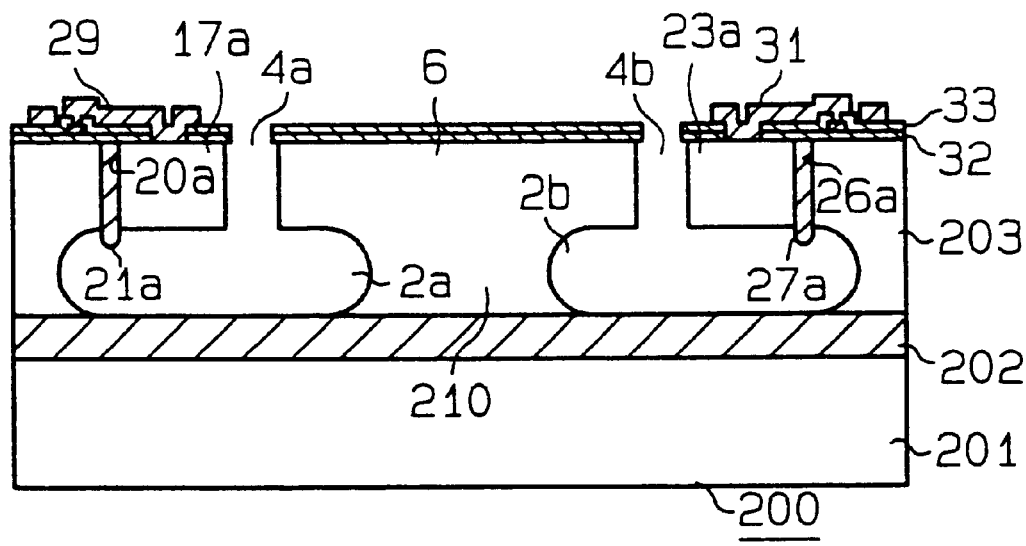
Figure 74:
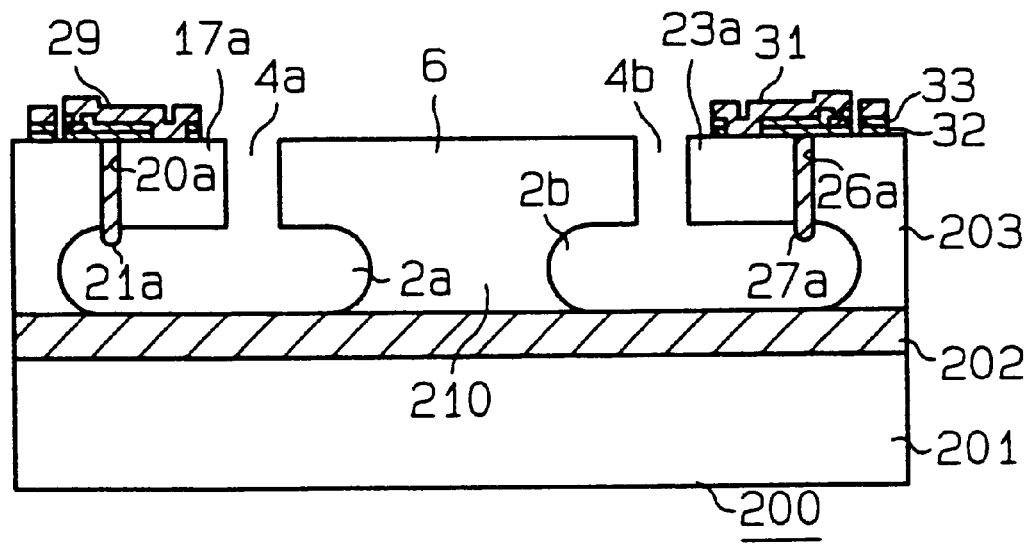
Figure 75:
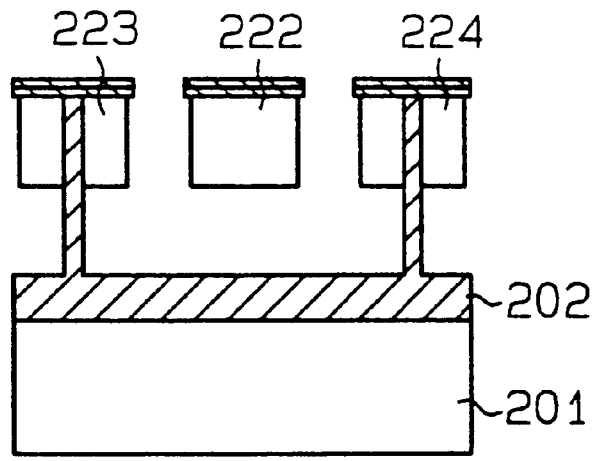
Figure 76:
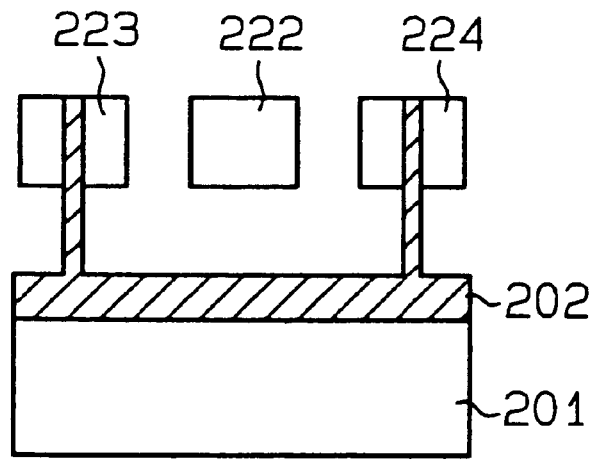
Figure 77:
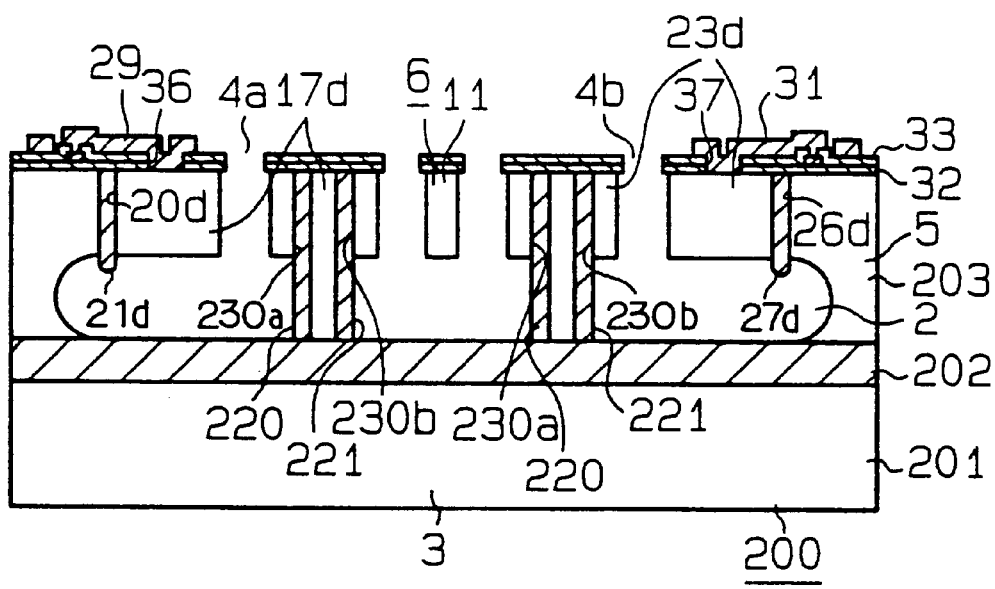
Figure 78:
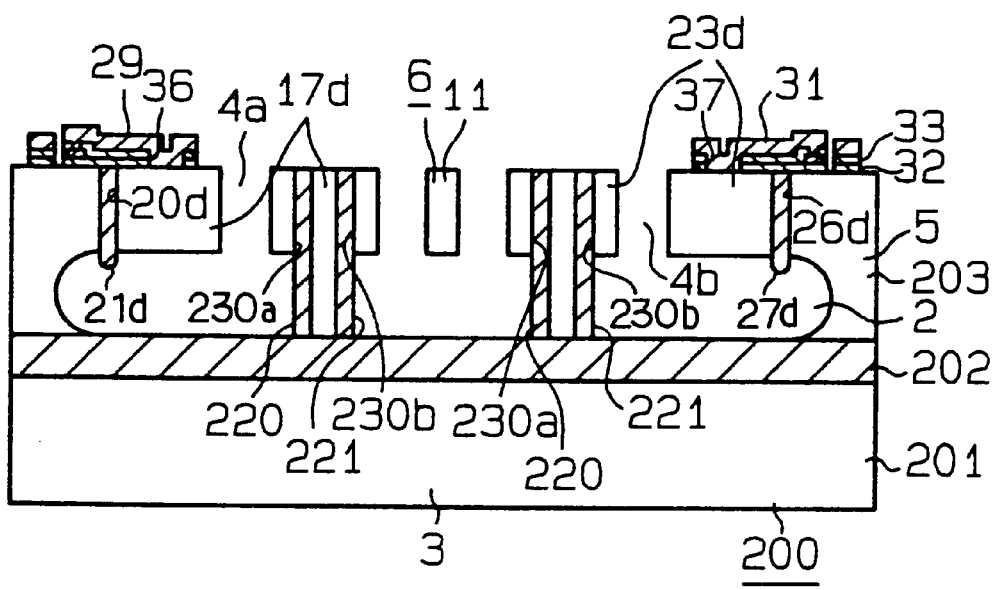
Figure 79:
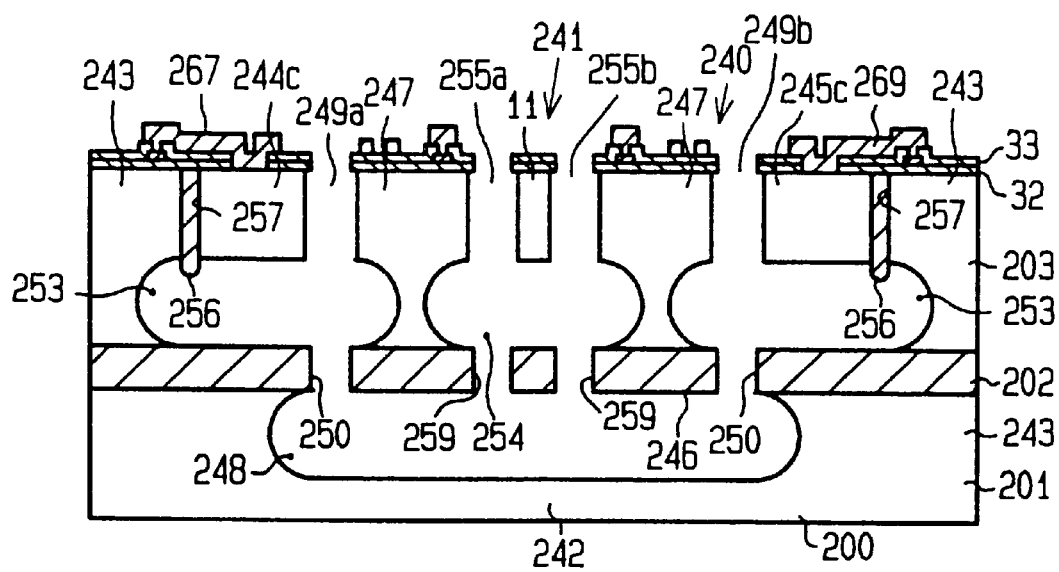
Figure 80:
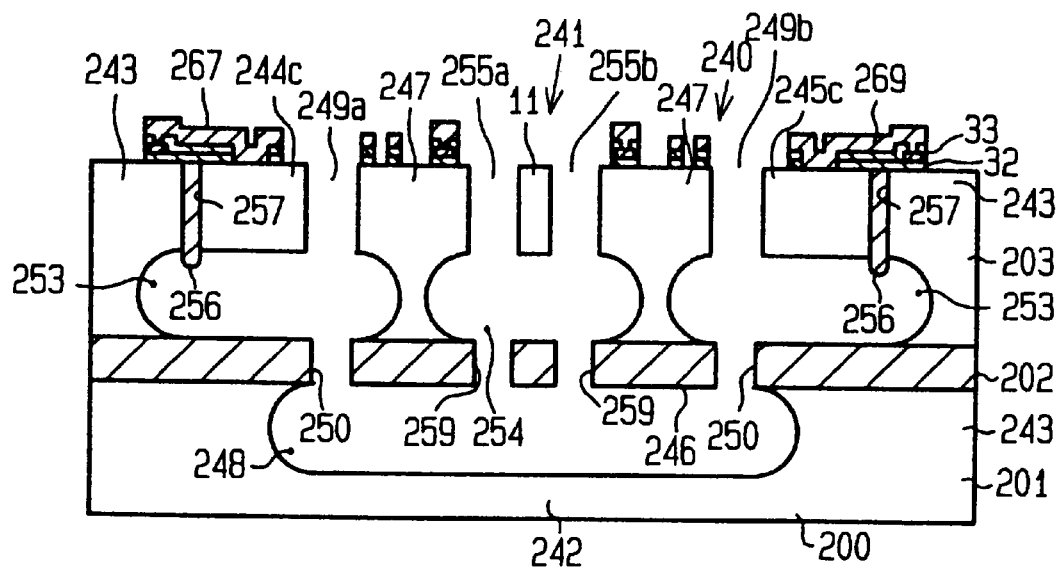
Figure 81:
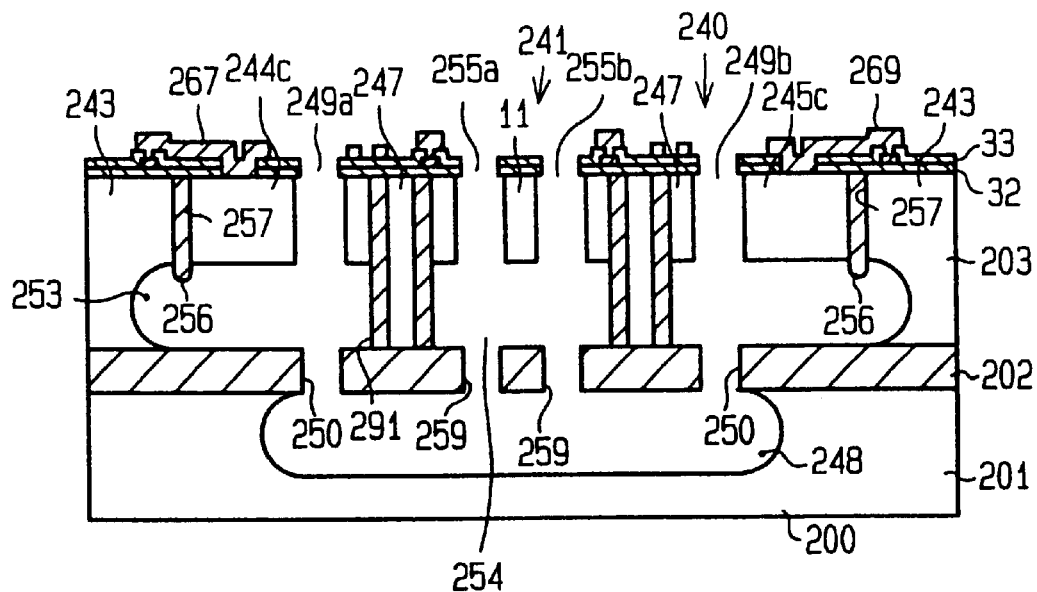
Figure 82:
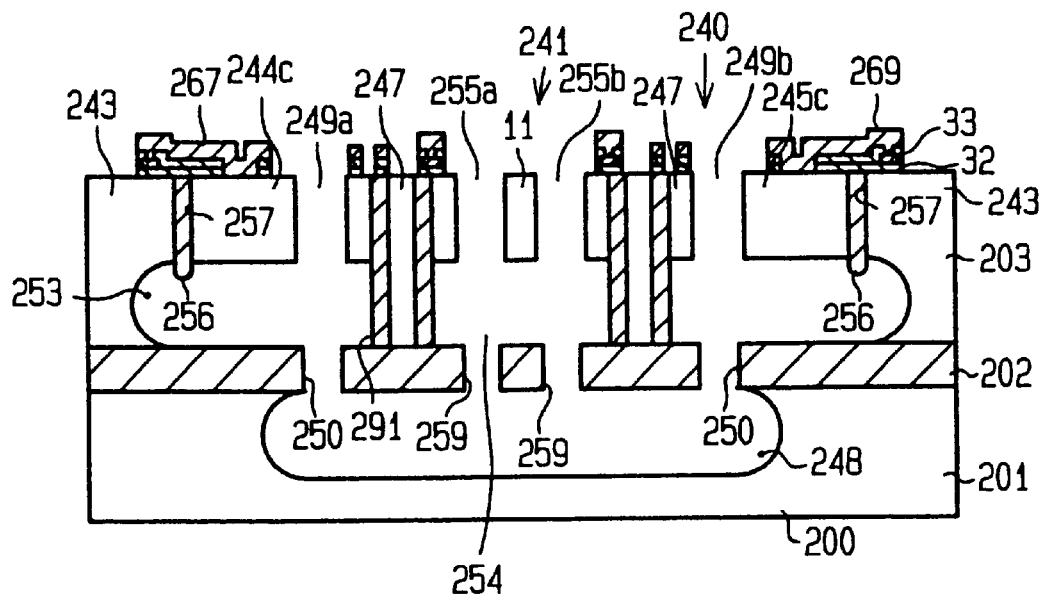
Figure 83:
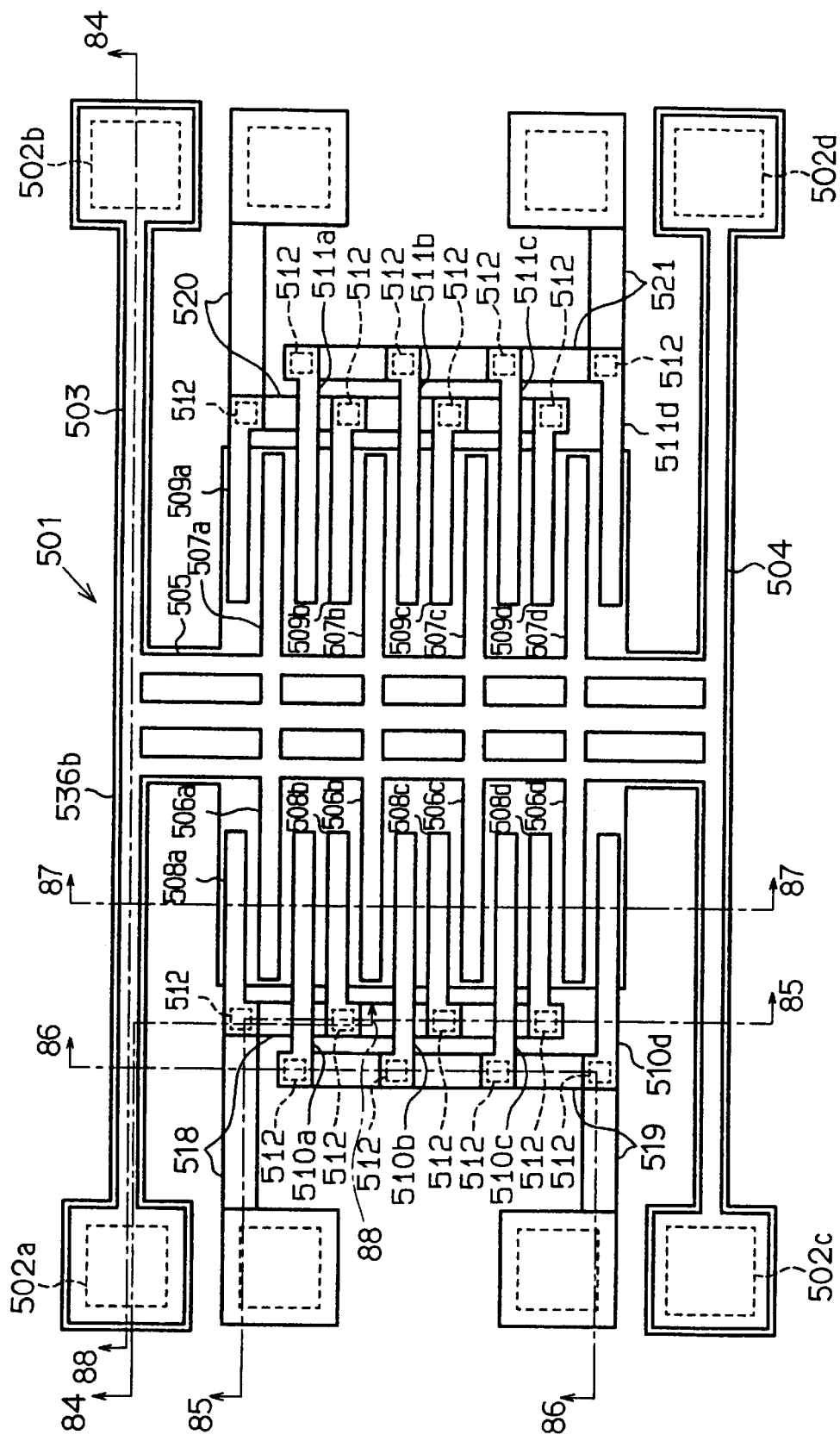
FIG. 83 is a plan view of a semiconductor acceleration sensor according to a prior art.
Figure 84:
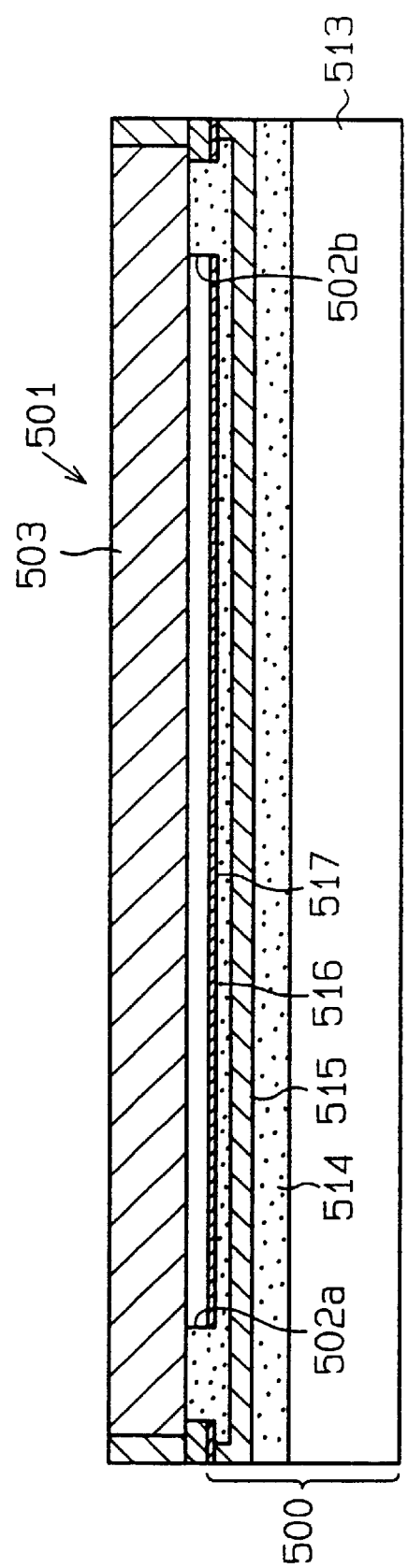
FIG. 84 is a sectional view taken along a line 84—84 in FIG. 83.
Figure 85:
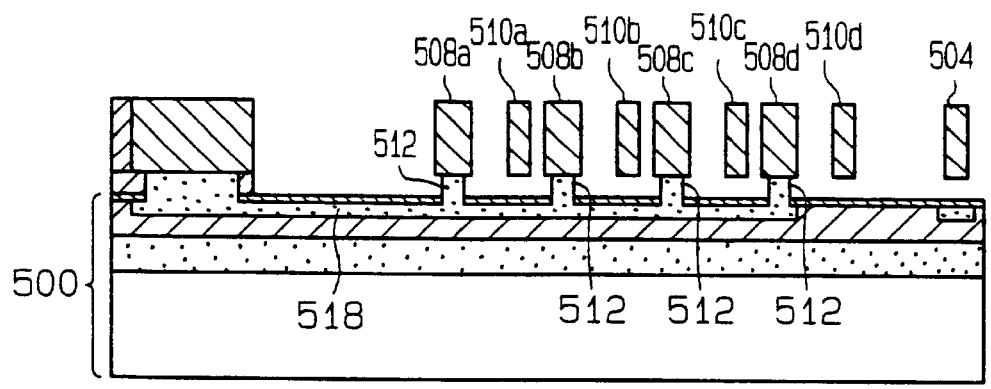
FIG. 85 is a sectional view taken along a line 85—85 in FIG. 83.
Figure 86:
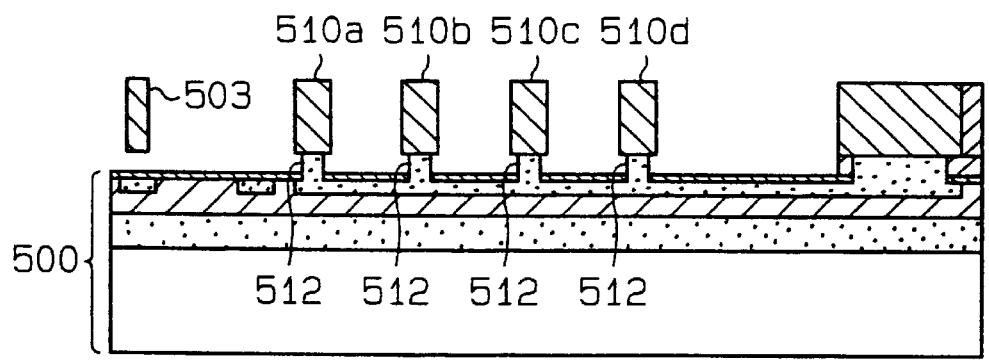
FIG. 86 is a sectional view taken along a line 86—86 in FIG. 83.
Figure 87:
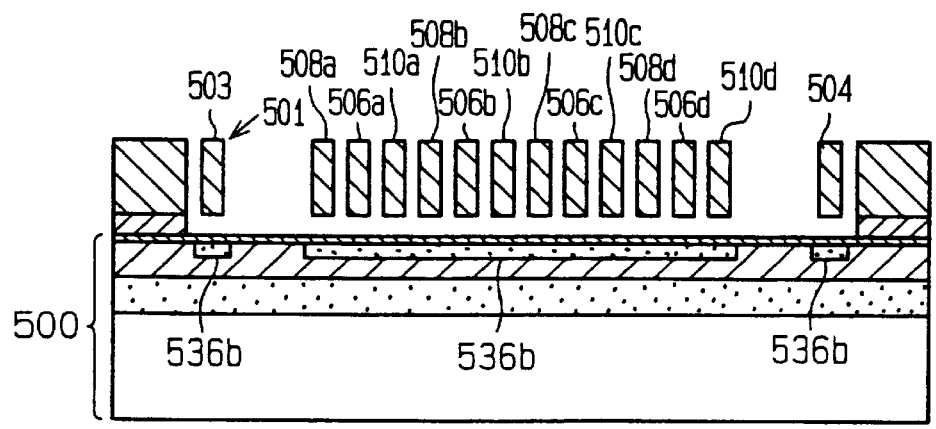
FIG. 87 is a sectional view taken along a line 87—87 in FIG. 83.
Figure 88:
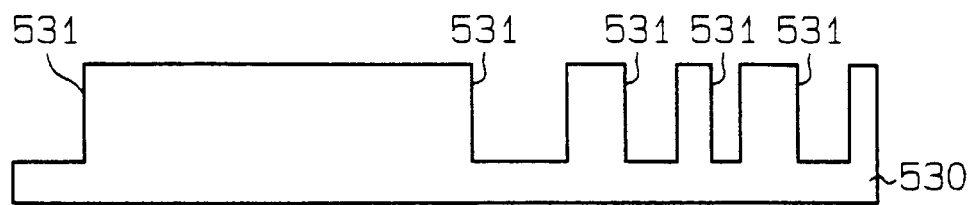
FIGS. 88 to 97 are sectional views taken along line 88—88 in FIG. 83, for illustrating each step of a method of manufacturing of the prior art.
Figure 89:
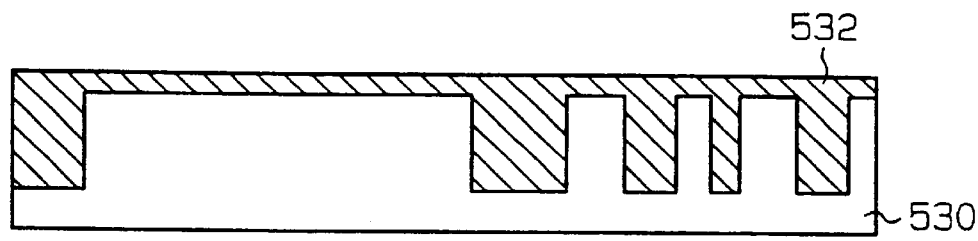
Figure 90:
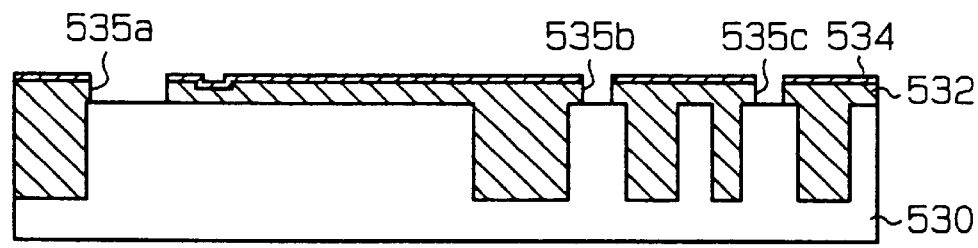
Figure 91:
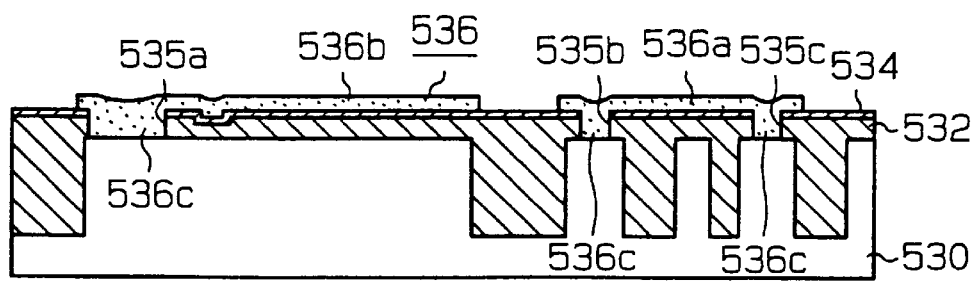
Figure 92:
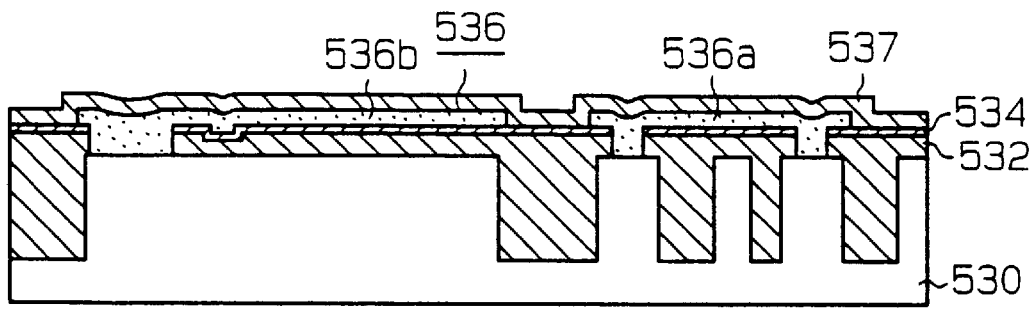
Figure 93:
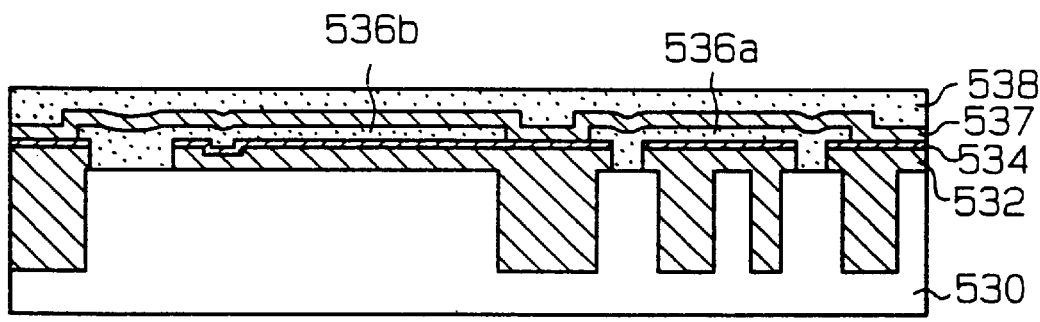
Figure 94:
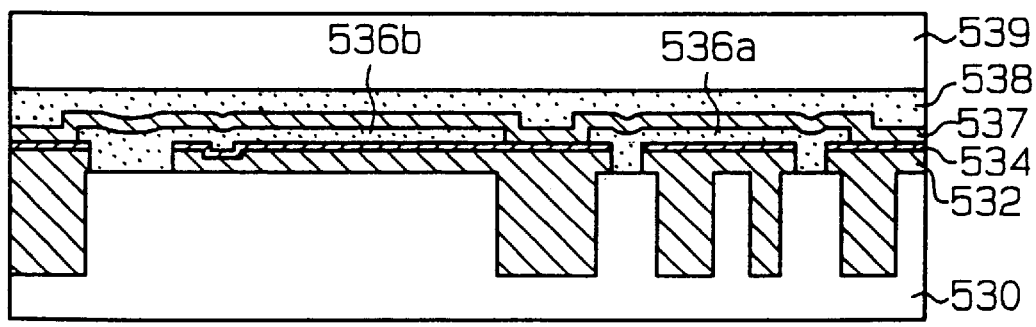
Figure 95:
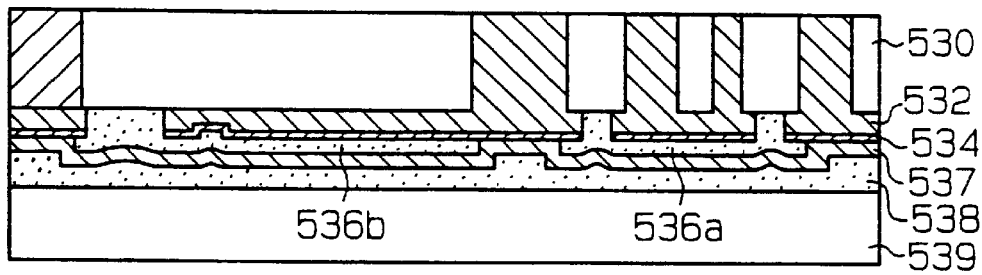
Figure 96:
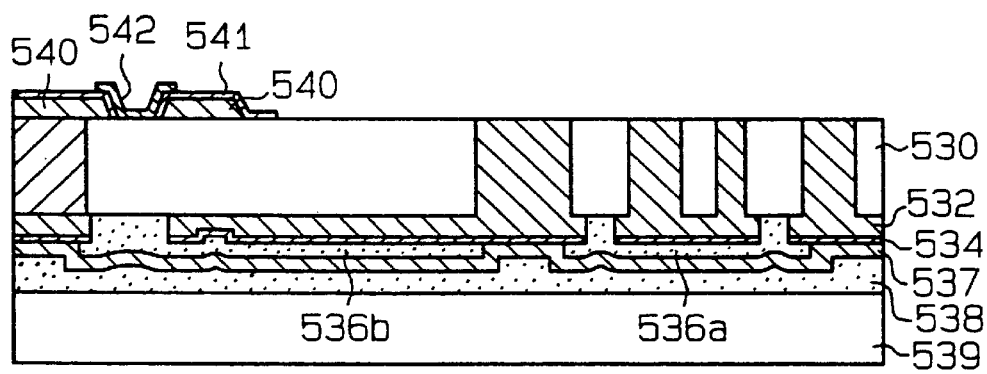
Figure 97:
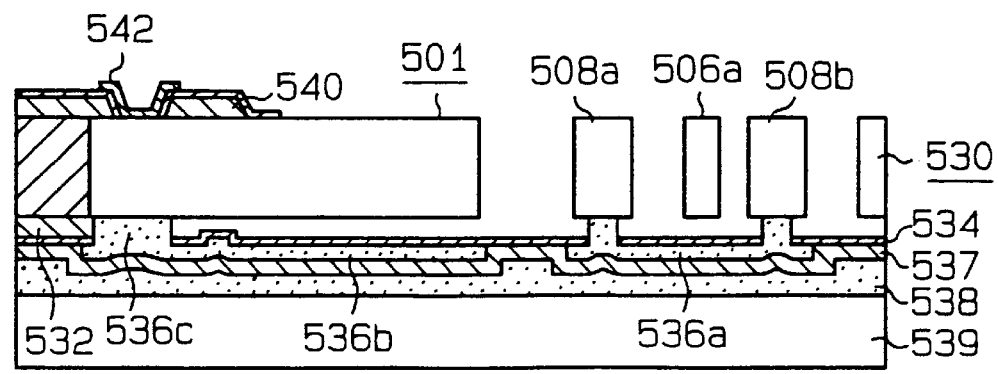

Similarly, the sidewall protection films 40, 42 shown in FIG. 34 may be removed as shown in FIG. 71; and/or the interlayer insulating films 32, 33 on the beam-structure 6 may be partly removed as shown in FIG. 72 when the interlayer insulating films 32, 33 are remained after removing the etching mask 51 shown in FIG. 34. The sidewall protection films 40, 42 shown in FIG. 40 may be removed as shown in FIG. 73; and/or the interlayer insulating films 32, 33 on the beam-structure 6 may be partly removed as shown in FIG. 74 when the interlayer insulating films 32, 33 are remained after removing the etching mask 51 shown in FIG. 40. When the sidewall protection films shown in FIG. 43 are removed as shown in FIG. 75, the sensor output can be stable. At least one part of the film on the beam-structure may be removed. The sidewall protection films 40, 42 shown in FIG. 43 may be removed as shown in FIG. 75; and/or the interlayer insulating films 32, 33 on the beam-structure 6 may be partly removed as shown in FIG. 76 when the interlayer insulating films 32, 33 are remained after removing the etching mask 51 shown in FIG. 43. The sidewall protection films 40, 42 shown in FIG. 48 may be removed as shown in FIG. 77; and/or the interlayer insulating films 32, 33 on the beam-structure 6 may be partly removed as shown in FIG. 78 when the interlayer insulating films 32, 33 are remained after removing the etching mask 51 shown in FIG. 48. The sidewall protection films 40, 42 shown in FIG. 58 may be removed as shown in FIG. 79; and/or the interlayer insulating films 32, 33 on the beam-structure 6 may be partly removed as shown in FIG. 80 when the interlayer insulating films 32, 33 are remained after removing the etching mask 51 shown in FIG. 58. The sidewall protection films 40, 42 shown in FIG. 66 may be removed as shown in FIG. 81; and/or the interlayer insulating films 32, 33 on the beam-structure 6 may be partly removed as shown in FIG. 82 when the interlayer insulating films 32, 33 are remained after removing the etching mask 51 shown in FIG. 66.

Furthermore, in the structures shown in one of FIGS. 68, 70, 74, 76, 78, 80, 82, the sidewall protection films are removed 5 as well as removing at least one part of the films on the beam-structure, however, it may remove the films on the beam-structure with remaining the sidewall protection films.

Furthermore, it is not necessary to provide the insulating materials buried in the trenches to both portions between the frame portion and the movable electrode, and between the frame portion and the fixed electrode, to electrically insulate the frame portion from at least one of the movable electrode and the fixed electrode. That is, the insulating materials 15a, 15b, 19a to 19d, 21a to 21d, 25a to 25d, 27a to 27d, 256 buried in the trenches 14a, 14b, 18a to 18d, 20a to 20d, 24a to 26a, 257 may be provided at least one of between the frame portion and the movable electrode, and between the frame portion and the fixed electrode, to electrically insulate the frame portion from at least one of the movable electrode and the fixed electrode.

What is claimed is:

1. A semiconductor physical quantity sensor comprising:
    a substrate including a semiconductor layer, the semiconductor layer having therein a hollow being laterally extended;
    a frame portion being provided to the semiconductor layer;
    a beam-structure being arranged above the hollow, being connected to the frame portion, and having a movable electrode movable by action of physical quantity;
    a fixed electrode being connected to the frame portion, confronting with the movable electrode, and being disposed on the hollow, the fixed electrode is made of a same material as the semiconductor layer to serve as a conductive member; and
    at least one insulator provide between the frame portion and the fixed electrode, for electrically insulating the frame portion from the fixed electrode,
    wherein the insulator reaches he hollow so that whole of the fixed electrode is disposed on the hollow, whereby the fixed electrode is hung up the frame portion through the insulator so as to be supported by the frame portion through the insulator.

2. A semiconductor physical quantity sensor according to claim 1, wherein the insulator is provided both between the frame portion and the movable electrode, and between the frame portion and the fixed electrode, for electrically insulating the frame portion from both the movable electrode and the fixed electrode.

3. A semiconductor physical quantity sensor according to claim 1, wherein:
    the substrate includes a trench being vertically extended and formed in the semiconductor layer;
    the frame portion is divided by the hollow and the trench, and is positioned at sides of both the hollow and the trench;
    the beam-structure is divided by the hollow and the trench; and
    the fixed electrode is divided by the hollow and the trench.

4. A semiconductor physical quantity sensor according to claim 1, wherein the substrate is an SOI substrate having a support substrate and the semiconductor layer with a buried insulating film interposed therebetween.

5. A semiconductor physical quantity sensor according to claim 1, herein:
    the substrate includes a base plate portion being provided under the hollow and being divided by the hollow; and
    the semiconductor physical quantity sensor further comprises a prop being vertically provided on the base plate portion, for supporting at least one of the beam-structure and the fixed electrode.

6. A semiconductor physical quantity sensor according to claim 5, wherein the prop is made of insulating material.

7. A semiconductor physical quantity sensor according to claim 1, wherein:
    the substrate is an SOI substrate having a support substrate and the semiconductor layer with a buried insulating film interposed therebetween, the support substrate has therein a primary hollow being laterally extended, the semiconductor layer include a trench being vertically extended, and the semiconductor layer and the primary hollow include a primary trench being vertically extended,
    wherein the semiconductor physical quantity sensor further comprises:
        a primary frame portion being provided to the semiconductor layer by being divided by the primary hollow and the primal trench, and is positioned at sides of both the primary hollow and the primary trench;
        a primary oscillatory mass being arranged above the hollow by being divided by the primary hollow and the primary trench, being connected to the primary frame portion, and having a primary movable electrode; and
        a primary excitation fixed electrode being divided by the hollow and the trench formed in the semiconductor layer, being connected to the primary frame portion and confronting with the primary movable electrode.

8. A semiconductor physical quantity sensor according to claim 1, wherein the insulator is provided in insulating trench provided at least one of between the frame portion and the movable electrode, and between the frame portion and the fixed electrode.

9. A semiconductor physical quantity sensor according to claim 8, wherein the insulator is made up of one of insulating material and a material covered with insulating material.

10. A semiconductor physical quantity sensor according to claim 1, wherein said insulator extends from a surface of the semiconductor layer to the hollow so as to penetrate the semiconductor layer.

11. A semiconductor physical quantity sensor according to claim 10, wherein the insulator has a center protruding in an extending direction of the fixed electrode.

12. A semiconductor physical quantity sensor according to claim 10, wherein the insulator is protruded into the hollow.

13. A semiconductor physical quantity sensor according to claim 3, wherein said semiconductor layer is disposed on the substrate, and the hollow is formed in the semiconductor layer so that the hollow communicates with external of the sensor only through the trench.

14. A semiconductor physical quantity sensor according to claim 13, wherein said semiconductor layer is disposed on the substrate with an insulating layer interposed therebetween.

15. A semiconductor physical quantity sensor according to claim 14, wherein said hollow exposes the insulting layer so that the insulating layer faces the beam structure with the hollow interposed therebetween.

16. A semiconductor physical quantity sensor according to claim 13, wherein said semiconductor layer and the substrate constitute a single crystal semiconductor, and the hollow is a cavity formed in the single crystal semiconductor.

17. A semiconductor physical quantity sensor comprising:
    a semiconductor substrate being made up of single layer, having therein a hollow being laterally extended, having a trench being vertically extended and reaching the hollow, and having a base plate portion being divided by the hollow and being positioned under the hollow;

a frame portion being positioned at sides of the both the hollow and the trench by being divided by the hollow and the trench;

a beam-structure being positioned above the hollow by being divided by the hollow and the trench, being connected to the frame portion, and having a movable electrode movable by action of physical quantity;

a fixed electrode being positioned above the hollow by being divided by the hollow and the trench, being connected to the frame portion and confronting with the movable electrode; and an insulator buried in insulating trenches provided between the frame portion and the movable electrode, and between the Fame portion and the fixed electrode, wherein said insulating trench reach the hollow.

18. A semiconductor physical quantity sensor comprising:

an SOI substrate having a support substrate and the semiconductor layer with a buried insulating film interposed therebetween, the support substrate having a primary hollow being laterally extended, the buried insulating film having a through hole, the semiconductor layer having a trench and a secondary trench being vertically extended, the semiconductor layer having a hollow and a secondary hollow being laterally extended, and the semiconductor layer and the primary hollow having primary trench being vertically extended;

a primary frame portion being divided by the primary hollow and the through hole, and being positioned at sides of the primary hollow, the primary trench and the through hole;

a primary oscillatory mass being divided by the primary hollow, the primary trench and the through hole, being connected to the primary frame portion, and having a primary movable electrode;

a primary excitation fixed electrode being divided by the hollow and the trench formed in the semiconductor layer, being connected to the primary frame portion, and confronting -with the primary movable electrode;

a secondary frame portion being divided by the secondary hollow and the secondary trench, and being positioned at sides of the both the secondary hollow and the secondary trench, for supporting the primary movable electrode of the primary oscillatory mass;

a beam-structure being divided by the secondary hollow and the secondary trench, being positioned above the secondary , being connected to the secondary frame portion, and having a secondary movable electrode movable by action of physical quantity;

a secondary excitation fixed electrode being divided by the secondary hollow and the secondary trench, being positioned above the secondary hollow, being connected to the secondary frame portion, and confronting with the secondary movable electrode;

a first insulator being buried in insulating trenches provided between the primary movable electrode and the second frame portion, and between the primary excitation fixed electrode and the primary frame port on; and a second insulator being buried in insulating trenches provided between the secondary movable electrode and the secondary frame portion, and between the secondary excitation fixed electrode and the secondary frame portion, wherein the primary hollow communicates with the hollow and the secondary hollow formed in the semiconductor layer through the hole formed in the buried insulating film.

* * * * *